(12) United States Patent
Cong et al.

(10) Patent No.: US 12,520,668 B2
(45) Date of Patent: Jan. 6, 2026

(54) DISPLAY SUBSTRATE, PREPARING METHOD THEREFOR, AND DISPLAY DEVICE

(71) Applicants: Beijing BOE Display Technology Co., Ltd., Beijing (CN); BOE Technology Group Co., Ltd., Beijing (CN)

(72) Inventors: Ning Cong, Beijing (CN); Can Zhang, Beijing (CN); Minghua Xuan, Beijing (CN); Jinfei Niu, Beijing (CN); Can Wang, Beijing (CN); Wei Li, Beijing (CN); Jingjing Zhang, Beijing (CN); Xiaochuan Chen, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 529 days.

(21) Appl. No.: 18/018,563

(22) PCT Filed: Feb. 23, 2022

(86) PCT No.: PCT/CN2022/077452
§ 371 (c)(1),
(2) Date: Jan. 29, 2023

(87) PCT Pub. No.: WO2023/159386
PCT Pub. Date: Aug. 31, 2023

(65) Prior Publication Data
US 2024/0284711 A1   Aug. 22, 2024

(51) Int. Cl.
*H10K 59/121* (2023.01)
*H10K 59/12* (2023.01)

(52) U.S. Cl.
CPC ..... *H10K 59/1216* (2023.02); *H10K 59/1201* (2023.02)

(58) Field of Classification Search
CPC ........... H10K 59/1216; G09G 2300/0421–043
See application file for complete search history.

(56) References Cited

U.S. PATENT DOCUMENTS

| 5,583,359 A | 12/1996 | Ng et al. |
| 2001/0006256 A1* | 7/2001 | Nakashima ......... H01L 23/4824 257/758 |

(Continued)

FOREIGN PATENT DOCUMENTS

| CN | 102110684 A | 6/2011 |
| CN | 104425441 A | 3/2015 |

(Continued)

*Primary Examiner* — Daniel P Shook
(74) *Attorney, Agent, or Firm* — Ling Wu; Stephen Yang; Ling and Yang Intellectual Property

(57) ABSTRACT

A display substrate, a preparation method therefor, and a display device. A display substrate includes a plurality of conductive layers disposed on a silicon-based substrate (101), a conductive layer includes a first sub-electrode plate (110) and a second sub-electrode plate (120), the first sub-electrode plate (110) and the second sub-electrode plate (120) form a first storage capacitor of a MOM capacitance structure, and another conductive layer comprises a third sub-electrode plate (130) and a fourth sub-electrode plate (140), the third sub-electrode plate (130) and the fourth sub-electrode plate (140) form a second storage capacitor of a MOM capacitance structure; the first sub-electrode plate (110) and the fourth sub-electrode plate (140) constitute a third storage capacitor of a MIM capacitance structure, and/or the second sub-electrode plate (120) and the third sub-electrode plate (130) constitute a fourth storage capacitor of a MIM capacitance structure.

20 Claims, 25 Drawing Sheets

(56) References Cited

U.S. PATENT DOCUMENTS

2017/0162113 A1   6/2017  Lin et al.
2019/0355301 A1  11/2019  Lee
2022/0115483 A1* 4/2022  Li .......................... H10K 71/00

FOREIGN PATENT DOCUMENTS

| CN | 104733492  | A  | 6/2015  |
| CN | 105742246  | A  | 7/2016  |
| CN | 105976754  | A  | 9/2016  |
| CN | 206210357  | U  | 5/2017  |
| CN | 108257952  | A  | 7/2018  |
| CN | 108777127  | A  | 11/2018 |
| CN | 109658866  | A  | 4/2019  |
| CN | 209017168  | U  | 6/2019  |
| CN | 110503917  | A  | 11/2019 |
| JP | 2002299555 | A  | 10/2002 |
| JP | 2005183739 | A  | 7/2005  |
| JP | 2014229711 | A  | 12/2014 |
| WO | 2021227029 | A1 | 11/2021 |

\* cited by examiner

DISPLAY SUBSTRATE, PREPARING METHOD THEREFOR, AND DISPLAY DEVICE

CROSS-REFERENCE TO RELATED APPLICATION

The present application is a U.S. National Phase Entry of International Application No. PCT/CN2022/077452 having an international filing date of Feb. 23, 2022, the entire content of which is hereby incorporated by reference.

TECHNICAL FIELD

The present disclosure relates to, but is not limited to, the field of display technology, and particularly relates to a display substrate and a method for preparing the display substrate, and a display device.

BACKGROUND

Micro organic light-emitting diode (Micro-OLED) is a micro display developed in recent years, and silicon-based OLED is one of them. Silicon-based OLED can not only achieve the active addressing of pixels, but also allow the preparation the structure of pixel driving circuits, etc. on the silicon-based substrate, which is conductive to reducing the system volume and achieving light weight. The silicon-based OLED is prepared by a mature Complementary Metal Oxide Semiconductor (CMOS) integrated circuit process, has advantages of small size, high Pixels Per Inch (PPI), high refresh rate, etc., and is widely used in the near-eye display field of Virtual Reality (VR) or Augmented Reality (AR).

SUMMARY

The following is a summary of subject matters described herein in detail. The summary is not intended to limit the protection scope of claims.

In one aspect, embodiments of the present disclosure provide a display substrate, including a plurality of sub-pixels, wherein at least one sub-pixel includes a pixel driving circuit, the pixel driving circuit includes a plurality of transistors and a storage capacitor; on a plane perpendicular to the display substrate, the display substrate includes a plurality of conductive layers disposed on a silicon-based substrate, one of the plurality of the conductive layers includes a comb-shaped first sub-electrode plate and a comb-shaped second sub-electrode plate, the first sub-electrode plate and the second sub-electrode plate constitute a first storage capacitor of a metal-oxide-metal capacitor structure, and another conductive layer of the plurality of the conductive layers includes a comb-shaped third sub-electrode plate and a comb-shaped fourth sub-electrode plate, the third sub-electrode plate and the fourth sub-electrode plate constitute a second storage capacitor of a metal-oxide-metal capacitor structure; an orthographic projection of the first sub-electrode plate on the silicon-based substrate is at least partially overlapped with an orthographic projection of the fourth sub-electrode plate on the silicon-based substrate to form a third storage capacitor of a metal-insulator-metal capacitor structure, and/or an orthographic projection of the second sub-electrode plate on the silicon-based substrate is at least partially overlapped with an orthographic projection of the third sub-electrode plate on the silicon-based substrate to form a fourth storage capacitor of a metal-insulator-metal capacitor structure.

In an exemplary implementation mode, the first sub-electrode plate is connected to the third sub-electrode plate and the second sub-electrode plate is connected to the fourth sub-electrode plate.

In an exemplary implementation mode, the first sub-electrode plate includes a first base part and a plurality of first electrode parts, and the second sub-electrode plate includes a second base part and a plurality of second electrode parts; the first base part and the second base part are both strip-shaped extending along a second direction and are disposed opposite to each other in a first direction, the first direction intersects with the second direction; the plurality of the first electrode parts and the plurality of the second electrode parts are alternately disposed in the second direction, first ends of the first electrode parts are connected to the first base part, second ends of the first electrode parts extend toward a direction of the second base part, and at least one first electrode part is located between two adjacent second electrode parts in the second direction; first ends of the second electrode parts are connected to the second base part, second ends of the second electrode parts extend toward a direction of the first base part, and at least one second electrode part is located between two adjacent first electrode parts in the second direction.

In an exemplary implementation mode, the third sub-electrode plate includes a third base part and a plurality of third electrode parts, and the fourth sub-electrode plate includes a fourth base part and a plurality of fourth electrode parts; the third base part and the fourth base part are both strip-shaped extending along a second direction and are disposed opposite to each other in a first direction, the first direction intersects with the second direction; the plurality of the third electrode parts and the plurality of the fourth electrode parts are alternately disposed in the second direction, first ends of the third electrode parts are connected to the third base part, second ends of the third electrode parts extend toward a direction of the fourth base part, and at least one third electrode part is located between two adjacent fourth electrode parts in the second direction; first ends of the fourth electrode parts are connected to the fourth base part, second ends of the fourth electrode parts extend toward a direction of the third base part, and at least one fourth electrode part is located between two adjacent third electrode parts in the second direction.

In an exemplary implementation mode, an orthographic projection of a first base part of the first sub-electrode plate on the silicon-based substrate is at least partially overlapped with an orthographic projection of a third base part of the third sub-electrode plate on the silicon-based substrate, and the third base part is connected to the first base part through a via.

In an exemplary implementation mode, an orthographic projection of a first electrode part of the first sub-electrode plate on the silicon-based substrate is at least partially overlapped with an orthographic projection of a fourth electrode part of the fourth sub-electrode plate on the silicon-based substrate.

In an exemplary implementation mode, an orthographic projection of a second base part of the second sub-electrode plate on the silicon substrate is at least partially overlapped with an orthographic projection of a fourth base part of the fourth sub-electrode plate on the silicon-based substrate, and the fourth base part is connected to the second base part through a via.

In an exemplary implementation mode, an orthographic projection of a second electrode part of the second sub-electrode plate on the silicon-based substrate is at least partially overlapped with an orthographic projection of a third electrode part of the third sub-electrode plate on the silicon-based substrate.

In an exemplary implementation mode, among the plurality of the conductive layers, a conductive layer includes a plate-shaped lower electrode plate, another conductive layer on a side of the lower electrode plate away from the silicon-based substrate includes a plate-shaped upper electrode plate, an orthographic projection of the upper electrode plate on the silicon-based substrate is at least partially overlapped with an orthographic projection of the lower electrode plate on the silicon-based substrate, the lower electrode plate and the upper electrode plate constitute a fifth storage capacitor of a metal-insulator-metal capacitor structure, the upper electrode plate is connected to the first sub-electrode plate and the third sub-electrode plate, and the lower electrode plate is connected to the second sub-electrode plate and the fourth sub-electrode plate.

In an exemplary implementation mode, the lower electrode plate includes a first plate body and a second plate body connected to each other, the second plate body being disposed on a side of the first plate body in a second direction, or the second plate body being disposed on a side of the first plate body in a direction opposite to the second direction; an edge on a side of the first plate body in the first direction is flush with an edge on a side of the second plate body in the first direction, or an edge on a side of the first plate body in a direction opposite to the first direction is flush with an edge on a side of the second plate body in a direction opposite to the first direction, and the first direction intersects with the second direction.

In an exemplary implementation mode, in two adjacent sub-pixels in the first direction, a second plate body in one sub-pixel is provided on a side of the first plate body in the second direction, and a second plate body in the other sub-pixel is provided on a side of the first plate body in a direction opposite to the second direction.

In an exemplary implementation mode, in two adjacent sub-pixels in the first direction, edges of the first plate body and the second plate body in one sub-pixel in the first direction are flush, and edges of the first plate body and the second plate body in the other sub-pixel in a direction opposite to the first direction are flush.

In an exemplary implementation mode, the first plate body and the second plate body are both rectangular, and an area of the first plate body is larger than an area of the second plate body.

In an exemplary implementation mode, the upper electrode plate is rectangular, and an area of the upper electrode plate is smaller than an area of the first plate body.

In an exemplary implementation mode, an orthographic projection of the upper electrode plate on the silicon-based substrate is located within a range of an orthographic projection of the first plate body on the silicon-based substrate.

In an exemplary implementation mode, the plurality of the transistors include a first transistor, a second transistor, and a third transistor; a control electrode of the first transistor is connected to a scan signal line, a first electrode of the first transistor is connected to a data signal line, and a second electrode of the first transistor is connected to a first node; a control electrode of the second transistor is connected to the first node, a first electrode of the second transistor is connected to a first power supply line, and a second electrode of the second transistor is connected to a second node; a first electrode of the third transistor is connected to a first signal line, and a second electrode of the third transistor is connected to the second node; a first end of the storage capacitor is connected to the first node.

In an exemplary implementation mode, the active layers of the plurality of the transistors include at least a first active layer of the first transistor, a second active layer of the second transistor and a third active layer of the third transistor, in at least one sub-pixel, the second active layer and the third active layer are connected to each other in an integrated structure, and a second region of the second active layer and a second region of the third active layer are used in common.

In an exemplary implementation mode, gate electrodes of the plurality of transistors include at least a first gate electrode of the first transistor, a second gate electrode of the second transistor, and a third gate electrode of the third transistor; in at least one sub-pixel, the first gate electrode and the third gate electrode are connected to each other in an integrated structure.

In an exemplary implementation mode, the display substrate includes a plurality of repeating units, at least one repeating unit including two sub-pixels; in at least one repeating unit, the first gate electrodes of two sub-pixels are connected to each other in an integrated structure.

In an exemplary implementation mode, in at least one repeating unit, second transistors of the two sub-pixels are located on two sides of the repeating unit, and a blank region is provided between the second transistors of the two sub-pixels.

In an exemplary implementation mode, the second gate electrode is connected to a first end of a connection electrode through a first lapping via, a second end of the connection electrode is connected to a second region of the first active layer through a second lapping via, wherein the first lapping via is located on a side of the second gate electrode close to the blank region, and the second lapping via is located on a side of the first active layer close to the blank region.

In an exemplary implementation mode, the first lapping via is located on a side of the second gate electrode close to a second region of the second active layer.

In an exemplary implementation mode, the plurality of conductive layers at least include a first conductive layer, a second conductive layer, a third conductive layer, a fourth conductive layer, a fifth conductive layer and a sixth conductive layer disposed sequentially on the silicon-based substrate, the silicon-based substrate includes at least active layers of a plurality of transistors, the first conductive layer includes at least gate electrodes of a plurality of transistors, the second conductive layer includes at least a scan signal line and a first power supply line, the third conductive layer includes at least a data signal line and a first signal line, the fifth conductive layer includes at least the first sub-electrode plate and the second sub-electrode plate, and the sixth conductive layer includes at least the third sub-electrode plate and the fourth sub-electrode plate.

In an exemplary implementation mode, the plurality of the conductive layers further include a seventh conductive layer, an eighth conductive layer, and a ninth conductive layer, the eighth conductive layer includes at least the lower electrode plate, and the ninth conductive layer includes at least the upper electrode plate.

In an exemplary implementation mode, the plurality of the conductive layers further include a tenth conductive layer, the tenth conductive layer at least includes an upper electrode plate connection electrode and a lower electrode plate connection electrode, the upper electrode plate is connected to the third sub-electrode plate through the upper electrode plate connection electrode, and the lower electrode plate is connected to the fourth sub-electrode plate through the lower electrode plate connection electrode.

According to another aspect, an exemplary embodiment of the present disclosure further provides a display device, which includes the foregoing display substrate.

In another aspect, the present disclosure further provides a method for preparing a display substrate, the display substrate includes a plurality of sub-pixels, at least one sub-pixel includes a pixel driving circuit, and the pixel driving circuit includes a plurality of transistors and at least one storage capacitor, and the preparing method includes: forming a plurality of conductive layers on the silicon-based substrate, wherein one of the plurality of the conductive layers includes a comb-shaped first sub-electrode plate and a comb-shaped second sub-electrode plate, the first sub-electrode plate and the second sub-electrode plate constitute a first storage capacitor of a metal-oxide-metal capacitor structure, and another conductive layer of the plurality of the conductive layers includes a comb-shaped third sub-electrode plate and a comb-shaped fourth sub-electrode plate, the third sub-electrode plate and the fourth sub-electrode plate constitute a second storage capacitor of a metal-oxide-metal capacitor structure; an orthographic projection of the first sub-electrode plate on the silicon-based substrate is at least partially overlapped with an orthographic projection of the fourth sub-electrode plate on the silicon-based substrate to form a third storage capacitor of a metal-insulator-metal capacitor structure, and/or an orthographic projection of the second sub-electrode plate on the silicon-based substrate is at least partially overlapped with an orthographic projection of the third sub-electrode plate on the silicon-based substrate to form a fourth storage capacitor of a metal-insulator-metal capacitor structure.

Other aspects will become apparent upon reading and understanding the accompanying drawings and the detailed description.

BRIEF DESCRIPTION OF DRAWINGS

The drawings are used for providing understanding of technical solutions of the present disclosure, constitute a part of the specification, and together with the embodiments of the present disclosure, are used for explaining the technical solutions of the present disclosure but not to form limitations on the technical solutions of the present disclosure. Shapes and sizes of each component in the drawings do not reflect actual scales, but are only intended to schematically illustrate contents of the present disclosure.

Figure 1:
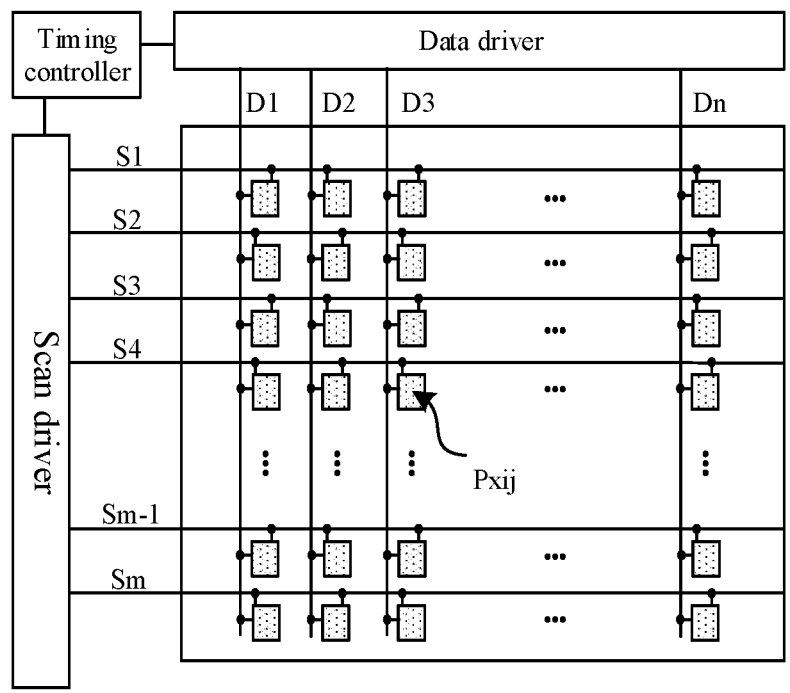
FIG. 1 is a schematic diagram of a structure of a silicon-based OLED display device.

| Description of reference signs: | | |
|---|---|---|
| 1-first active layer; | 2-second active layer; | 3-third active layer; |
| 4-contact region; | 11-first gate electrode; | 12-second gate electrode; |
| 13-third gate electrode; | 21-twenty-first connection electrode; | 22-twenty-second connection electrode; |
| 23-twenty-third connection electrode; | 24-twenty-fourth connection electrode; | 25-scan signal line |
| 26-first power supply line; | 27-third power supply line; | 28-dummy line; |
| 31-thirty-first connection electrode; | 32-thirty-second connection electrode; | 33-thirty-third connection electrode; |
| 34-thirty-fourth connection electrode; | 35-data signal line; | 36-first signal line; |
| 41-forty-first connection electrode; | 42-forty-second connection electrode; | 43-forty-third connection electrode; |
| 44-forty-fourth connection electrode; | 51-fifty-first connection electrode; | 52-fifty-second connection electrode; |
| 53-fifty-third connection electrode; | 61-sixty-first connection electrode; | 62-sixty-second connection electrode; |
| 63-sixty-third connection electrode; | 71-seventy-first connection electrode; | 72-seventy-second connection electrode; |
| 73-seventy-third connection electrode; | 74-seventy-fourth connection electrode; | 81-eighty-first connection electrode; |
| 82-eighty-second connection electrode; | 83-eighty-third connection electrode; | 84-eighty-fourth connection electrode; |
| 90-anode; | 91-ninety-first connection electrode; | 92-ninety-second connection electrode; |
| 101-silicon-based substrate; | 102-driving circuit layer; | 103-light emitting structure layer; |
| 104-first encapsulation layer; | 105-color film structure layer; | 106-second encapsulation layer; |
| 107-cover plate layer; | 110-first sub-electrode plate; | 111-first base part; |
| 112-first electrode part; | 120-second sub-electrode plate; | 121-second base part; |
| 122-second electrode part; | 130-third sub-electrode plate; | 131-third base part; |
| 132-third electrode part; | 140-fourth sub-electrode plate; | 141-fourth base part; |
| 142-fourth electrode part; | 210-first lower electrode plate; | 211-first plate body; |
| 212-second plate body; | 220-second lower electrode plate; | 221-third plate body; |
| 222-fourth plate body; | 310-first upper electrode plate; | 320-second upper electrode plate. |

DETAILED DESCRIPTION

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

Scales of the drawings in the present disclosure may be used as a reference in the actual process, but are not limited thereto. For example, the width-length ratio of the channel, the thickness and spacing of each film layer, and the width and spacing of each signal line may be adjusted according to the actual needs. The number of pixels in the display device and the number of sub-pixels in each pixel are not limited to the numbers shown in the drawings. The drawings described in the present disclosure are schematic structure diagrams only, but one implementation of the present disclosure is not limited to the shapes, numerical values or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, in order to distinguish two electrodes of a transistor other than a control electrode, one of the two electrodes is directly described as a first electrode, while the other is described as a second electrode. The first electrode may be a drain electrode, and a second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, in the specification, the "source electrode" and the "drain electrode" are interchangeable.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In this specification, "being disposed in a same layer" is referred to a structure formed by patterning two (or more than two) structures through the same patterning process, and their materials may be the same or different. For example, the materials of the precursors forming a plurality of structures disposed in the same layer are the same, and the resulting materials may be the same or different.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc.

In the present disclosure, "about" refers to that a boundary is defined not so strictly and numerical values within process and measurement error ranges are allowed.

FIG. 1 is a schematic diagram of a structure of a silicon-based OLED display device. Referring to FIG. 1, a silicon-based OLED display device may include a timing controller, a data signal driver, a scan signal driver, and a pixel array. The pixel array may include multiple scan signal lines (S1 to Sm), multiple data signal lines (D1 to Dn), and multiple sub-pixels PXij. In an exemplary implementation mode, the timing controller may provide a gray scale value and a control signal suitable for the specification of the data signal driver to the data signal driver, and may provide a clock signal, a scan start signal, and the like suitable for the specification of the scan signal driver to the scan signal driver. The data driver may generate a data voltage to be provided to the data signal lines D1, D2, D3, . . . , and Dn by using the gray scale value and the control signal that are received from the timing controller. For example, the data signal driver may sample the gray scale value using the clock signal and apply a data voltage corresponding to the gray scale value to the data signal lines D1 to Dn by taking a sub-pixel row as a unit, wherein n may be a natural number. The scan signal driver may receive the clock signal, the scan start signal, etc., from the timing controller to generate a scan signal to be provided to the scan signal lines S1, S2, S3, . . . , and Sm. For example, the scan signal driver may sequentially provide a scan signal with an on-level pulse to the scan signal lines S1 to Sm. For example, the scan signal driver may be constructed in a form of a shift register and generate a scan signal in a manner in which a scan start signal provided in a form of an on-level pulse is transmitted sequentially to a next-stage circuit under control of the clock signal, wherein m may be a natural number. An array of sub-pixels may include the plurality of sub-pixels PXij. Each sub-pixel PXij may be connected to a corresponding data signal line and a corresponding scan signal line, wherein i and j may be natural numbers. The sub-pixel PXij may refer to a sub-pixel in which a transistor is connected to an i-th scan signal line and is connected to a j-th data signal line.

Figure 2:
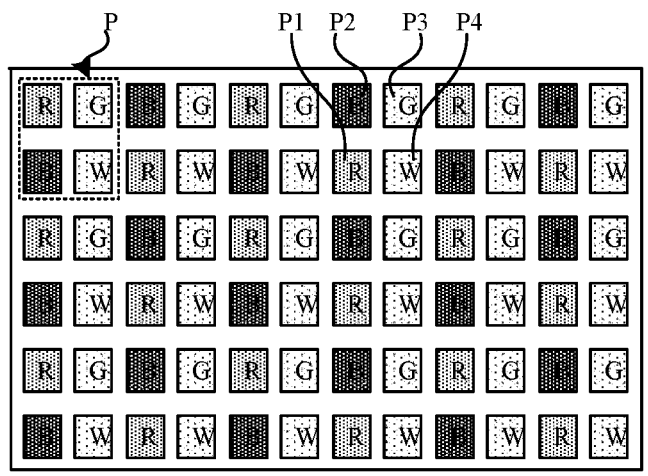
FIG. 2 is a schematic diagram of a planar structure of a silicon-based OLED display device.

FIG. 2 is a schematic diagram of a planar structure of a silicon-based OLED display device. As shown in FIG. 2, the display device may include a plurality of pixel units P arranged in a matrix, and at least one of the plurality of pixel units P includes a first sub-pixel P1 emitting light of a first color, a second sub-pixel P2 emitting light of a second color, a third sub-pixel P3 emitting light of a third color, and a fourth sub-pixel P4 emitting light of a fourth color. The four sub-pixels each includes a pixel driving circuit and a light emitting device. The pixel driving circuit in the sub-pixel is respectively connected to a scan signal line and a data signal line, and the pixel driving circuit is configured to receive a data voltage transmitted by the data signal line and output a corresponding current to the display light emitting device, under the control of the scan signal line. The display light emitting device in the sub-pixel is respectively connected to a pixel driving circuit of a sub-pixel where the display light emitting device is located, and is configured to emit light with a corresponding brightness in response to a current output by the pixel driving circuit of the sub-pixel where the display light emitting device is located.

In an exemplary implementation mode, the first sub-pixel P1 may be a red sub-pixel (R) emitting red light, the second sub-pixel P2 may be a blue sub-pixel (B) emitting blue light, the third sub-pixel P3 may be a green sub-pixel (G) emitting green light, and the fourth sub-pixel P4 may be a white sub-pixel (W) emitting white light. In an exemplary implementation mode, a shape of a sub-pixel may be any one or more of a triangle, a square, a rectangle, a rhombus, a trapezoid, a parallelogram, a pentagon, a hexagon, and another polygon, and may be arranged in parallel in a horizontal direction, in parallel in a vertical direction, in a shape of an square, or in a diamond shape, etc., which is not limited in the present disclosure.

In an exemplary implementation mode, the pixel unit may include three sub-pixels, which is not limited in the present disclosure.

Figure 3:
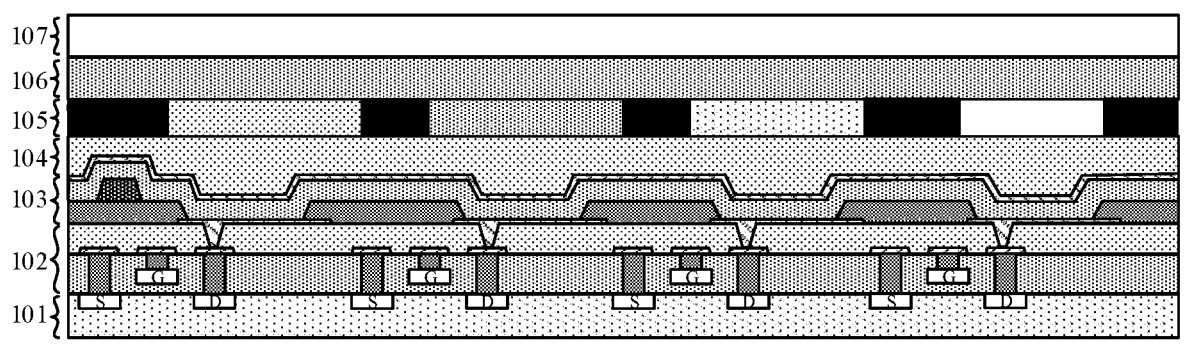
FIG. 3 is a schematic diagram of a cross sectional structure of a silicon-based OLED display device.

FIG. 3 is a schematic diagram of a cross sectional structure of a silicon-based OLED display device, illustrating a structure for realizing full color by adopting white light+color film mode. As shown in FIG. 3, the silicon-based OLED display device may include: a silicon-based substrate 101, a driving circuit layer 102 disposed on the silicon-based substrate 101, a light emitting structure layer 103 disposed on a side of the driving circuit layer 102 away from the silicon-based substrate 101, a first encapsulation layer 104 disposed on a side of the light emitting structure layer 103 away from the silicon-based substrate 101, a color film structure layer 105 disposed on a side of the first encapsulation layer 104 away from the silicon-based substrate 101, a second encapsulation layer 106 disposed on a side of the color film structure layer 105 away from the silicon-based substrate 101, and a cover plate layer 107 disposed on a side of the second encapsulation layer 106 away from the silicon-based substrate 101. In some possible implementations, the silicon-based OLED display device may include other film layers, which is not limited here in the present disclosure.

In an exemplary implementation mode, the silicon-based substrate 101 may be a bulk silicon-based substrate or a Silicon-On-Insulator (SOI) substrate. The driving circuit layer 102 may be prepared on a silicon-based substrate 101 by a silicon semiconductor process (e.g., a CMOS process), and the driving circuit layer 102 may include a plurality of circuit units. The circuit unit may include at least a pixel driving circuit respectively connected to a scan signal line and a data signal line. The pixel driving circuit may include a plurality of transistors and a storage capacitor, and only one transistor is taken as an example in FIG. 3. The transistor may include a control electrode G, a first electrode S, and a second electrode D, the control electrode G, the first electrode S, and the second electrode D may be respectively connected to corresponding connection electrodes through a tungsten metal filled via (i.e., tungsten via, W-via), and may be connected to other electrical structures (such as a trace, etc.) through the connection electrodes.

In an exemplary implementation mode, the light emitting structure layer 103 may include a plurality of light emitting devices. The light emitting device may include at least an anode, an organic light emitting layer and a cathode, wherein the anode may be connected to a second electrode D of the transistor through a connection electrode, the organic light emitting layer is connected to the anode, the cathode is connected to the organic light emitting layer, and the cathode is connected to a second power supply line, and the organic light emitting layer emits light under the drive of the anode and the cathode. In an exemplary implementation mode, the organic light emitting layer may include an Emitting Layer (EML), and any one or more of following: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, for a light emitting device emitting white light, the organic light emitting layers of all sub-pixels may be a common layer connected together.

In an exemplary implementation mode, the first encapsulation layer 104 and the second encapsulation layer 106 may be in a Thin Film Encapsulation (TFE) mode, which can ensure that external water vapor cannot enter the light emitting structure layer, and the cover plate layer 107 may be in glass, or in plastic-based colorless polyimide having flexible characteristics, or the like.

In an exemplary implementation mode, the color film structure layer 105 may include black matrixes (BM) and color filters (CF) disposed at a red sub-pixel, a green sub-pixel and a blue sub-pixel, respectively, to filter white light emitted from the light emitting device into red (R) light, green (G) light and blue (B) light, and the black matrix may be located between adjacent color filters.

Figure 4:
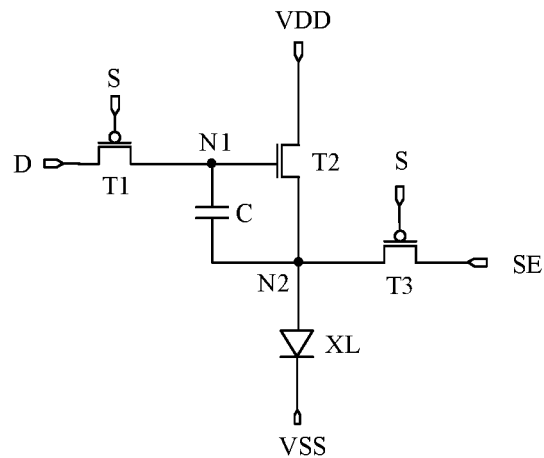
FIG. 4 is an equivalent circuit diagram of a pixel driving circuit.

FIG. 4 illustrates an equivalent circuit diagram of a pixel driving circuit. In an exemplary implementation mode, the pixel driving circuit may be in a 3T1C, 4T1C, 5T1C, 5T2C, 6T1C, or 7T1C, etc. structure. As shown in FIG. 4, the pixel driving circuit may be in a 3T1C structure, comprising three transistors (first transistor T1 to third transistor T3) and a storage capacitor C. The pixel driving circuit is connected to five signal lines (a scan signal line S, a data signal line D, a compensation signal line SE, a first power supply line VDD and a second power supply line VSS). The first transistor T1 is a switching transistor, the second transistor T2 is a driving transistor, the third transistor T3 is a compensation transistor, and the first node N1 and the second node N2 represent junction points of related electrical connections in the circuit diagram.

In an exemplary implementation mode, a first end of the storage capacitor C is connected to the first node N1, and a second end of the storage capacitor C may be connected to the second node N2, or may be connected to a ground line (GND).

In an exemplary implementation mode, a control electrode of the first transistor T1 is connected to the scan signal line S, a first electrode of the first transistor T1 is connected to the data signal line D, and a second electrode of the first transistor T1 is connected to the first node N1.

In an exemplary implementation mode, a control electrode of the second transistor T2 is connected to the first node N1, a first electrode of the second transistor T2 is connected to a first power supply line VDD, and a second electrode of the second transistor T2 is connected to the second node N2.

In an exemplary implementation mode, a control electrode of the third transistor T3 is connected to the scan signal line S, a first electrode of the third transistor T3 is connected to the compensation signal line SE, and a second electrode of the third transistor is connected to the second node N2.

In an exemplary implementation mode, a first electrode of the light emitting device XL is connected to the second node N2, and a second electrode of the light emitting device XL is connected to the second power supply line VSS.

In an exemplary implementation mode, the first transistor T1 is configured to receive the data voltage transmitted by the data signal line D under the control of the signal of the scan signal line S, store the data voltage to the storage capacitor C, and supply the data voltage to the control electrode of the second transistor T2. The second transistor T2 is configured to generate a corresponding current at a second electrode under the control of the data signal received by the control electrode thereof. The second transistor T2 is configured to supply the signal of the first power supply line VDD to the second node N2 under the control of the third transistor T3 to drive the display light emitting device XL to emit light. The third transistor T3 is configured to extract a threshold voltage Vth and a mobility ratio of the second transistor T2 in response to compensation timing to compensate the threshold voltage Vth. The storage capacitor C is configured to store the potential of the control electrode of the second transistor T2, and the light emitting device XL is configured to emit light of a corresponding brightness in response to the current of the second electrode of the second transistor T2.

In an exemplary implementation mode, a signal of the first power supply line VDD may be a high-level signal continuously provided, and a signal of the second power supply line VSS may be a low-level signal continuously provided.

In an exemplary implementation mode, the first transistor T1, the second transistor T2, and the third transistor T3 may be P-type transistors. In another exemplary implementation mode, the first transistor T1, the second transistor T2, and the third transistor T3 may be N-type transistors. Use of a same type of transistors in a pixel driving circuit may simplify a process flow, reduce process difficulties of a display panel, and improve a product yield. In a further exemplary implementation mode, the first transistor T1, the second transistor T2, and the third transistor T3 may include a P-type transistor and an N-type transistor. For example, the first transistor T1 and the third transistor T3 may be P-type Metal Oxide Semiconductor (PMOS) transistors, and the second transistor T2 may be an N-type Metal Oxide Semiconductor (NMOS) transistor.

In an exemplary implementation mode, the light emitting device XL may be an organic light emitting diode (OLED), including a first electrode (anode), an organic light emitting layer, and a second electrode (cathode) that are stacked.

Figure 5:
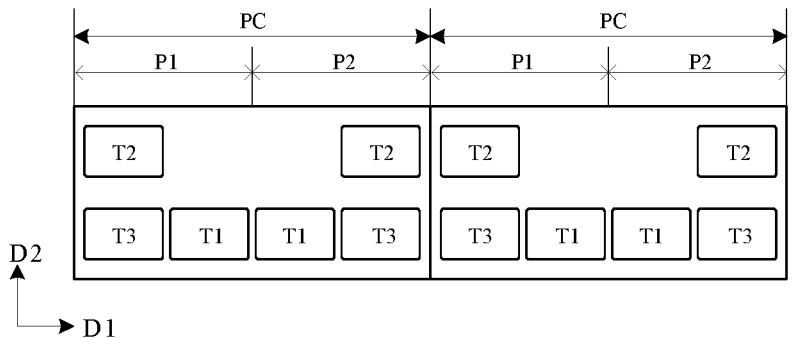
FIG. 5 is a schematic diagram of a planar structure of a silicon-based OLED display substrate according to an exemplary embodiment of the present disclosure.

In an exemplary implementation mode, a driving circuit layer of a display substrate may include a plurality of repeating units arranged in a regular arrangement, and at least one repeating unit may include two sub-pixels. FIG. 5 is a schematic diagram of a planar structure of a silicon-based OLED display substrate according to an exemplary embodiment of the present disclosure, illustrating a structure of two repeating units PC. As shown in FIG. 5, at least one repeating unit PC may include a first sub-pixel P1 and a second sub-pixel P2 sequentially arranged along a first direction D1, each of the first sub-pixel P1 and the second sub-pixel P2 includes pixel driving circuits, each of the pixel driving circuits may include at least a first transistor T1, a second transistor T2, and a third transistor T3. The gate electrode of the first transistor T1 is connected to the scan signal line, a first electrode of the first transistor T1 is connected to the data signal line, the second electrode of the first transistor T1 is connected to the gate electrode of the second transistor T2, the first electrode of the second transistor T2 is connected to the first power supply line, the second electrode of the second transistor T2 is connected to the second electrode of the third transistor T3, the gate electrode of the third transistor T3 is connected to the scan signal line, and the first electrode of the third transistor T3 is connected to the first signal line.

In an exemplary implementation mode, the first signal line may be the compensation signal line that provides a compensation signal.

In an exemplary implementation mode, in at least one sub-pixel, the first transistor T1, the second transistor T2, and the third transistor T3 of the pixel driving circuit may be arranged in an "L" shape, the first transistor T1 and the third transistor T3 may be sequentially arranged along the first direction D1, and the second transistor T2 and the third transistor T3 may be sequentially arranged along the second direction D2.

In an exemplary implementation mode, in at least one repeating unit PC, the first transistor T1 of the first sub-pixel P1 and the first transistor T1 of the second sub-pixel P2 are close to each other and located in the middle of the repeating unit PC in the first direction D1. The second transistor T2 of the first sub-pixel P1 and the second transistor T2 of the second sub-pixel P2 are located on two sides of the repeating unit PC respectively in the first direction D1. A blank region is provided between the second transistor T2 of the first sub-pixel P1 and the second transistor T2 of the second sub-pixel P2.

In an exemplary implementation mode, in two adjacent repeating units PC in the first direction D1, the second transistor T2 in one repeating unit PC and the second transistor T2 in the other repeating unit PC are close to each other.

In an exemplary implementation mode, the display substrate may include a plurality of sub-pixels, and at least one sub-pixel includes a pixel driving circuit, the pixel driving circuit includes a plurality of transistors and a storage capacitor. The display substrate includes, on a plane perpendicular to the display substrate, a plurality of conductive layers disposed on the silicon-based substrate.

In an exemplary implementation mode, one of the plurality of conductive layers includes a comb-shaped first sub-electrode plate and a comb-shaped second sub-electrode plate, and the first sub-electrode plate and the second sub-electrode plate constitute a first storage capacitor of a Metal-Oxide-Metal (MOM) capacitance structure.

In an exemplary implementation mode, another conductive layer of the plurality of conductive layers includes a comb-shaped third sub-electrode plate and a comb-shaped fourth sub-electrode plate, and the third sub-electrode plate and the fourth sub-electrode plate constitute a second storage capacitor of a Metal-Oxide-Metal (MOM) capacitance structure.

In an exemplary implementation mode, an orthographic projection of the first sub-electrode plate on the silicon-based substrate is at least partially overlapped with an orthographic projection of the fourth sub-electrode plate on the silicon-based substrate, to constitute a third storage capacitor of a Metal-Insulator-Metal (MIM) capacitance structure; and/or an orthographic projection of the second sub-electrode plate on the silicon-based substrate is at least partially overlapped with an orthographic projection of the third sub-electrode plate on the silicon-based substrate, to constitute a fourth storage capacitor of a Metal-Insulator-Metal (MIM) capacitance structure.

Figure 6:
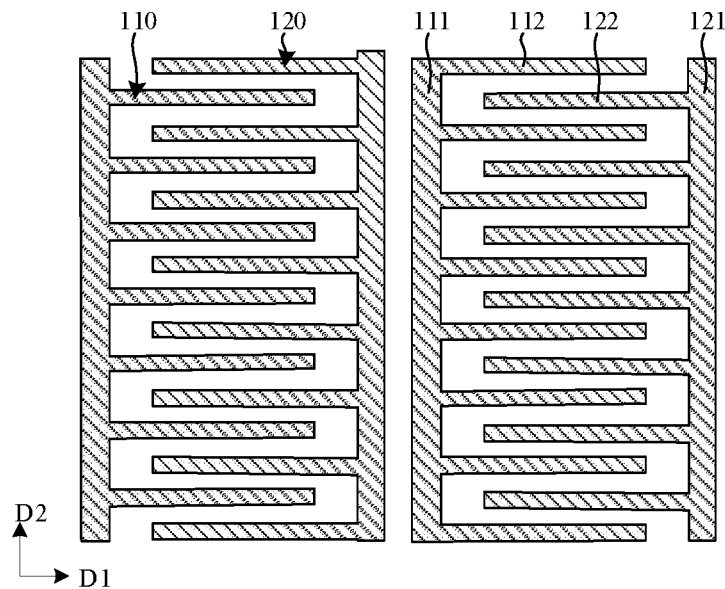
FIG. 6 is a schematic structure diagram of a first storage capacitor of the display substrate according to an exemplary embodiment of the present disclosure.

FIG. 6 is a schematic structure diagram of a first storage capacitor of the display substrate according to an exemplary embodiment of the present disclosure. As shown in FIG. 6, the comb-shaped first sub-electrode plate 110 and the comb-shaped second sub-electrode plate 120 are disposed opposite to each other to constitute a first storage capacitor of a MOM capacitance structure. The first sub-electrode plate 110 and the second sub-electrode plate 120 are disposed in the same layer and are located in one conductive layer of the plurality of conductive layers.

In an exemplary implementation mode, the first sub-electrode plate 110 may include a first base part 111 and a plurality of first electrode parts 112, and the second sub-electrode plate 120 may include a second base part 121 and a plurality of second electrode parts 122. The first base part 111 and the second base part 121 are disposed opposite to each other in the first direction D1, and the first electrode part 112 and the second electrode part 122 are alternately disposed in the second direction D2 to form a first storage capacitor with an interdigital structure.

In an exemplary implementation mode, the shape of the first base part 111 may be a strip shape extending along the second direction D2, the first electrode part 112 may be in a strip shape extending along the first direction D1, the plurality of the first electrode parts 112 may be disposed at intervals along the second direction D2, first ends of the plurality of the first electrode parts 112 are connected to the first base part 111, second ends of the plurality of the first electrode parts 112 extend toward the direction of the second base part 121 of the second sub-electrode plate 120, and at least one first electrode part 112 is located between two adjacent second electrode parts 122 in the second direction D2.

In an exemplary implementation mode, the shape of the second base part 121 may be a strip shape extending along the second direction D2, the second electrode part 122 may be in a strip shape extending along the first direction D1, the plurality of the second electrode parts 122 may be disposed at intervals along the second direction D2, first ends of the plurality of the second electrode parts 122 are connected to the second base part 121, second ends of the plurality of the second electrode parts 122 extend toward the direction of the first base part 111 of the first sub-electrode plate 110, and at least one second electrode part 122 is located between two adjacent first electrode parts 112 in the second direction D2.

In an exemplary implementation mode, the first base part 111 and the plurality of the first electrode parts 112 may be connected to each other in an integrated structure, and the second base part 121 and the plurality of the second electrode parts 122 may be connected to each other in an integrated structure.

Figure 7:
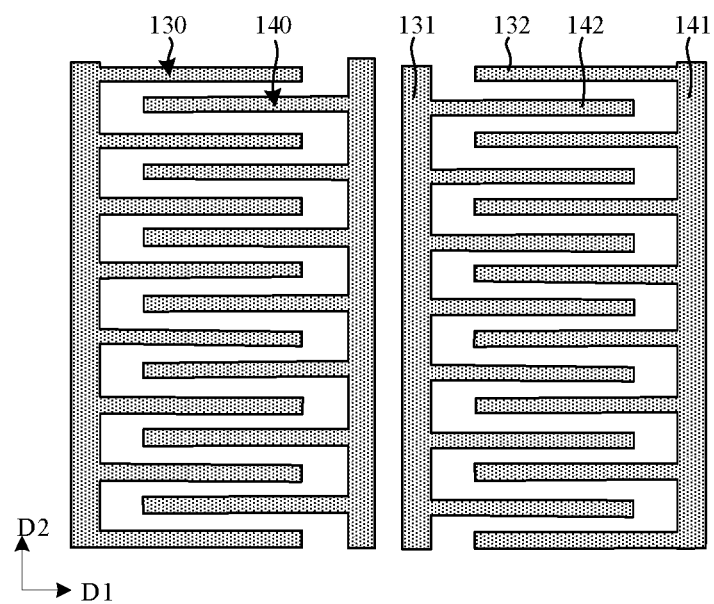
FIG. 7 is a schematic structure diagram of a second storage capacitor of the display substrate according to an exemplary embodiment of the present disclosure.

FIG. 7 is a schematic structure diagram of a second storage capacitor of the display substrate according to an exemplary embodiment of the present disclosure. As shown in FIG. 7, the comb-shaped third sub-electrode plate 130 and the comb-shaped fourth sub-electrode plate 140 are disposed opposite to each other to constitute a second storage capacitor of a MOM capacitance structure. The third sub-electrode plate 130 and the fourth sub-electrode plate 140 are disposed in the same layer and are located in another conductive layer of the plurality of conductive layers. The conductive layer in which the first sub-electrode plate 110 and the second sub-electrode plate 120 are located is different from the conductive layer in which the third sub-electrode plate 130 and the fourth sub-electrode plate 140 are located.

In an exemplary implementation mode, the third sub-electrode plate 130 may include a third base part 131 and a plurality of third electrode parts 132, and the fourth sub-electrode plate 140 may include a fourth base part 141 and a plurality of fourth electrode parts 142. The third base part 131 and the fourth base part 141 are disposed opposite to each other in the first direction D1, and the third electrode part 132 and the fourth electrode part 142 are alternately disposed in the second direction D2 to form a second storage capacitor with an interdigital structure.

In an exemplary implementation mode, the shape of the third base part 131 may be a strip shape extending along the second direction D2, the third electrode part 132 may be in a strip shape extending along the first direction D1, the plurality of the third electrode parts 132 may be disposed at intervals along the second direction D2, first ends of the plurality of the third electrode parts 132 are connected to the third base part 131, second ends of the plurality of the third electrode parts 132 extend toward the direction of the fourth base part 141 of the fourth sub-electrode plate 140, and at least one third electrode part 132 is located between two adjacent fourth electrode parts 142 in the second direction D2.

In an exemplary implementation mode, the shape of the fourth base part 141 may be a strip shape extending along the second direction D2, the fourth electrode part 142 may be in a strip shape extending along the first direction D1, the plurality of the fourth electrode parts 142 may be disposed at intervals along the second direction D2, first ends of the plurality of the fourth electrode parts 142 are connected to the fourth base part 141, second ends of the plurality of the fourth electrode parts 142 extend toward the direction of the third base part 131 of the third sub-electrode plate 130, and at least one fourth electrode part 142 is located between two adjacent third electrode parts 132 in the second direction D2.

In an exemplary implementation mode, the third base part 131 and the plurality of the third electrode parts 132 may be connected to each other in an integrated structure, and the fourth base part 141 and the plurality of the fourth electrode parts 142 may be connected to each other in an integrated structure.

Figure 8:
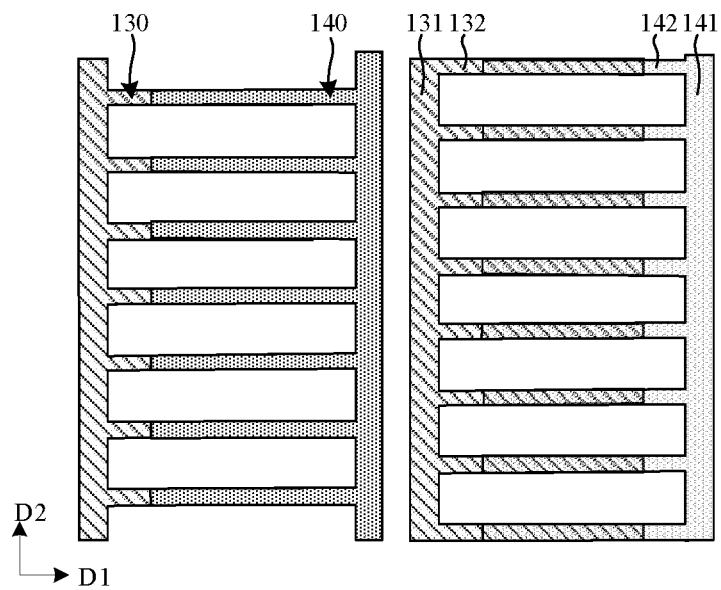
FIG. 8 is a schematic structure diagram of a third storage capacitor of the display substrate according to an exemplary embodiment of the present disclosure.

FIG. 8 is a schematic structure diagram of a third storage capacitor of the display substrate according to an exemplary embodiment of the present disclosure. As shown in FIG. 8, the first sub-electrode plate 110 located in one conductive layer and a fourth sub-electrode plate 140 located in another conductive layer are stacked to constitute a third storage capacitor of a MIM capacitance structure.

In an exemplary implementation mode, the first sub-electrode plate 110 may include a first base part 111 and a plurality of first electrode parts 112, and the fourth sub-electrode plate 140 may include a fourth base part 141 and a plurality of fourth electrode parts 142. The first base part 111 and the fourth base part 141 are disposed opposite to each other in the first direction D1. A plurality of first electrode parts 112 are disposed on a side of the first base part 111 close to the fourth base part 141, and a plurality of fourth electrode parts 142 are disposed on a side of the fourth base part 141 close to the first base part 111. An orthographic projection of the first electrode part 112 on the silicon-based substrate is at least partially overlapped with an orthographic projection of the fourth electrode part 142 on the silicon-based substrate to form a third storage capacitor with an electrode plate structure.

In an exemplary implementation mode, the positions of the plurality of the first electrode parts 112 and the positions of the plurality of the fourth electrode parts 142 may be in a one-to-one correspondence, and an orthographic projection of each first electrode part 112 on the silicon-based substrate is substantially overlapped with an orthographic projection of the corresponding fourth electrode part 142 on the silicon-based substrate.

Figure 9:
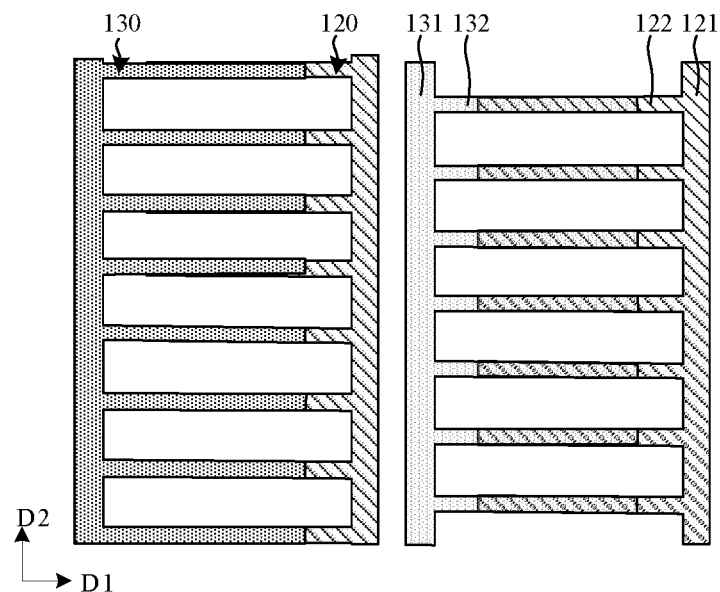
FIG. 9 is a schematic structure diagram of a fourth storage capacitor of the display substrate according to an exemplary embodiment of the present disclosure.

FIG. 9 is a schematic structure diagram of a fourth storage capacitor of the display substrate according to an exemplary embodiment of the present disclosure. As shown in FIG. 9, a second sub-electrode plate 120 located in one conductive layer and a third sub-electrode plate 130 located in another conductive layer are stacked to constitute a third storage capacitor of a MIM capacitance structure.

In an exemplary implementation mode, the second sub-electrode plate 120 may include a second base part 121 and a plurality of second electrode parts 122, and the third sub-electrode plate 130 may include a third base part 131 and a plurality of third electrode parts 132. The second base part 121 and the third base part 131 are disposed opposite to each other in the first direction D1. A plurality of the second electrode parts 122 are disposed on a side of the second base part 121 close to the third base part 131, and a plurality of the third electrode parts 132 are disposed on a side of the third base part 131 close to the second base part 121. An orthographic projection of the second electrode part 122 on the silicon-based substrate is at least partially overlapped with an orthographic projection of the third electrode part 132 on the silicon-based substrate to form a fourth storage capacitor with an electrode plate structure.

In an exemplary implementation mode, the positions of the plurality of the second electrode parts 122 and the positions of the plurality of the third electrode parts 132 may be in a one-to-one correspondence, and an orthographic projection of each second electrode part 122 on the silicon-based substrate is substantially overlapped with an orthographic projection of the corresponding third electrode part 132 on the silicon-based substrate.

In an exemplary implementation mode, the third sub-electrode plate 130 may be connected to the first sub-electrode plate 110 through a via, and the fourth sub-electrode plate 140 may be connected to the second sub-electrode plate 120 through a via.

In an exemplary implementation mode, an orthographic projection of the third base part 131 of the third sub-electrode plate 130 on the silicon-based substrate is at least partially overlapped with an orthographic projection of the first base part 111 of the first sub-electrode plate 110 on the silicon-based substrate, and the third base part 131 is connected to the first base part 111 through a via.

In an exemplary implementation mode, an orthographic projection of the fourth base part 141 of the fourth sub-electrode plate 140 on the silicon-based substrate is at least partially overlapped with an orthographic projection of the second base part 121 of the second sub-electrode plate 120 on the silicon-based substrate, and the fourth base part 141 is connected to the second base part 121 through a via.

Exemplary description is made below through a preparation process of a display device. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display device. In an exemplary embodiment of the present disclosure, "an orthographic projection of B is within a range of an orthographic projection of A" or "an orthographic projection of A includes an orthographic projection of B" refers to that a boundary of an orthographic projection of B falls within a range of a boundary of an orthographic projection of A, or the boundary of an orthographic projection of A is overlapped with the boundary of an orthographic projection of B.

In an exemplary implementation mode, taking 8 sub-pixels in 4 repeating units as an example, the preparation process of the display device may include the following acts.

(1) A silicon-based substrate is formed. In an exemplary implementation mode, forming a silicon-based substrate may include: providing a silicon-based substrate of a P-type silicon material, such as P-type monocrystalline silicon, P-type monocrystalline silicon may serve as a channel region of an N-type transistor.

In an exemplary implementation mode, the silicon-based substrate may employ an N-type silicon material as a channel region of a P-type transistor and the present disclosure is not limited thereto.

Figure 10:
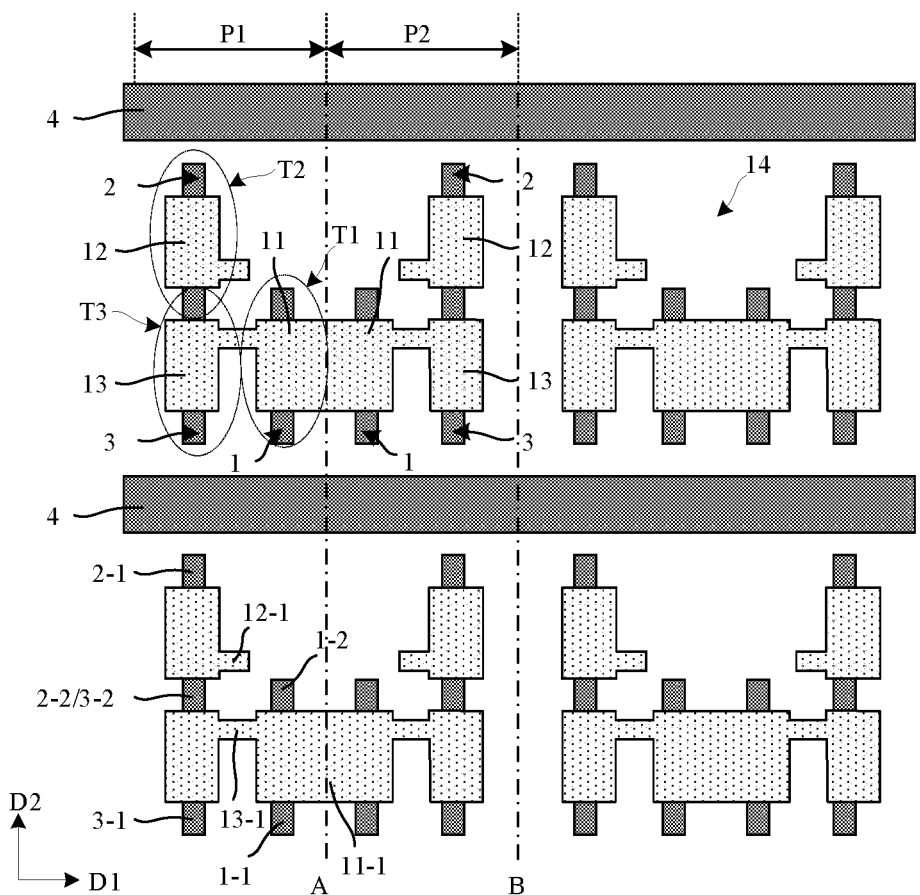
FIG. 10 is a schematic diagram obtained after a pattern of a first conductive layer is formed according to an exemplary embodiment of the present disclosure.

(2) A pattern of a first conductive layer is formed. In an exemplary implementation mode, forming a pattern of a first conductive layer may include: depositing a first insulation film and a polysilicon film sequentially on a silicon-based substrate, then, first, patterning the polysilicon thin film by a patterning process to form a first insulation layer covering a silicon-based substrate and a pattern of the polysilicon layer disposed on the first insulation layer, and then performing a doping process by using the pattern of the polysilicon layer as a shield to form a pattern of the first conductive layer and a pattern of an active layer, as shown in FIG. 10.

In an exemplary implementation mode, the doping process may adopt an N-type doping process, and the doping element can be boron and the like. The formed pattern of the active layer may include at least a first active layer of the first transistor T1, a second active layer of the second transistor T2, a third active layer of the third transistor T3 and a contact region 4. The formed pattern of the first conductive layer may include at least a first gate electrode of the first transistor T1, a second gate electrode of the second transistor T2, a third gate electrode of the third transistor T3, a first gate connection block 11-1, a second gate connection block 12-1, and a third gate connection block 13-1.

In an exemplary implementation mode, the doping process may adopt an ion implantation process. As the polysilicon layer is a semiconductor material, in the ion implantation process, on the one hand, the polysilicon layer can be used as shielding, ions are implanted into two sides of the polysilicon layer to form a first region and a second region of a plurality of transistors to realize self-alignment, on the other hand, the polysilicon layer can be doped at the same time, so that the polysilicon layer with higher resistance becomes the first conductive layer with lower resistance to form gate electrodes and connection electrodes of a plurality of transistors. By adopting the polysilicon material as the first conductive layer, it can save the process cost and reduce the process difficulty.

In an exemplary implementation mode, the first active layer 1, the second active layer 2, and the third active layer 3 in each sub-pixel may have a strip shape extending along the second direction D2, and the second active layer 2 and the third active layer 3 may be connected to each other in an integrated structure, forming an "L" shaped layout in the sub-pixel.

In an exemplary implementation mode, in one repeating unit, the patterns of active layers of two sub-pixels may be mirror-symmetrical with respect to the first center line A, the patterns of active layers in two adjacent repeating units in the first direction D1 may be mirror-symmetrical with respect to the second center line B, and the patterns of active layers in two adjacent repeating units in the second direction D2 may be substantially the same. Thus, the first active layers 1 of the two sub-pixels in a repeating unit can be located in the middle region of the repeating unit, and the second active layers 2 of the two sub-pixels in the repeating unit can be located on two sides of the repeating unit in the first direction D1, and a blank region 14 is formed between the two second active layers 2. The first center line A is a straight line that bisects the repeating unit in the first direction D1 and extends along the second direction D2, and the second center line B is a straight line that lies between the two adjacent repeating units in the first direction D1 and extends along the second direction D2.

In an exemplary implementation mode, the blank region 14 refers to a region where the transistor is not provided, and the active layer and the gate electrode of the transistor are not provided in that region, and the area of the blank region 14 may be larger than the area of the channel region of any transistor.

In an exemplary implementation mode, the shape of the first gate electrode 11 may be rectangular, a region where the first gate electrode 11 is overlapped with the first active layer 1 serves as a first channel region of the first active layer 1, a first region 1-1 of the first active layer 1 may be located on a side of the first channel region away from the blank region 14, and a second region 1-2 of the first active layer 1 may be located on a side of the first channel region close to the blank region 14.

In an exemplary implementation mode, the shape of the second gate electrode 12 may be rectangular, a region where the second gate electrode 12 is overlapped with the second active layer 2 serves as a second channel region of the second active layer 2, a first region 2-1 of the second active layer 2 may be located on a side of the second channel region in the second direction D2, and a second region 2-2 of the second active layer 2 may be located on a side of the second channel region in a direction opposite to the second direction D2.

In an exemplary implementation mode, the shape of the third gate electrode 13 may be rectangular, a region where the third gate electrode 13 is overlapped with the third active layer 3 serves as a third channel region of the third active layer 3, a first region 3-1 of the third active layer 3 may be located on a side of the third channel region in a direction opposite to the second direction D2, and a second region 3-2 of the third active layer 3 may be located on a side of the third channel region in the second direction D2.

In an exemplary implementation mode, the first gate electrode 11 and the third gate electrode 13 in each sub-pixel may be sequentially disposed along the first direction D1, and the second gate electrode 12 and the third gate electrode 13 may be sequentially disposed along the second direction D2, forming an "L" shaped layout in the sub-pixel.

In an exemplary implementation mode, in a repeating unit, the first conductive layers of the two sub-pixels may be mirror-symmetrical with respect to the first center line A, thus, the first gate electrodes 11 of the two sub-pixels in the repeating unit may be located in the middle region of the repeating unit, and the second gate electrodes 12 of the two sub-pixels in the repeating unit may be located on two sides of the repeating unit in the first direction D1, and a blank region 14 is formed between the two second gate electrodes 12.

In an exemplary implementation mode, the first conductive layers in two adjacent repeating units in the first direction D1 may be mirror symmetrical with respect to the second center line B, and the patterns of the first conductive layers and the active layers in two adjacent repeating units in the second direction D2 may be substantially the same.

In an exemplary implementation mode, the shape of the first gate connection block 11-1 may be rectangular, located between adjacent first gate electrodes 11 in the repeating unit. The first gate connection block 11-1 is connected to the first gate electrode 11 of the first sub-pixel P1 on the one hand, and connected to the first gate electrode 11 of the second sub-pixel P2 on the other hand, so that the two first gate electrodes 11 in the repeating unit are connected to each other, and the first gate connection block 11-1 is configured to be connected to a scan signal line formed subsequently.

In an exemplary implementation mode, the shape of the second gate connection block 12-1 may be rectangular, located on a side of the second gate electrode 12 of each sub-pixel facing the blank region 14, and the second gate connection block 12-1 is configured to be connected to the twenty second connection electrode formed subsequently.

In an exemplary implementation mode, the shape of the third gate connection block 13-1 may be rectangular, located between the third gate electrode 13 and the first gate electrode 11 of each sub-pixel. The first gate connection block 11-1 is connected to the third gate electrode 13 on the one hand, and connected to the first gate electrode 11 on the other hand, so that the first gate electrode 11 and the third gate electrode 13 of each sub-pixel are connected to each other, and the third gate connection block 13-1 is configured to be connected to a scan signal line formed subsequently.

In an exemplary implementation mode, the first gate electrode 11, the third gate connection block 13-1 and the third gate electrode 13 in one sub-pixel may be connected to each other in an integrated structure, and the first gate connection block 11-1 and the two first gate electrodes 11 in one repeating unit may be connected to each other in an integrated structure.

In an exemplary implementation mode, by the first gate connection block 11-1 and the third gate connection block 13-1, the first gate electrodes 11 and the third gate electrodes 13 in two adjacent repeating units may be connected to each other in an integrated structure. This arrangement in the present disclosure can make the layout of pixel driving circuits more compact on the premise of satisfying design rules, which is helpful to improve the resolution of the display device.

In an exemplary implementation mode, the second region 2-2 of the second active layer 2 may serve as the second region 3-2 of the third active layer 3, or, the second region 3-2 of the third active layer 3 may serve as the second region 2-2 of the second active layer 2, that is, the second region 2-2 of the second active layer 2 and the second region 3-2 of the third active layer 3 may be connected to each other in an integrated structure, so that not only the structure can be simplified, but also the occupied area of the pixel driving circuit can be reduced, thereby realizing the resolution of the display product.

In an exemplary implementation mode, the contact region 4 may be in a strip shape extending along the first direction D1, and disposed between adjacent repeating units in the second direction D2. The contact region 4 can be an N-type doped region (N+), and the contact region 4 is configured to bias the silicon-based substrate at low voltage, so as to avoid the threshold voltage change caused by parasitic effects, such as the silicon-based substrate bias effect, and improve the stability of the circuit. By setting the contact region 4 to bias the silicon-based substrate at low voltage, the present disclosure can electrically isolate the devices between the repeating units, reduce the parasitic effect between the devices, and improve the stability of the circuit.

Figure 11:
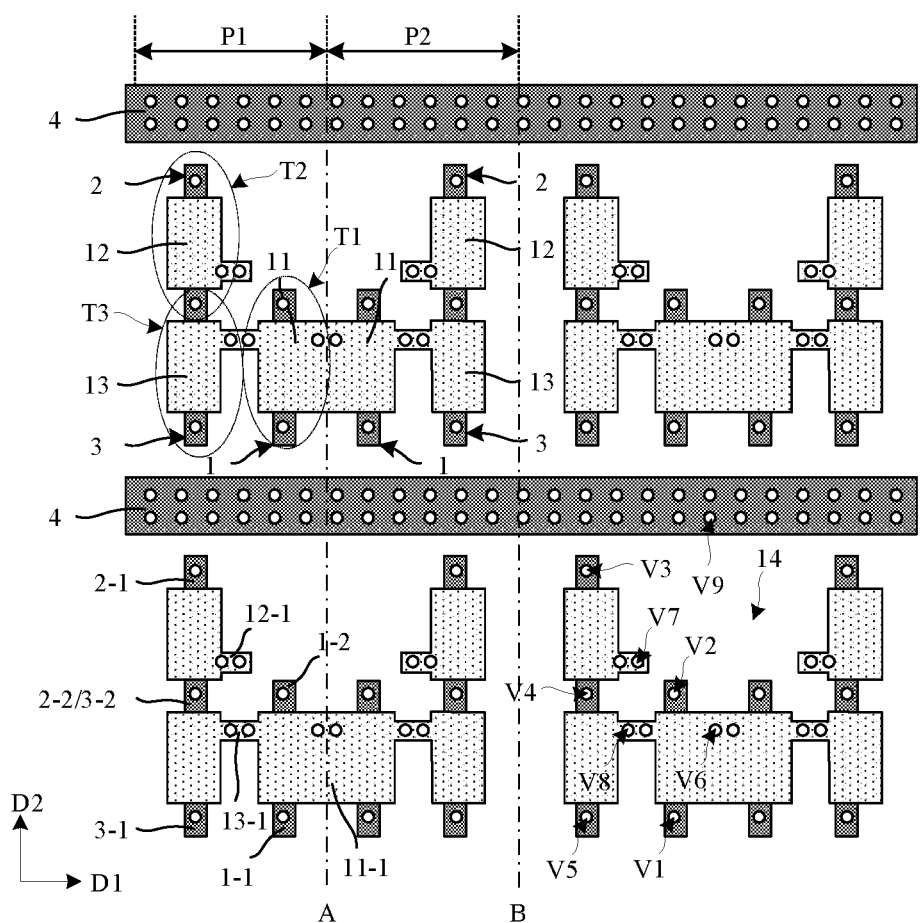
FIG. 11 is a schematic diagram obtained after a pattern of a second insulation layer is formed according to an exemplary embodiment of the present disclosure.

(3) A pattern of a second insulation layer is formed. In an exemplary implementation mode, forming a pattern of a second insulation layer may include: depositing a second insulation thin film on the silicon-based substrate on which the aforementioned pattern is formed, and patterning the second insulation thin film by a patterning process to form a second insulation layer covering the pattern of the first conductive layer, wherein a plurality of vias are provided on the second insulation layer, as shown in FIG. 11.

In an exemplary implementation mode, the plurality of vias may include a first via V1, a second via V2, a third via V3, a fourth via V4, a fifth via V5, a sixth via V6, a seventh via V7, an eighth via V8 and a ninth via V9.

In an exemplary implementation mode, an orthographic projection of the first via V1 on the silicon-based substrate may be located within the range of an orthographic projection of the first region 1-1 of the first active layer on the silicon-based substrate. The first insulation layer and the second insulation layer in the first via V1 are etched away to expose a surface of the first region 1-1 of the first active layer, and the first via V1 is configured such that a twenty first connection electrode formed subsequently is connected to the first region 1-1 of the first active layer 1 through the first via V1.

In an exemplary implementation mode, an orthographic projection of the second via V2 on the silicon-based substrate is located within the range of an orthographic projection of the second region 1-2 of the first active layer 1 on the silicon-based substrate, the first insulation layer and the second insulation layer in the second via V2 are etched away to expose a surface of the second region 1-2 of the first active layer 1, and the second via V2 is configured such that a twenty second connection electrode formed subsequently is connected to the second region 1-2 of the first active layer 1 through the second via V2.

In an exemplary implementation mode, an orthographic projection of the third via V3 on the silicon-based substrate may be located within the range of an orthographic projection of the first region 2-1 of the second active layer 2 on the silicon-based substrate, the first insulation layer and the second insulation layer in the third via V3 are etched away to expose a surface of the first region 2-1 of the second active layer 2, and the third via V3 is configured such that a first power supply line formed subsequently is connected to the first region 2-1 of the second active layer 2 through the third via V3.

In an exemplary implementation mode, an orthographic projection of the fourth via V4 on the silicon-based substrate may be located within the range of an orthographic projection of the second region 2-2 of the second active layer 2 (also the second region 3-2 of the third active layer 3) on the silicon-based substrate, the first insulating layer and the second insulation layer in the fourth via V4 are etched away to expose a surface of the second region 2-2 of the second active layer 2, and the fourth via V4 is configured such that a twenty third connection electrode formed subsequently is connected to the second region 2-2 of the second active layer 2 through the fourth via V4.

In an exemplary implementation mode, an orthographic projection of the fifth via V5 on the silicon-based substrate may be located within the range of an orthographic projection of the first region 3-1 of the third active layer 3 on the silicon-based substrate, the first insulation layer and the second insulation layer in the fifth via V5 are etched away to expose a surface of the first region 3-1 of the third active layer 3, and the fifth via V5 is configured such that a twenty fourth connection electrode formed subsequently is connected to the first region 3-1 of the third active layer 3 through the fifth via V5.

In an exemplary implementation mode, an orthographic projection of the sixth via V6 on the silicon-based substrate may be located within the range of an orthographic projection of the first gate electrode connection block 11-1 on the silicon-based substrate, the second insulation layer in the sixth via V6 is etched away to expose a surface of the first gate electrode connection block 11-1, and the sixth via V6 is configured such that a scan signal line formed subsequently is connected to the first gate electrode connection block 11-1 through the sixth via V6.

In an exemplary implementation mode, an orthographic projection of the seventh via V7 on the silicon-based substrate may be located within the range of an orthographic projection of the second gate electrode connection block 12-1 on the silicon-based substrate, the second insulation layer in the seventh via V7 is etched away to expose a surface of the second gate electrode connection block 12-1, and the seventh via V7 is configured such that a twenty second connection electrode formed subsequently is connected to the second gate electrode connection block 12-1 through the seventh via V7.

In an exemplary implementation mode, an orthographic projection of the eighth via V8 on the silicon-based substrate may be located within the range of an orthographic projection of the third gate electrode connection block 13-1 on the silicon-based substrate, the second insulation layer in the eighth via V8 is etched away to expose a surface of the third gate electrode connection block 13-1, and the eighth via V8 is configured such that a scan signal line formed subsequently is connected to the third gate electrode connection block 13-1 through the eighth via V8.

In an exemplary implementation mode, an orthographic projection of the ninth via V9 on the silicon-based substrate may be located within the range of an orthographic projection of the contact region 4 on the silicon-based substrate, the first insulation layer and the second insulation layer in the ninth via V9 are etched away to expose a surface of the contact region 4, and the ninth via V9 is configured such that a third power supply line formed subsequently is connected to the contact region 4 through the ninth via V9.

In an exemplary implementation mode, the first via V1 to the ninth via V9 may be multiple to reduce the contact resistance and improve the connection reliability.

In an exemplary implementation mode, since the second gate electrode connection block 12-1 of each sub-pixel and the second region 1-2 of the first active layer 1 are both close to the blank region 14, the second via V2 and the seventh via V7 are both close to the blank region 14, and the seventh via V7 is close to the fourth via V4. This arrangement is beneficial to heat dissipation from the lapping via to the blank region, and reduces the influence of heat generation of the lapping via on the overall performance of a transistor.

Figure 12A:
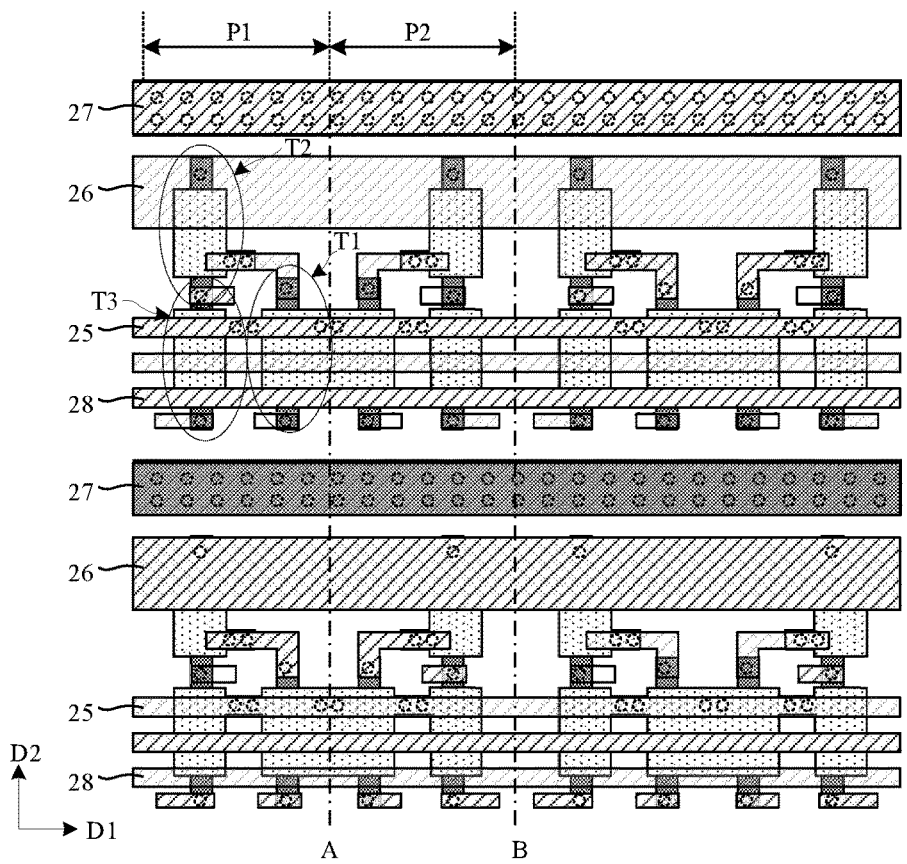
FIG. 12a and FIG. 12b are schematic diagrams obtained after a pattern of a second conductive layer is formed according to an exemplary embodiment of the present disclosure.
Figure 12B:
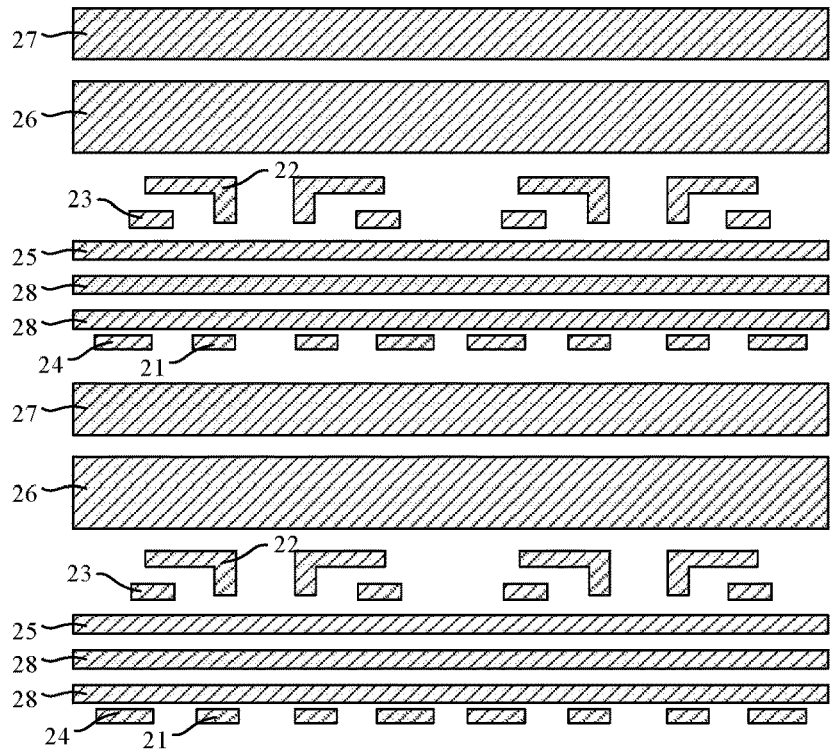

(4) A pattern of a second conductive layer is formed. In an exemplary implementation mode, forming a pattern of a second conductive layer may include: depositing a second conductive thin film on the silicon-based substrate on which the aforementioned patterns are formed, and patterning the second conductive thin film through a patterning process to form a pattern of a second conductive layer on the second insulation layer, as shown in FIG. 12a and FIG. 12b, and FIG. 12b is a schematic diagram of the second conductive layer in FIG. 12a. In an exemplary implementation mode, the second conductive layer may be referred to as a first metal (Metal1) layer.

In an exemplary implementation mode, the pattern of the second conductive layer may include at least: a twenty-first connection electrode 21, a twenty-second connection electrode 22, a twenty-third connection electrode 23, a twenty-fourth connection electrode 24, a scan signal line 25, a first power supply line 26, a third power supply line 27, and at least one dummy line 28.

In an exemplary implementation mode, the shape of the twenty-first connection electrode 21 may be rectangular, and the twenty-first connection electrode 21 may be connected to a first region of the first active layer through a first via V1. The twenty-first connection electrode 21 may serve as a first electrode of the first transistor T1, and the twenty-first connection electrode 21 may be configured to be connected to a data signal line formed subsequently.

In an exemplary implementation mode, the shape of the twenty-second connection electrode 22 may be an "L" shape, and the twenty-second connection electrode 22 may be connected to a second region of the first active layer through a second via V2 on one hand, and connected to a second gate electrode connection block 12-1 through a seventh via V7 on the other hand. The twenty-second connection electrode 22 may serve as a second electrode of the first transistor T1 and it may be connected to a second gate electrode 12 of the second transistor T2 through the second gate electrode connection block 12-1.

In an exemplary implementation mode, the shape of the twenty-third connection electrode 23 may be a strip shape of which a main body portion extends along the first direction D1, and the twenty-third connection electrode 23 may be connected to a second region of the second active layer (also a second region of the third active layer) through a fourth via V4. The twenty-third connection electrode 23 may serve as a second electrode of the second transistor T2 and a second electrode of the third transistor T3 at the same time, and it is configured to be connected to a thirty-second connection electrode formed subsequently.

In an exemplary implementation mode, the shape of the twenty-fourth connection electrode 24 may be a strip shape of which a main body portion extends along the first direction D1, and the twenty-fourth connection electrode 24 may be connected to a first region of the third active layer through a fifth via V5. The twenty-fourth connection electrode 24 may serve as a first electrode of the third transistor T3, and it is configured to be connected to a first signal line formed subsequently.

In an exemplary implementation mode, the shape of the scan signal line 25 may be a line shape of which a main body portion extends along the first direction D1, and the scan signal line 25 may be connected to the first gate electrode connection block 11-1 through a sixth via V6 on one hand, and connected to the third gate electrode connection block 13-1 through an eighth via V8 on the other hand. Since the first gate electrode connection block 11-1 is connected to the first gate electrode 11 and the third gate electrode connection block 13-1 is connected to the third gate electrode 13, the connection between the scan signal line 25 and the first gate electrode 11 and the second gate electrode 13 is realized. The scan signal line 25 can provide a scan signal to the first transistor T1 and the third transistor T3 simultaneously. Since the first transistor T1 and the third transistor T3 are controlled by the same scan signal line 25, it is helpful to reduce the occupied area of the scan signal line 25 and the occupied area of the pixel driving circuit, thereby realizing the resolution of the display product.

In an exemplary implementation mode, the shape of the first power supply line 26 may be a strip shape of which a main body portion extends along the first direction D1, and the first power supply line 26 may be connected to the first region of the second active layer through the third via V3, realizing that the first power supply line 26 supplies a power supply voltage to the second transistor T2.

In an exemplary implementation mode, the shape of the third power supply line 27 may be a strip shape of which a main body portion extends along the first direction D1, and the third power supply line 27 may be connected to the contact region 4 through a plurality of ninth vias V9, so that the third power supply line 27 supplies a low voltage to the contact region 4, bias the silicon-based substrate at a low voltage, realizing electrical isolation of devices, reducing parasitic effects between devices, and improving the stability of the pixel driving circuit. In an exemplary implementation mode, the third power supply line 27 may be a ground line GND.

In an exemplary implementation mode, the shape of the dummy line 28 may be a strip shape of which a main body portion extends along the first direction D1, disposed on a side of the scan signal line 25 away from the first power supply line 26, and the dummy line 28 is configured to improve the etching uniformity of the display substrate. In an exemplary implementation mode, the second conductive layer may include two dummy lines 28.

In an exemplary implementation mode, the first power supply line 26 may be disposed between the scan signal line 25 and the third power supply line 27, and the width of the first power supply line 26 may be greater than the width of the third power supply line 27, and the width of the third power supply line 27 may be greater than the width of the scan signal line 25 to reduce the resistance of the first power supply line 26 and the third power supply line 27 and improve the uniformity of the power supply voltage.

In an exemplary implementation mode, in each repeating unit, the patterns of the second conductive layers of the two sub-pixels may be mirror-symmetrical with respect to the first center line A, the patterns of the second conductive layers of two adjacent repeating units in the first direction D1 may be mirror-symmetrical with respect to the second center line B, and the patterns of the second conductive layers of two adjacent repeating units in the second direction D2 may be substantially the same.

In an exemplary implementation mode, since the second via V2 and the seventh via V7 of each sub-pixel are both close to the blank region 14, and the seventh via V7 is close to the fourth via V4, the twenty-second connection electrode 22 is close to the twenty-third connection electrode 23 when the twenty-second connection electrode 22 is connected with the second gate electrode connection block 12-1 and the second region 1-2 of the first active layer 1 through the second via V2 and the seventh via V7 respectively. This arrangement is beneficial to heat dissipation from the lapping via to the blank region, and reduces the influence of heat generation of the lapping via on the overall performance of a transistor.

Figure 13:
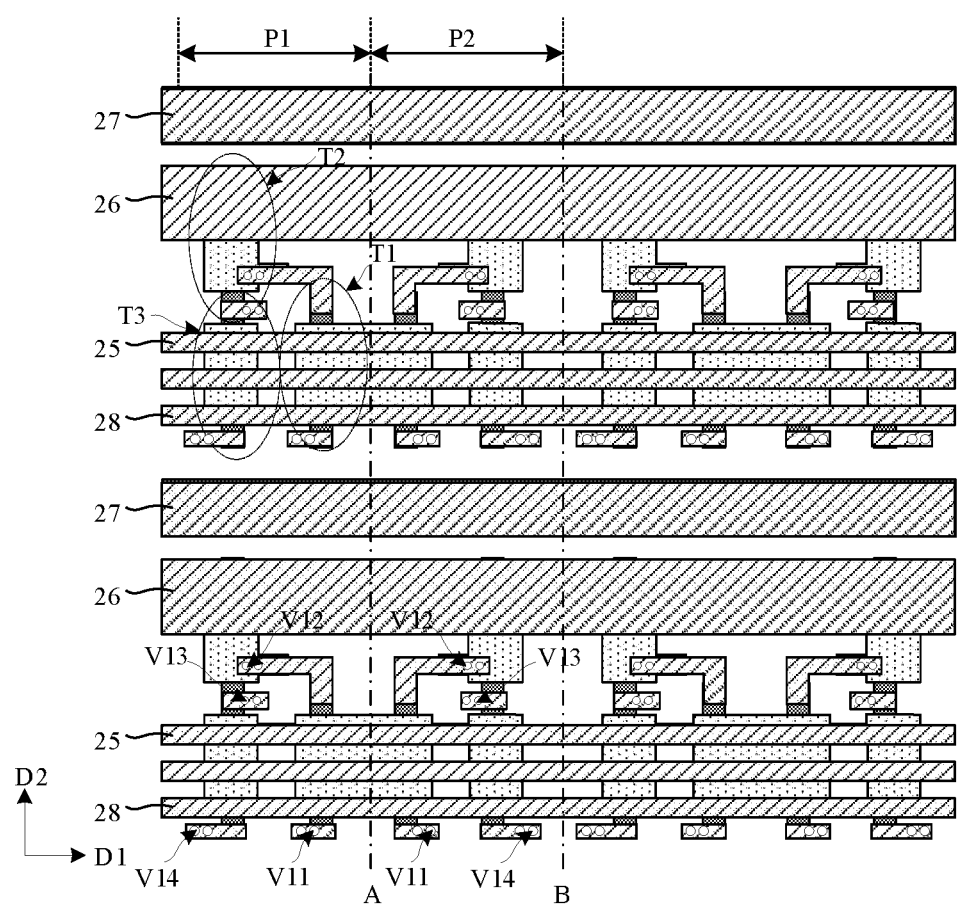
FIG. 13 is a schematic diagram obtained after a pattern of a third insulation layer is formed according to an exemplary embodiment of the present disclosure.

(5) A pattern of a third insulation layer is formed. In an exemplary implementation mode, forming a pattern of the third insulation layer may include: depositing a third insulation thin film on the silicon-based substrate on which the aforementioned patterns are formed, and patterning the third insulation thin film through a patterning process to form a third insulation layer covering the pattern of the second conductive layer, wherein a plurality of vias are provided on the third insulation layer, as shown in FIG. 13.

In an exemplary implementation mode, the plurality of vias may include an eleventh via V11, a twelfth via V12, a thirteenth via V13, and a fourteenth via V14.

In an exemplary implementation mode, an orthographic projection of the eleventh via V11 on the silicon-based substrate may be located within the range of an orthographic projection of the twenty first connection electrode 21 on the silicon-based substrate, the third insulation layer in the eleventh via V11 is etched away to expose a surface of the twenty-first connection electrode 21, and the eleventh via V11 is configured such that a data signal line formed subsequently is connected to the twenty-first connection electrode 21 through the eleventh via V11.

In an exemplary implementation mode, an orthographic projection of the twelfth via 12 on the silicon-based substrate may be located within the range of an orthographic projection of the twenty-second connection electrode 22 on the silicon-based substrate, the third insulation layer in the twelfth via V12 is etched away to expose a surface of the twenty-second connection electrode 22, and the twelfth via V12 is configured such that a thirty-first connection electrode formed subsequently is connected to the twenty-second connection electrode 22 through the twelfth via V12.

In an exemplary implementation mode, an orthographic projection of the thirteenth via 13 on the silicon-based substrate may be located within the range of an orthographic projection of the twenty-third connection electrode 23 on the silicon-based substrate, the third insulation layer in the thirteenth via V13 is etched away to expose a surface of the twenty-third connection electrode 23, and the thirteenth via V13 is configured such that a thirty-second connection electrode formed subsequently is connected to the twenty-third connection electrode 23 through the thirteenth via V13.

In an exemplary implementation mode, an orthographic projection of the fourteenth via 14 on the silicon-based substrate may be located within the range of an orthographic projection of the twenty-fourth connection electrode 24 on the silicon-based substrate, the third insulation layer in the fourteenth via V14 is etched away to expose a surface of the twenty-fourth connection electrode 24, and the fourteenth via V14 is configured such that a first signal line formed subsequently is connected to the twenty-fourth connection electrode 24 through the fourteenth via V14.

In an exemplary implementation mode, the eleventh via V11 to the fourteenth via V14 may be multiple to reduce contact resistance and improve connection reliability.

Figure 14A:
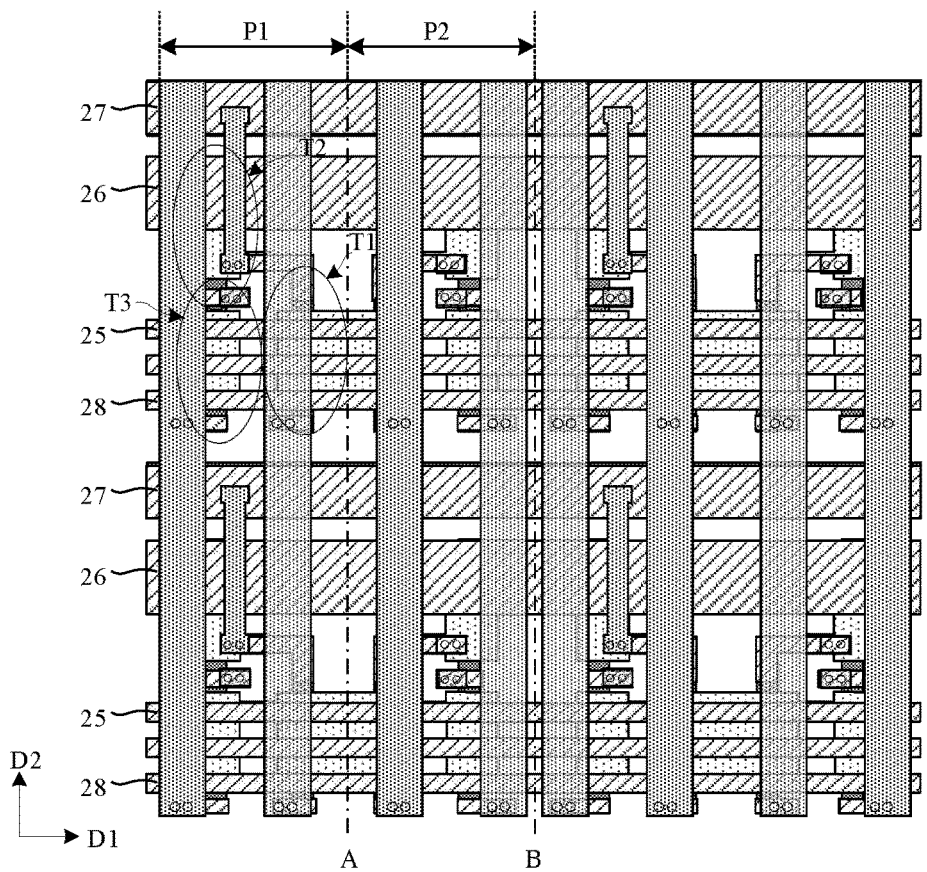
FIG. 14a and FIG. 14b are schematic diagrams obtained after a pattern of a third conductive layer is formed according to an exemplary embodiment of the present disclosure.
Figure 14B:
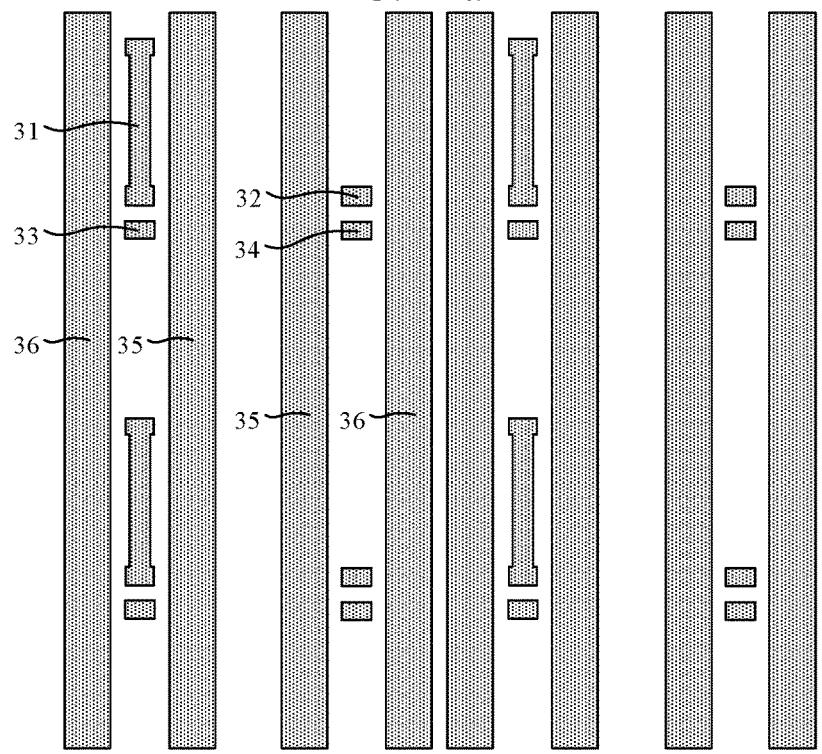

(6) A pattern of a third conductive layer is formed. In an exemplary implementation mode, forming a pattern of a third conductive layer may include: depositing a third conductive thin film on the silicon-based substrate on which the aforementioned patterns are formed, and patterning the third conductive thin film through a patterning process to form a pattern of a third conductive layer disposed on the third insulation layer, as shown in FIG. 14a and FIG. 14b, and FIG. 14b is a schematic diagram of the third conductive layer in FIG. 14a. In an exemplary implementation mode, the third conductive layer may be referred to as a second metal (Metal2) layer.

In an exemplary implementation mode, the pattern of the third conductive layer may include at least: a thirty-first connection electrode 31, a thirty-second connection electrode 32, a thirty-third connection electrode 33, a thirty-fourth connection electrode 34, a data signal line 35, and a first signal line 36.

In an exemplary implementation mode, the thirty-first connection electrode 31 may be located at the first sub-pixel P1, and the shape of the thirty-first connection electrode 31 may be a strip shape extending along the second direction D2. A first end of the thirty-first connection electrode 31 may be connected to the twenty-second connection electrode 22 of the first sub-pixel P1 through the twelfth via V12, and a second end of the thirty-first connection electrode 31 extends along a second direction D2 to a region where the third power supply line 27 is located. An orthographic projection of the second end of the thirty-first connection electrode 31 on the silicon-based substrate is within the range of an orthographic projection of the third power supply line 27 on the silicon-based substrate, and the thirty-first connection electrode 31 is configured to be connected to the forty-first connection electrode formed subsequently.

In an exemplary implementation mode, the thirty-second connection electrode 32 may be located in the second sub-pixel P2, and the shape of the thirty-second connection electrode 32 may be rectangular. The thirty-second connection electrode 32 may be connected to the twenty-second connection electrode 22 of the second sub-pixel P2 through the twelfth via V12, and the thirty-second connection electrode 32 is configured to be connected to the forty-second connection electrode formed subsequently.

In an exemplary implementation mode, the thirty-third connection electrode 33 may be located in the first sub-pixel P1, and the shape of the thirty-third connection electrode 33 may be rectangular. The thirty-third connection electrode 33 may be connected to the twenty-third connection electrode 23 of the first sub-pixel P1 through the thirteenth via V13, and the thirty-third connection electrode 33 is configured to be connected to the forty-third connection electrode formed subsequently.

In an exemplary implementation mode, the thirty-fourth connection electrode 34 may be located in the second sub-pixel P2, and the shape of the thirty-fourth connection electrode 34 may be rectangular. The thirty-fourth connection electrode 34 may be connected to the twenty-third connection electrode 23 of the second sub-pixel P2 through the thirteenth via V13, and the thirty-fourth connection electrode 34 is configured to be connected to the forty-fourth connection Electrode formed subsequently.

In an exemplary implementation mode, the data signal line 35 may be in a strip shape extending along the second direction D2, and the data signal line 35 may be connected to the twenty-first connection electrode 21 through the eleventh via V11. Since the twenty-first connection electrode 21 is connected to the first region of the first active layer, it is realized that the data signal line 35 supplies a data signal to the first electrode of the first transistor T1.

In an exemplary implementation mode, the first signal line 36 may be in a strip shape extending along the second direction D2, and the first signal line 36 may be connected to the twenty-fourth connection electrode 24 through the fourteenth via V14. In an exemplary implementation mode, the first signal line 36 may be a compensation signal line, and since the twenty-fourth connection electrode 24 is connected to the first region of the third active layer, it is realized that the first signal line 36 provides a compensation signal to the first electrode of the third transistor T3.

In an exemplary implementation mode, in each repeating unit, the data signal lines 35 and the first signal lines 36 in the two sub-pixels may be mirror-symmetrical with respect to the first center line A, and the data signal lines 35 and the first signal lines 36 in two adjacent repeating units in the first direction D1 may be mirror-symmetrical with respect to the second center line B. The patterns of the third conductive layers in two adjacent repeating units in the first direction D1 may be substantially the same, and the patterns of the third conductive layers in two adjacent repeating units in the second direction D2 may be substantially the same.

Figure 15:
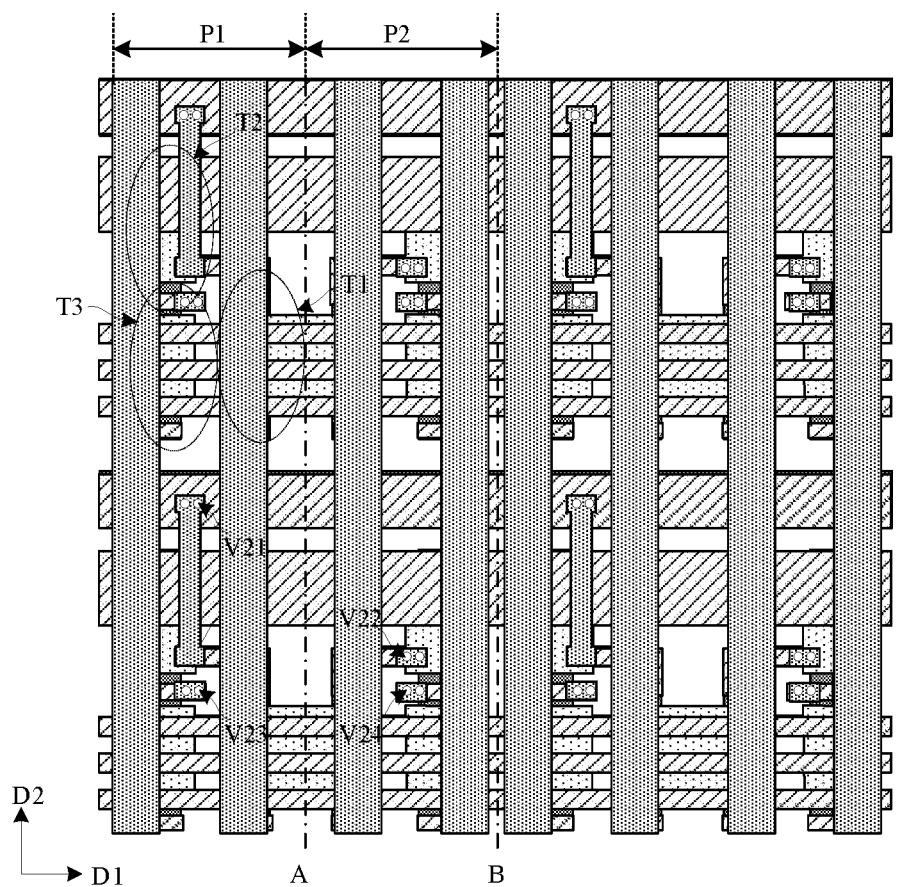
FIG. 15 is a schematic diagram of a display substrate obtained after a pattern of a fourth insulation layer is formed according to an exemplary embodiment of the present disclosure.

(7) A pattern of a fourth insulation layer is formed. In an exemplary implementation mode, forming a pattern of a fourth insulation layer may include: depositing a fourth insulation thin film on the silicon-based substrate on which the aforementioned patterns are formed, and patterning the fourth insulation thin film through a patterning process to form a fourth insulation layer covering the pattern of the third conductive layer, wherein a plurality of vias are provided on the fourth insulation layer, as shown in FIG. 15.

In an exemplary implementation mode, the plurality of vias may include: a twenty-first via V21, a twenty-second via V22, a twenty-third via V23, and a twenty-fourth via V24.

In an exemplary implementation mode, the twenty-first via V21 may be located in the first sub-pixel P1, and an orthographic projection of the twenty-first via 21 on the silicon-based substrate may be located within the range of an orthographic projection of the second end of the thirty-first connection electrode 31 on the silicon-based substrate, the fourth insulation layer in the twenty-first via V21 is etched away to expose a surface of the thirty-first connection electrode 31, and the twenty-first via V21 is configured such that a forty-first connection electrode formed subsequently is connected to the thirty-first connection electrode 31 through the twenty-first via V21. In an exemplary implementation mode, an orthographic projection of the twenty-first via V21 on the silicon-based substrate is located within the range of an orthographic projection of the third power supply line 27 on the silicon-based substrate.

In an exemplary implementation mode, the twenty-second via V22 may be located in the second sub-pixel P2. An orthographic projection of the twenty-second via 22 on the silicon-based substrate is located within the range of an orthographic projection of the thirty-second connection electrode 32 on the silicon-based substrate, the fourth insulation layer in the twenty-second via V22 is etched away to expose a surface of the thirty-second connection electrode 32, and the twenty-second via V22 is configured such that a forty-second connection electrode formed subsequently is connected to the thirty-second connection electrode 32 through the twenty-second via V22.

In an exemplary implementation mode, the twenty-third via V23 may be located in the first sub-pixel P1. An orthographic projection of the twenty-third via 23 on the silicon-based substrate is located within the range of an orthographic projection of the thirty-third connection electrode 33 on the silicon-based substrate, the fourth insulation layer in the twenty-third via V23 is etched away to expose a surface of the thirty-third connection electrode 33, and the twenty-third via V23 is configured such that a forty-third connection electrode formed subsequently is connected to the thirty-third connection electrode 33 through the twenty-third via V23.

In an exemplary implementation mode, the twenty-fourth via V24 may be located in the second sub-pixel P2. An orthographic projection of the twenty-fourth via 24 on the silicon-based substrate is located within the range of an orthographic projection of the thirty-fourth connection electrode 34 on the silicon-based substrate, the fourth insulation layer in the twenty-fourth via V24 is etched away to expose a surface of the thirty-fourth connection electrode 34, and the twenty-fourth via V24 is configured such that a forty-fourth connection electrode formed subsequently is connected to the thirty-fourth connection electrode 34 through the twenty-fourth via V24.

Figure 16A:
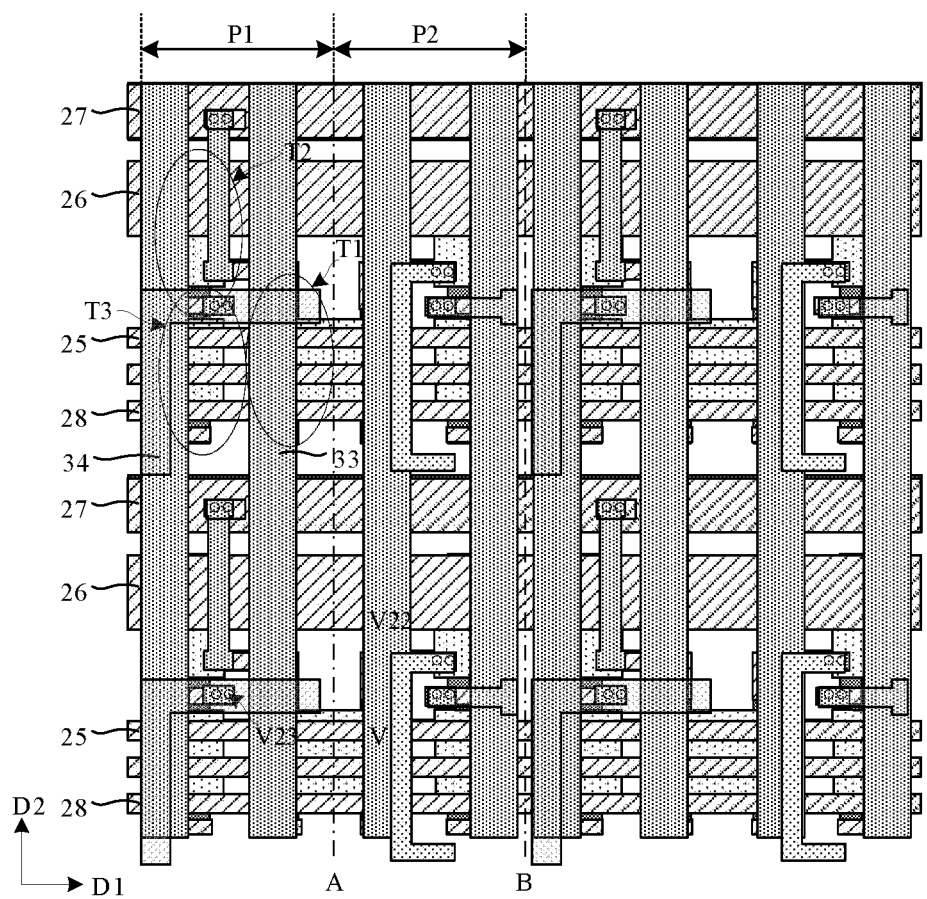
FIG. 16a and FIG. 16b are schematic diagrams obtained after a pattern of a fourth conductive layer is formed according to an exemplary embodiment of the present disclosure.
Figure 16B:
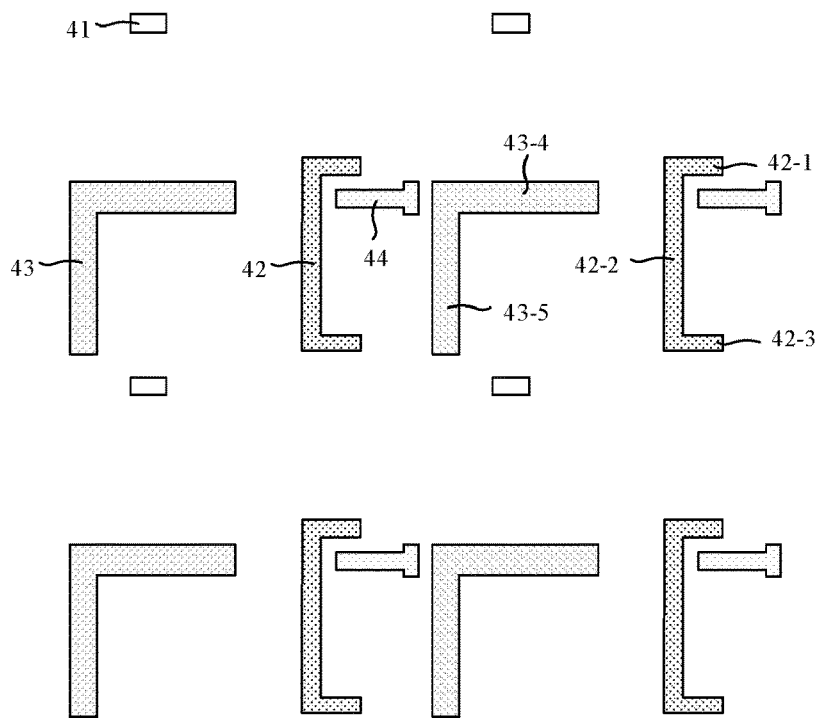

(8) A pattern of a fourth conductive layer is formed. In an exemplary implementation mode, forming a pattern of a fourth conductive layer may include: depositing a fourth conductive thin film on the silicon-based substrate on which the aforementioned patterns are formed, and patterning the fourth conductive thin film through a patterning process to form a pattern of a fourth conductive layer disposed on the fourth insulation layer, as shown in FIG. 16a and FIG. 16b, and FIG. 16b is a schematic diagram of the fourth conductive layer in FIG. 16a. In an exemplary implementation mode, the fourth conductive layer may be referred to as a third metal (Metal3) layer.

In an exemplary implementation mode, the pattern of the fourth conductive layer may include at least: a forty-first connection electrode 41, a forty-second connection electrode 42, a forty-third connection electrode 43, and a forty-fourth connection electrode 44.

In an exemplary implementation mode, the forty-first connection electrode 41 may be located in the first sub-pixel P1. The shape of the forty-first connection electrode 41 may be rectangular, the forty-first connection electrode 41 may be connected to the thirty-first connection electrode 31 of the first sub-pixel P1 through the twenty-first via V21, and the forty-first connection electrode 41 is configured to be connected to the fifty-first connection electrode formed subsequently.

In an exemplary implementation mode, the forty-second connection electrode 42 may be located in the second sub-pixel P2. The shape of the forty-second connection electrode 42 may be a "C" shape. The forty-second connection electrode 42 includes a first side 42-1 and a third side 42-3 extending along the first direction D1 and a second side 42-2 extending along the second direction D2. The first side 42-1 is provided at an end of the second side 42-2 in the second direction D2, and the third side 42-3 is provided at an end of the second side 42-2 in a direction opposite to the second direction D2. An orthographic projection of the second side 42-2 on the silicon-based substrate may be located within the range of an orthographic projection of the data signal line 35 on the silicon-based substrate. The first side 42-1 of the forty-second connection electrode 42 may be connected to the thirty-second connection electrode 32 of the second sub-pixel P2 through the twenty-second via V22, and the forty-second connection electrode 42 is configured to be connected to the fifty-second connection electrode formed subsequently.

In an exemplary implementation mode, the forty-third connection electrode 43 may be located in the first sub-pixel P1. The shape of the forth-third connection electrode 43 may be an "L" shape. The forty-third connection electrode 43 includes a fourth side 43-4 extending along the first direction D1 and a fifth side 43-5 extending along the second direction D2. The fourth side 43-4 is provided at an end of the fifth side 43-5 in the second direction D2, an orthographic projection of the fourth side 43-4 on the silicon-based substrate is at least partially overlapped with an orthographic projection of the data signal line 35 on the silicon-based substrate, and an orthographic projection of the fifth side 43-5 on the silicon-based substrate is located within the range of an orthographic projection of the first signal line 36 on the silicon-based substrate. The fourth side 43-4 of the forty-third connection electrode 43 may be connected to the thirty-third connection electrode 33 of the first sub-pixel P1 through the twenty-third via V23, and the forty-third connection electrode 43 is configured to be connected to the second sub-electrode plate of the first sub-pixel P1 formed subsequently.

In an exemplary implementation mode, the forty-fourth connection electrode 44 may be located in the second sub-pixel P2. The shape of the forty-fourth connection electrode 44 may be a strip shape extending along the first direction D1. A first end of the forty-fourth connection electrode 44 may be connected to the thirty-fourth connection electrode 34 of the second sub-pixel P2 through a twenty-fourth via V24, and a second end of the forty-fourth connection electrode 44 extends along the first direction D1 to a region where the first signal line 36 is located. An orthographic projection of the second end of the forty-fourth connection electrode 44 on the silicon-based substrate may be located within the range of an orthographic projection of the first signal line 36 on the silicon-based substrate, and the forty-fourth connection electrode 44 is configured to be connected to the second sub-electrode plate of the second sub-pixel P2 formed subsequently.

In an exemplary implementation mode, the patterns of the fourth conductive layers in two adjacent repeating units in the first direction D1 may be substantially the same, and the patterns of the fourth conductive layers in two adjacent repeating units in the second direction D2 may be substantially the same.

Figure 17:
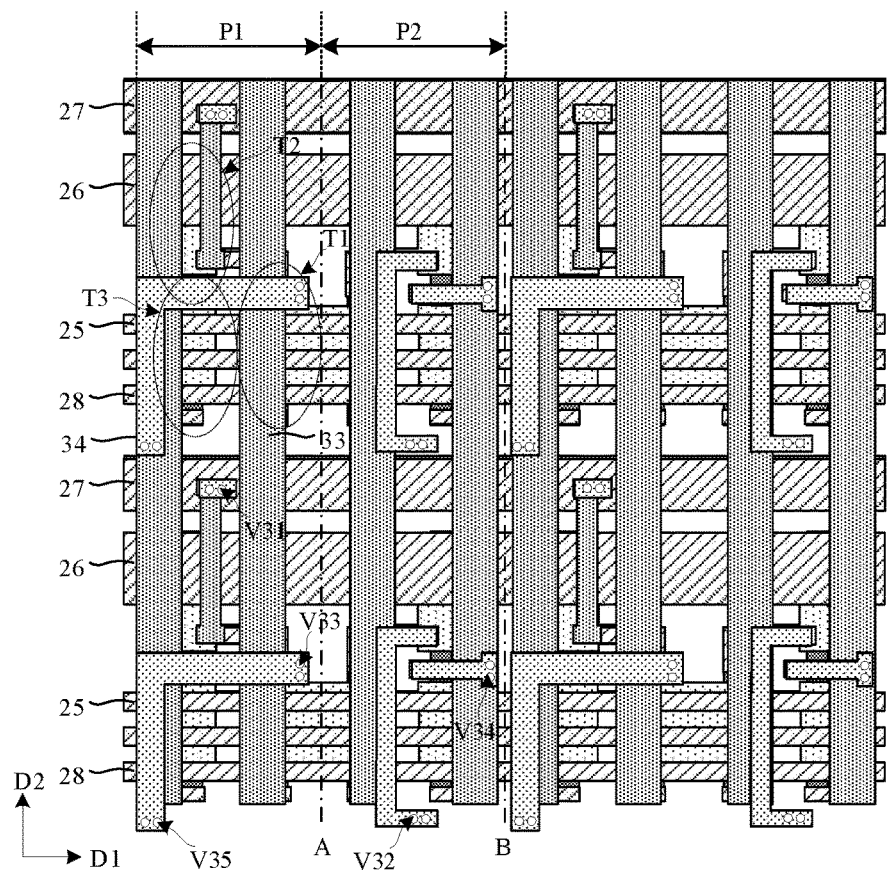
FIG. 17 is a schematic diagram obtained after a pattern of a fifth insulation layer is formed according to an exemplary embodiment of the present disclosure.

(9) A pattern of a fifth insulation layer is formed. In an exemplary implementation mode, forming a pattern of the fifth insulation layer may include: depositing a fifth insulation thin film on the silicon-based substrate on which the aforementioned patterns are formed, and patterning the fifth insulation thin film through a patterning process to form a fifth insulation layer covering the pattern of the fourth conductive layer, wherein a plurality of vias are provided on the fifth insulation layer, as shown in FIG. 17.

In an exemplary implementation mode, the plurality of vias may include: a thirty-first via V31, a thirty-second via V32, a thirty-third via V33, a thirty-fourth via V34, and a thirty-fifth via V35.

In an exemplary implementation mode, the thirty-first via V31 may be located in the first sub-pixel P1. An orthographic projection of the thirty-first via V31 on the silicon-based substrate is located within the range of an orthographic projection of the forty-first connection electrode 41 on the silicon-based substrate, the fifth insulation layer in the thirty-first via V31 is etched away to expose a surface of the forty-first connection electrode 41, and the thirty-first via V31 is configured such that a fifty-first connection electrode formed subsequently is connected to the forty-first connection electrode 41 through the thirty-first via V31.

In an exemplary implementation mode, the thirty-second via V32 may be located in the second sub-pixel P2. An orthographic projection of the thirty-second via V32 on the silicon-based substrate is located within the range of an orthographic projection of the third side 42-3 of the forty-second connection electrode 46 on the silicon-based substrate, the fifth insulation layer in the thirty-second via V32 is etched away to expose a surface of the third side 42-3 of the forty-second connection electrode 46, and the thirty second via V32 is configured such that a fifty-second connection electrode formed subsequently is connected to the forty-second connection electrode 42 through the thirty-second via.

In an exemplary implementation mode, the thirty-third via V33 may be located in the first sub-pixel P1. An orthographic projection of the thirty-third via 33 on the silicon-based substrate is located within the range of an orthographic projection of an end of the fourth side 43-4 in the first direction D1 of the forty-third connection electrode 43 on the silicon-based substrate, the fifth insulation layer in the thirty-third via V33 is etched away to expose a surface of the fourth side 43-4 of the forty-third connection electrode 43, and the thirty-third via V33 is configured such that a second sub-electrode plate of the first sub-pixel P1 formed subsequently is connected to the forty-third connection electrode 43 through the thirty-third via V33.

In an exemplary implementation mode, the thirty-fourth via 34 may be located in the second sub-pixel P2. An orthographic projection of the thirty-fourth via 34 on the silicon-based substrate is located within the range of an orthographic projection of a second end of the forty-fourth connection electrode 44 on the silicon-based substrate, the fifth insulation layer in the thirty-fourth via V34 is etched away to expose a surface of the second end of the forty-fourth connection electrode 44, and the thirty-fourth via V34 is configured such that a second sub-electrode plate of the second sub-pixel P2 formed subsequently is connected to the forty-fourth connection electrode 44 through the thirty-fourth via V34.

In an exemplary implementation mode, the thirty-fifth via V35 may be located in the first sub-pixel P1. An orthographic projection of the thirty-fifth via V35 on the silicon-based substrate is located within the range of an orthographic projection of an end of the fifth side 43-5 of the forty-third connection electrode 43 in a direction opposite to the second direction D2 on the silicon-based substrate, the fifth insulation layer in the thirty-fifth via V35 is etched away to expose a surface of the fifth side 43-5 of the forty-third connection electrode 43, and the thirty-fifth via V35 is configured such that a fifty-third connection electrode formed subsequently is connected to the forty-third connection electrode 43 through the thirty-fifth via V35.

Figure 18A:
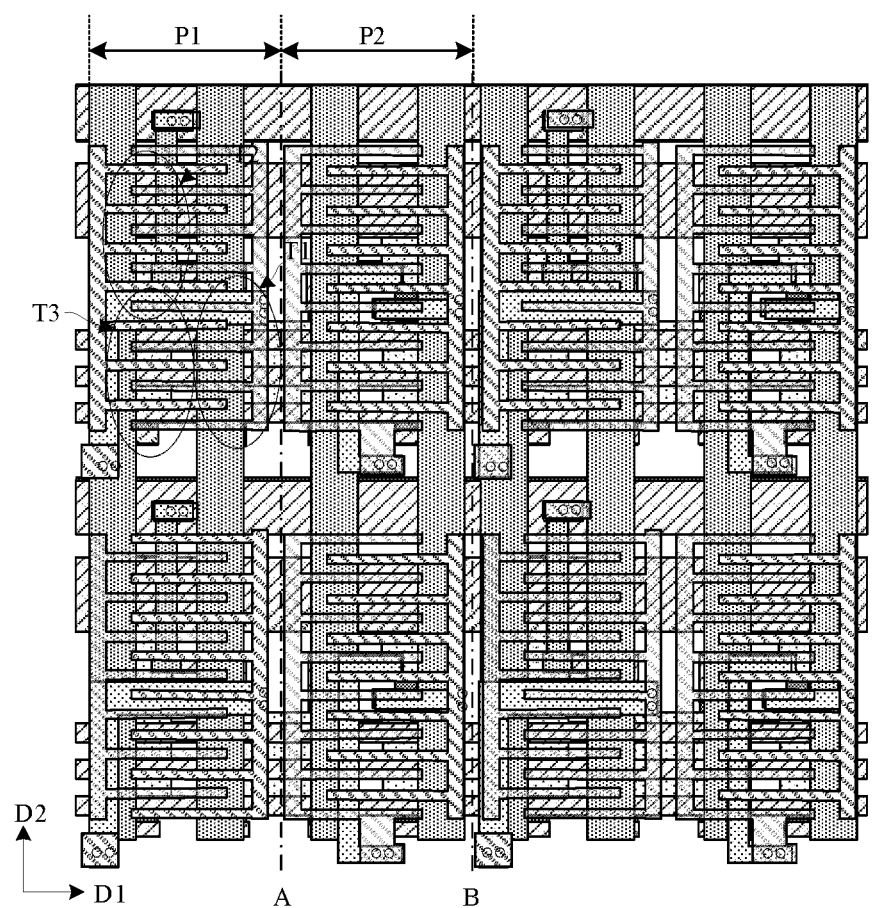
FIG. 18a and FIG. 18b are schematic diagrams obtained after a pattern of a fifth conductive layer is formed according to an exemplary embodiment of the present disclosure.
Figure 18B:
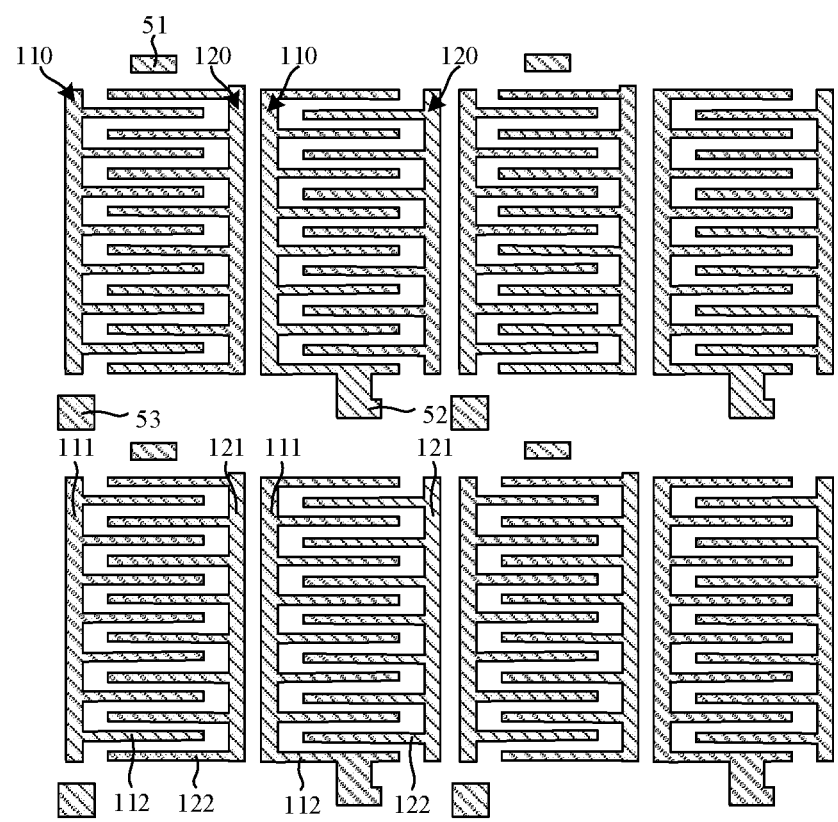

(10) A pattern of a fifth conductive layer is formed. In an exemplary implementation mode, forming a pattern of a fifth conductive layer may include: depositing a fifth conductive thin film on the silicon-based substrate on which the aforementioned patterns are formed, and patterning the fifth conductive thin film through a patterning process to form a pattern of a fifth conductive layer on the fifth insulation layer, as shown in FIG. 18a and FIG. 18b, and FIG. 18b is a schematic diagram of the fifth conductive layer in FIG. 18a. In an exemplary implementation mode, the fifth conductive layer may be referred to as a fourth metal (Metal4) layer.

In an exemplary implementation mode, the pattern of a fifth conductive layer in one repeating unit may include at least: a fifty-first connection electrode 51, a fifty-second connection electrode 52, a fifty-third connection electrode 53, a first sub-electrode plate 110 and a second sub-electrode plate 120 of the two sub-pixels.

In an exemplary implementation mode, the fifty-first connection electrode 51 may be located in the first sub-pixel P1, the shape of the fifty-first connection electrode 51 may be rectangular, the fifty-first connection electrode 51 may be connected to the forty-first connection electrode 41 through the thirty-first via V31, and the fifty-first connection electrode 51 is configured to be connected to a sixty-first connection electrode formed subsequently.

In an exemplary implementation mode, the fifty-second connection electrode 52 may be located in the second sub-pixel P2, the shape of the fifty-second connection electrode 52 may be rectangular, the fifty-second connection electrode 52 may be connected to the third side 42-3 of the forty-second connection electrode 42 through the thirty-second via V32, and the fifty-second connection electrode 52 is configured to be connected to a sixty-second connection electrode formed subsequently.

In an exemplary implementation mode, the fifty-third connection electrode 53 may be located in the first sub-pixel P1, the shape of the fifty-third connection electrode 53 may be rectangular, the fifty-third connection electrode 53 may be connected to the fifth side 43-5 of the forty-third connection electrode 43 through the thirty-fifth via V35, and the fifty-third connection electrode 53 is configured to be connected to the sixty-third connection electrode formed subsequently.

In an exemplary implementation mode, the comb-shaped first sub-electrode plate 110 and the comb-shaped second sub-electrode plate 120 in the first sub-pixel P1 constitute a first storage capacitance of the first sub-pixel P1, and the comb-shaped first sub-electrode plate 110 and the comb-shaped second sub-electrode plate 120 in the second sub-pixel P2 constitute a first storage capacitance of the second sub-pixel P2.

In an exemplary implementation mode, a first sub-electrode plate 110 of the first sub-pixel P1 and the second sub-pixel P2 may include a first base part 111 and a plurality of first electrode parts 112, and the second sub-electrode plate 120 may include a second base part 121 and a plurality of second electrode parts 122. In the first direction D1, the first base part 111 and the second base part 121 are disposed opposite to each other, and in the second direction D2, the first electrode part 112 and the second electrode part 122 are alternately disposed to form a first storage capacitor with an interdigital structure.

In an exemplary implementation mode, the first base part 111 may be in a strip shape extending along the second direction D2, the first electrode part 112 may be in a strip shape extending along the first direction D1, a plurality of the first electrode parts 112 may be disposed at intervals along the second direction D2, the first ends of the plurality of the first electrode parts 112 are connected to the first base part 111, the second ends of the plurality of the first electrode parts 112 extend towards the direction of the second base part 121 of the second sub-electrode plate 120, and at least one first electrode part 112 is located between two adjacent second electrode parts 122 in the second direction D2.

In an exemplary implementation mode, the second base part 121 may be in a strip shape extending along the second direction D2, the second electrode part 122 may be in a strip shape extending along the first direction D1, the plurality of the second electrode parts 122 may be disposed at intervals along the second direction D2, the first ends of the plurality of the second electrode parts 122 are connected to the second base part 121, the second ends of the plurality of the second electrode parts 122 extend towards the direction of the first base part 111 of the first sub-electrode plate 110, and at least one second electrode part 122 is located between two adjacent first electrode parts 112 in the second direction D2.

In an exemplary implementation mode, in the first sub-pixel P1, the position of the first base part 111 may correspond to the position of the first signal line 36, an orthographic projection of the first base part 111 on the silicon-based substrate is at least partially overlapped with an orthographic projection of the first signal line 36 on the silicon-based substrate, and the position of the second base part 121 may be located on the side of the data signal line 35 in the first direction D1. The first base part 111 is configured to be connected to the third base part formed subsequently, and the third base part is connected to the fifty-first connection electrode 51. The second base part 121 is connected to the fourth side 43-4 of the forty-third connection electrode 43 through the thirty-third via V33. Since the fifty-first connection electrode 51 is connected to the forty-first connection electrode 41 through a via, the forty-first connection electrode 41 is connected to the thirty-first connection electrode 31 through a via, the thirty-first connection electrode 31 is connected to the twenty-second connection electrode 22 through a via, and the twenty-second connection electrode 22 is connected to the second region of the first active layer and the second gate electrode 12 through a via, so that the first sub-electrode plate 110 including the first base part 111 and the first electrode part 112 has the potential of the first node N1. Since the forty-third connection electrode 43 is connected to the thirty-third connection electrode 33 through a via, the thirty-third connection electrode 33 is connected to the twenty-third connection electrode 23 through a via, and the twenty-third connection electrode 23 is connected to the second region of the second active layer (also the second region of the third active layer) through a via, so that the second sub-electrode plate 120 including the second base part 121 and the second electrode part 122 has the potential of the second node N2.

Thus, the first sub-electrode plate 110 having the potential of the first node N1 and the second sub-electrode plate 120 having the potential of the second node N2 constitute the first storage capacitance of a MOM capacitance structure in the first sub-pixel P1.

In an exemplary implementation mode, in the second sub-pixel P2, the position of the first base part 111 may be located on a side of the data signal line 35 in a direction opposite to the first direction D1, the position of the second base part 121 may correspond to the position of the first signal line 36, and an orthographic projection of the second base part 121 on the silicon-based substrate is at least partially overlapped with an orthographic projection of the first signal line 36 on the silicon-based substrate. The first base part 111 is connected to the fifty-second connection electrode 52, and the second base part 121 is connected to the forty-fourth connection electrode 44 through the thirty-fourth via V34. Since the fifty-second connection electrode 52 is connected to the forty-second connection electrode 42 through a via, the forty-second connection electrode 42 is connected to the thirty-second connection electrode 32 through a via, the thirty-second connection electrode 32 is connected to the twenty-second connection electrode 22 through a via, and the twenty-second connection electrode 22 is connected to the second gate electrode 12, so that the first sub-electrode plate 110 including the first base part 111 and the first electrode part 112 has the potential of the first node N1. Since the forty-fourth connection electrode 44 is connected to the thirty-fourth connection electrode 34 through a via, the thirty-fourth connection electrode 34 is connected to the twenty-third connection electrode 23 through a via, and the twenty-third connection electrode 23 is connected to the second region of the second active layer (also the second region of the third active layer) through a via, so that the second sub-electrode plate 120 including the second base part 121 and the second electrode part 122 has the potential of the second node N2. Thus, the first sub-electrode plate 110 having the potential of the first node N1 and the second sub-electrode plate 120 having the potential of the second node N2 constitute the first storage capacitance of a MOM capacitance structure in the second sub-pixel P2.

In an exemplary implementation mode, the first sub-electrode plate 110 and the fifty-second connection electrode 52 of the second sub-pixel P2 may be connected to each other in an integrated structure.

Figure 19:
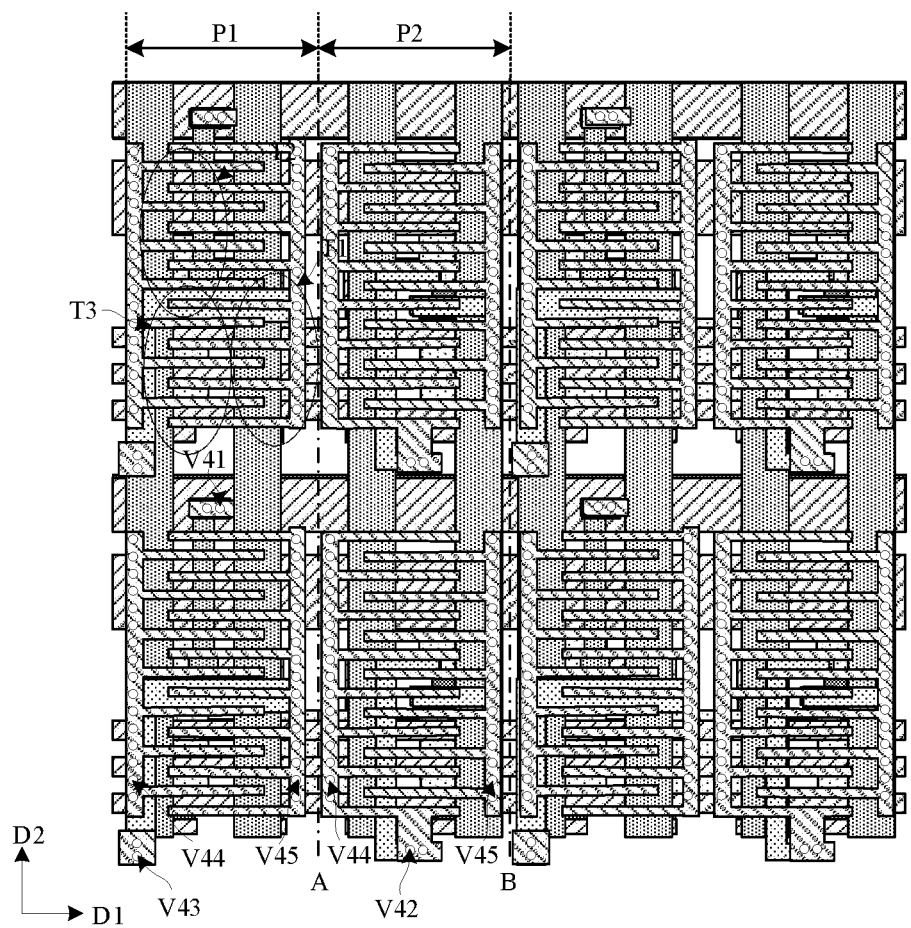
FIG. 19 is a schematic diagram obtained after a pattern of a sixth insulation layer is formed according to an exemplary embodiment of the present disclosure.

(11) A pattern of a sixth insulation layer is formed. In an exemplary implementation mode, forming a pattern of a sixth insulation layer may include: depositing a sixth insulation thin film on the silicon-based substrate on which the aforementioned patterns are formed, and patterning the sixth insulation thin film through a patterning process to form a sixth insulation layer covering the pattern of the fifth conductive layer, wherein a plurality of vias are provided on the sixth insulation layer, as shown in FIG. 19.

In an exemplary implementation mode, a plurality of vias in one repeating unit may include: a forty-first via V41, a forty-second via V42, a forty-third via V43, a forty-fourth via V44, a forty-fifth via V45, a forty-sixth via V46, and a forty-seventh via V47.

In an exemplary implementation mode, the forty-first via V41 may be located in the first sub-pixel P1. An orthographic projection of the forty-first via 41 on the silicon-based substrate is located within the range of an orthographic projection of the fifty-first connection electrode 51 on the silicon-based substrate, the sixth insulation layer in the forty-first via V41 is etched away to expose a surface of the fifty-first connection electrode 51, and the forty-first via V41 is configured such that a sixty-first connection electrode formed subsequently is connected to the fifty-first connection electrode 51 through the forty-first via V41.

In an exemplary implementation mode, the forty-second via V42 may be located in the second sub-pixel P2. An orthographic projection of the forty-second via V42 on the silicon-based substrate is located within the range of an orthographic projection of the fifty-second connection electrode 52 on the silicon-based substrate, the sixth insulation layer in the forty-second via V42 is etched away to expose a surface of the fifty-second connection electrode 52, and the forty-second via V42 is configured such that a sixty-second connection electrode formed subsequently is connected to the fifty-second connection electrode 52 through the forty-second via V42.

In an exemplary implementation mode, the forty-third via V43 may be located in the first sub-pixel P1. An orthographic projection of the forty-third via 43 on the silicon-based substrate is located within the range of an orthographic projection of the fifty-third connection electrode 53 on the silicon-based substrate, the sixth insulation layer in the forty-third via V43 is etched away to expose a surface of the fifty-third connection electrode 53, and the forty-third via V43 is configured such that an sixty-third connection electrode formed subsequently is connected to the fifty-third connection electrode 53 through the forty-third via V43.

In an exemplary implementation mode, an orthographic projection of the forty-fourth via V44 on the silicon-based substrate is located within the range of an orthographic projection of the first base part 111 of a first sub-electrode plate 110 in the first sub-pixel P1 and the second sub-pixel P2 on the silicon-based substrate, the sixth insulation layer in the forty-fourth via V44 is etched away to expose a surface of the first base part 111, and the forty-fourth via V44 is configured such that a third sub-electrode plate formed subsequently is connected to the first sub-electrode plate 110 through the forty-fourth via V44. In an exemplary implementation mode, a plurality of the forty-fourth vias V44 may be sequentially disposed along the second direction D2 to improve connection reliability.

In an exemplary implementation mode, an orthographic projection of the forty-fifth via V45 on the silicon-based substrate is located within the range of an orthographic projection of the second base part 121 of a second sub-electrode plate 120 in the first sub-pixel P1 and the second sub-pixel P2 on the silicon-based substrate, the sixth insulation layer in the forty-fifth via V45 is etched away to expose a surface of the second base part 121, and the forty-fifth via V45 is configured such that a fourth sub-electrode plate formed subsequently is connected to the second sub-electrode plate 120 through the forty-fifth via V45. In an exemplary implementation mode, a plurality of the forty-fifth vias V45 may be sequentially disposed along the second direction D2 to improve connection reliability.

Figure 20A:
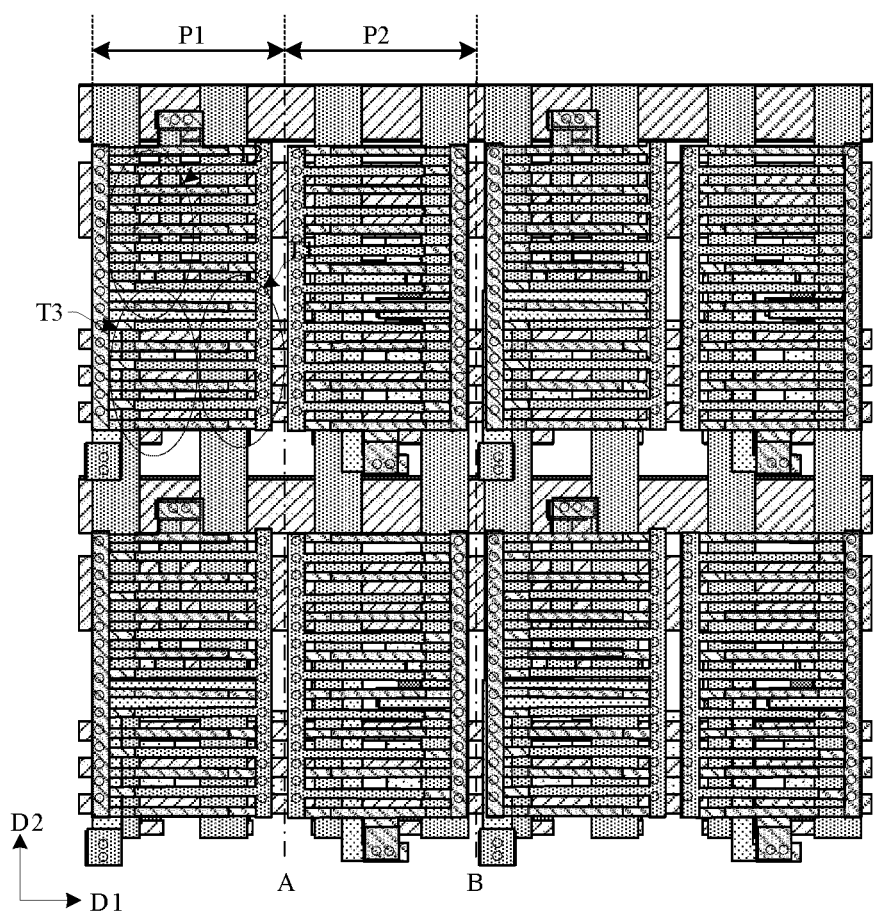
FIG. 20a and FIG. 20b are schematic diagrams obtained after a pattern of a sixth conductive layer is formed according to an embodiment of the present disclosure.
Figure 20B:
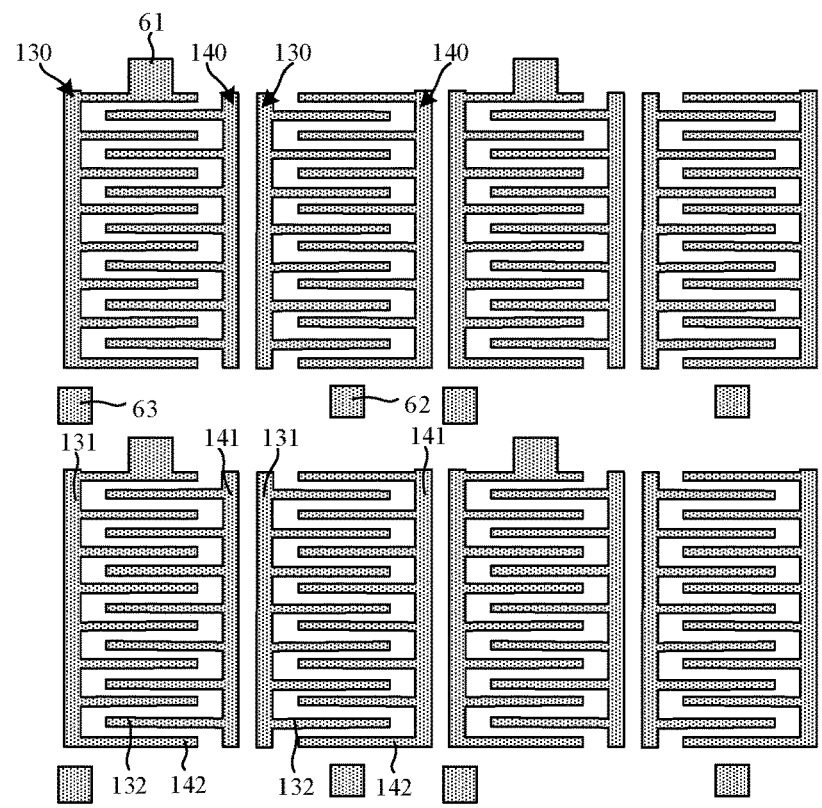

(12) A pattern of a sixth conductive layer is formed. In an exemplary implementation mode, forming a pattern of a sixth conductive layer may include: depositing a sixth conductive thin film on the silicon-based substrate on which the aforementioned patterns are formed, and patterning the sixth conductive thin film through a patterning process to form a pattern of a sixth conductive layer on the sixth insulation layer, as shown in FIG. 20*a* and FIG. 20*b*, and FIG. 20*b* is a schematic diagram of the sixth conductive layer in FIG. 20*a*. In an exemplary implementation mode, the sixth conductive layer may be referred to as a fifth metal (Metal5) layer.

In an exemplary implementation mode, the pattern of the sixth conductive layer in one repeating unit may include at least: a sixty-first connection electrode 61, a sixty-second connection electrode 62, a sixty-third connection electrode 63, a third sub-electrode plate 130 and a fourth sub-electrode plate 140 of the two sub-pixels.

In an exemplary implementation mode, the shape of the sixty-first connection electrode 61 may be rectangular, the sixty-first connection electrode 61 may be connected to the fifty-first connection electrode 51 through the forty-first via V41, and the sixty-first connection electrode 61 is configured to be connected to a seventy-first connection electrode formed subsequently.

In an exemplary implementation mode, the shape of the sixty-second connection electrode 62 may be rectangular, the sixty-second connection electrode 62 may be connected to the fifty-second connection electrode 52 through the forty-second via V42, and the sixty-second connection electrode 62 is configured to be connected to a seventy-second connection electrode formed subsequently.

In an exemplary implementation mode, the shape of the sixty-third connection electrode 63 may be rectangular, the sixty-third connection electrode 63 may be connected to the fifty-third connection electrode 53 through the forty-third via V43, and the sixty-third connection electrode 63 is configured to be connected to a seventy-third connection electrode formed subsequently.

In an exemplary implementation mode, the comb-shaped third sub-electrode plate 130 and the comb-shaped fourth sub-electrode plate 140 in the first sub-pixel P1 constitute a second storage capacitance of the first sub-pixel P1, and the comb-shaped third sub-electrode plate 130 and the comb-shaped fourth sub-electrode plate 140 in the second sub-pixel P2 constitute a second storage capacitance of the second sub-pixel P2.

In an exemplary implementation mode, a third sub-electrode plate 130 of the first sub-pixel P1 and the second sub-pixel P2 may include a third base part 131 and a plurality of third electrode parts 132, and the fourth sub-electrode plate 140 may include a fourth base part 141 and a plurality of fourth electrode parts 142. In the first direction D1, the third base part 131 and the fourth base part 141 are disposed opposite to each other, and in the second direction D2, the third electrode part 132 and the fourth electrode part 142 are alternately disposed to form a second storage capacitor with an interdigital structure.

In an exemplary implementation mode, the third base part 131 may be in a strip shape extending along the second direction D2, the third electrode part 132 may be in a strip shape extending along the first direction D1, the plurality of the third electrode parts 132 may be disposed at intervals along the second direction D2, the first ends of the plurality of the third electrode parts 132 are connected to the third base part 131, the second ends of the plurality of the third electrode parts 132 extend towards the direction of the fourth base part 141 of the fourth sub-electrode plate 140, and at least one third electrode part 132 is located between two adjacent fourth electrode parts 142 in the second direction D2.

In an exemplary implementation mode, the position of the third base part 131 of the third sub-electrode plate 130 may correspond to the position of the first base part 111 of the first sub-electrode plate 110, an orthographic projection of the third base part 131 on the silicon-based substrate is at least partially overlapped with an orthographic projection of the first base part 111 on the silicon-based substrate, and the third base part 131 is connected to the first base part 111 through a plurality of the forty-fourth vias V44.

In an exemplary implementation mode, the fourth base part 141 may be in a strip shape extending along the second direction D2. The fourth electrode part 142 may be in a strip shape extending along the first direction D1, the plurality of the fourth electrode parts 142 may be disposed at intervals along the second direction D2, the first ends of the plurality of the fourth electrode parts 142 are connected to the fourth base part 141, the second ends of the plurality of the fourth electrode parts 142 extend towards a direction of the third base part 131 of the third sub-electrode plate 130, and at least one fourth electrode part 142 is located between two adjacent third electrode parts 132 in the second direction D2.

In an exemplary implementation mode, the position of the fourth base part 141 of the fourth sub-electrode plate 140 may correspond to the position of the second base part 121 of the second sub-electrode plate 120, an orthographic projection of the fourth base part 141 on the silicon-based substrate is at least partially overlapped with an orthographic projection of the second base part 121 on the silicon-based substrate, and the fourth base part 141 is connected to the second base part 121 through a plurality of the forty-fifth vias V45.

In an exemplary implementation mode, the third sub-electrode plate 130 is connected to the sixty-first connection electrode 61 in the first sub-pixel P1. Since the sixty-first connection electrode 61 is connected to the fifty-first connection electrode 51 through a via, the fifty-first connection electrode 51 is connected to the forty-first connection electrode 41 through a via, the forty-first connection electrode 41 is connected to the thirty-first connection electrode 31 through a via, the thirty-first connection electrode 31 is connected to the twenty-second connection electrode 22 through a via, and the twenty-second connection electrode 22 is connected to the second region of the first active layer and the second gate electrode 12 through a via, so that the third sub-electrode plate 130 including the third base part 131 and the third electrode part 132 has the potential of the first node N1. Since the third sub-electrode plate 130 is connected to the first sub-electrode plate 110 through a via, the first sub-electrode plate 110 has the potential of the first node N1. Since the fourth sub-electrode plate 140 is connected to the second sub-electrode plate 120 through a via and the second sub-electrode plate 120 has the potential of the second node N2, the fourth sub-electrode plate 140 including the fourth base part 141 and the fourth electrode part 142 has the potential of the second node N2. Thus, the third sub-electrode plate 130 having the potential of the first node N1 and the fourth sub-electrode plate 140 having the potential of the second node N2 constitute the second storage capacitance of a MOM capacitance structure in the first sub-pixel P1.

In an exemplary implementation mode, the third sub-electrode plate 130 and the sixty-first connection electrode 61 may be connected to each other in an integrated structure.

In an exemplary implementation mode, in the second sub-pixel P2, since the third sub-electrode plate 130 is connected to the first sub-electrode plate 110 through a via and the first sub-electrode plate 110 has the potential of the first node N1, the third sub-electrode plate 130 including the third base part 131 and the third electrode part 132 has the potential of the first node N1. Since the fourth sub-electrode plate 140 is connected to the second sub-electrode plate 120 through a via and the second sub-electrode plate 120 has the potential of the second node N2, the fourth sub-electrode plate 140 including the fourth base part 141 and the fourth electrode part 142 has the potential of the second node N2. Thus, the third sub-electrode plate 130 having the potential of the first node N1 and the fourth sub-electrode plate 140 having the potential of the second node N2 constitute the second storage capacitance of a MOM capacitance structure in the second sub-pixel P2.

Figure 20C:
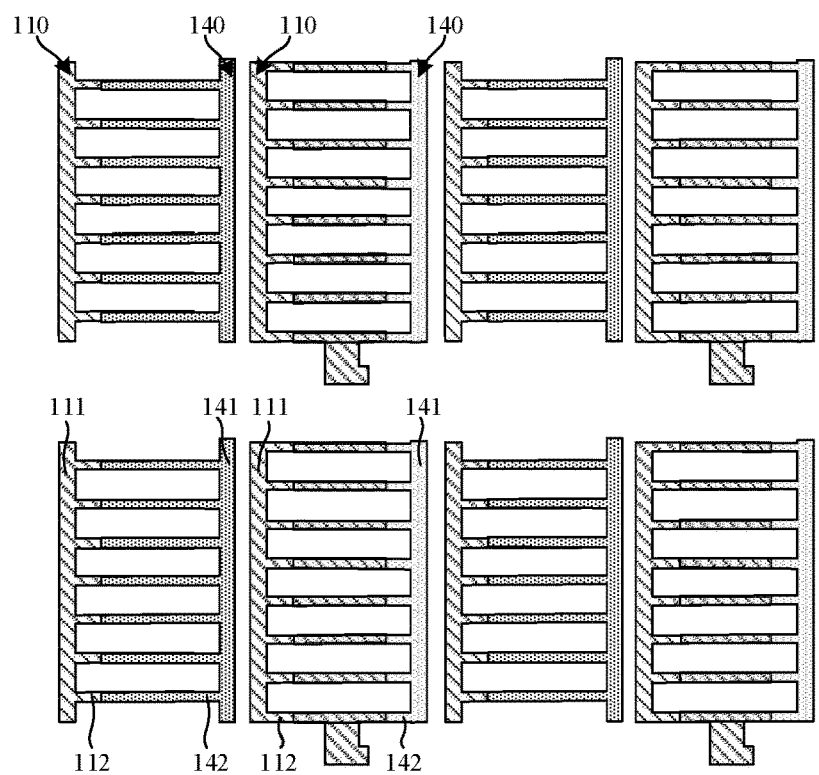
FIG. 20c is a schematic structure diagram of a first sub-electrode plate and a fourth sub-electrode plate according to an exemplary embodiment of the present disclosure.

FIG. 20c is a schematic structure diagram of a first sub-electrode plate and a fourth sub-electrode plate according to an exemplary embodiment of the present disclosure. In an exemplary implementation mode, the first base part 111 of the first sub-electrode plate 110 and the fourth base part 141 of the fourth sub-electrode plate 140 may be disposed opposite to each other in the first direction D1, the positions of the plurality of the first electrode parts 121 of the first sub-electrode plate 110 may correspond to the positions of the plurality of the fourth electrode parts 142 of the fourth sub-electrode plate 140, and an orthographic projection of the first electrode part 121 on the silicon-based substrate is at least partially overlapped with an orthographic projection of the fourth electrode part 142 on the silicon-based substrate. Since the first sub-electrode plate 110 has the potential of the first node N1 and the fourth sub-electrode plate 140 has the potential of the second node N2, the first sub-electrode plate 110 and the fourth sub-electrode plate 140 may constitute a third storage capacitor of a MIM capacitance structure.

Figure 20D:
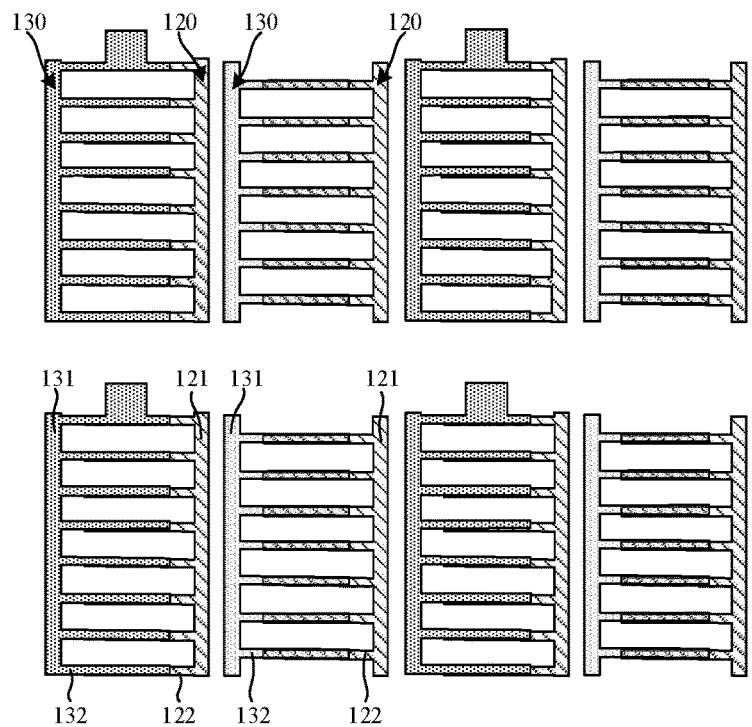
FIG. 20d is a schematic structure diagram of a second sub-electrode plate and a third sub-electrode plate according to an exemplary embodiment of the present disclosure.

FIG. 20d is a schematic structure diagram of a second sub-electrode plate and a third sub-electrode plate according to an exemplary embodiment of the present disclosure. In an exemplary implementation mode, the second base part 121 of the second sub-electrode plate 120 and the third base part 131 of the third sub-electrode plate 130 may be disposed opposite to each other in the first direction D1, the positions of the plurality of the second electrode parts 122 of the second sub-electrode plate 120 may correspond to the positions of the plurality of the third electrode parts 132 of the third sub-electrode plate 130, and an orthographic projection of the second electrode part 122 on the silicon-based substrate is at least partially overlapped with an orthographic projection of the third electrode part 132 on the silicon-based substrate. Since the second sub-electrode plate 120 has the potential of the second node N2 and the third sub-electrode plate 130 has the potential of the first node N1, the second sub-electrode plate 120 and the third sub-electrode plate 130 may constitute the fourth storage capacitor of a MIM capacitance structure.

Figure 21:
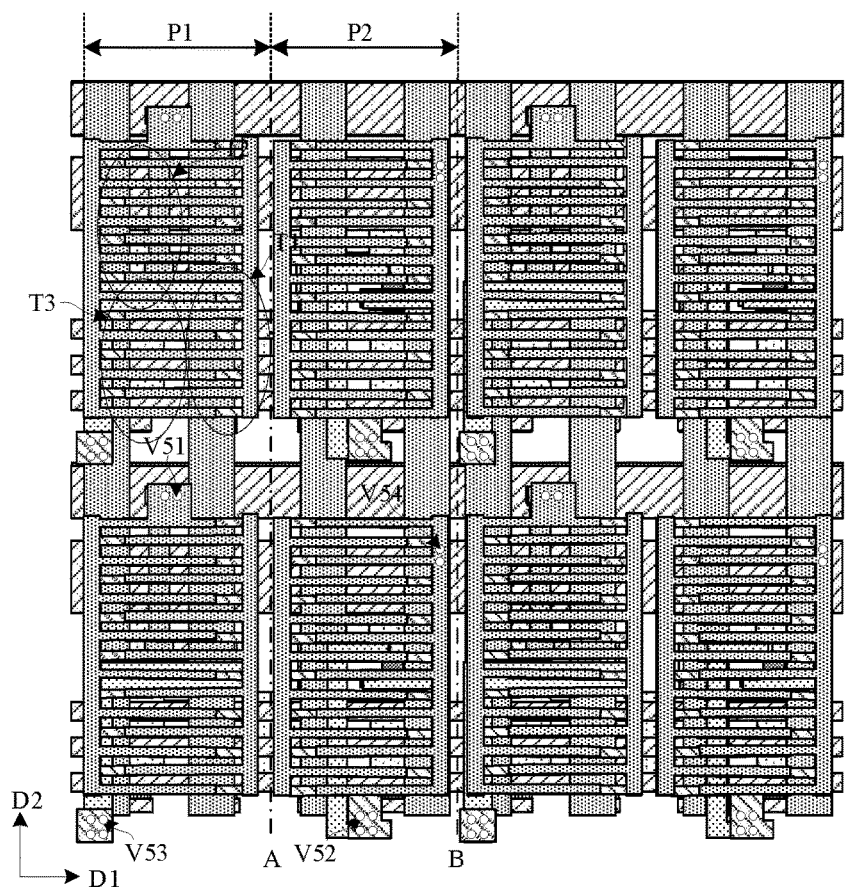
FIG. 21 is a schematic diagram obtained after a pattern of a seventh insulation layer is formed according to an exemplary embodiment of the present disclosure.

(13) A pattern of a seventh insulation layer is formed. In an exemplary implementation mode, forming a pattern of a seventh insulation layer may include: depositing a seventh insulation thin film on the substrate on which the aforementioned patterns are formed, and patterning the seventh insulation thin film through a patterning process to form a seventh insulation layer 17 covering the pattern of the sixth conductive layer, wherein a plurality of vias are provided on the seventh insulation layer, as shown in FIG. 21.

In an exemplary implementation mode, a plurality of vias in one repeating unit may include: a fifty-first via V51, a fifty-second via V52, a fifty-third via V53, and a fifty-fourth via V54.

In an exemplary implementation mode, the fifty-first via V51 may be located in the first sub-pixel P1. An orthographic projection of the fifty-first via 51 on the silicon-based substrate is located within the range of an orthographic projection of the sixty-first connection electrode 61 on the silicon-based substrate, the seventh insulation layer in the fifty-first via V51 is etched away to expose a surface of the sixty-first connection electrode 61, and the fifty-first via V51 is configured such that a seventy-first connection electrode formed subsequently is connected to the sixty-first connection electrode 61 through the fifty-first via V51.

In an exemplary implementation mode, the fifty-second via V52 may be located in the second sub-pixel P2. An orthographic projection of the fifty-second via 52 on the silicon-based substrate is located within the range of an orthographic projection of the sixth-second connection electrode 62 on the silicon-based substrate, the seventh insulation layer in the fifty-second via V52 is etched away to expose a surface of the sixty-second connection electrode 62, and the fifty-second via V52 is configured such that a seventy-second connection electrode formed subsequently is connected to the sixty-second connection electrode 62 through the fifty-second via V52.

In an exemplary implementation mode, the fifty-third via V53 may be located in the first sub-pixel P1. An orthographic projection of the fifty-third via 53 on the silicon-based substrate is located within the range of an orthographic projection of the sixty-third connection electrode 63 on the silicon-based substrate, the seventh insulation layer in the fifty-third via V53 is etched away to expose a surface of the sixty-third connection electrode 63, and the fifty-third via V53 is configured such that a seventy-third connection electrode formed subsequently is connected to the sixty-third connection electrode 63 through the fifty-third via V53.

In an exemplary implementation mode, the fifty-fourth via V54 may be located in the second sub-pixel P2. An orthographic projection of the fifty-fourth via 54 on the silicon-based substrate is located within the range of an orthographic projection of the fourth electrode part 140 on the silicon-based substrate, the seventh insulation layer in the fifty-fourth via V54 is etched away to expose a surface of the fourth electrode part 140, and the fifty-fourth via V54 is configured such that a seventy-fourth connection electrode formed subsequently is connected to the fourth electrode part 140 through the fifty-fourth via V54.

Figure 22A:
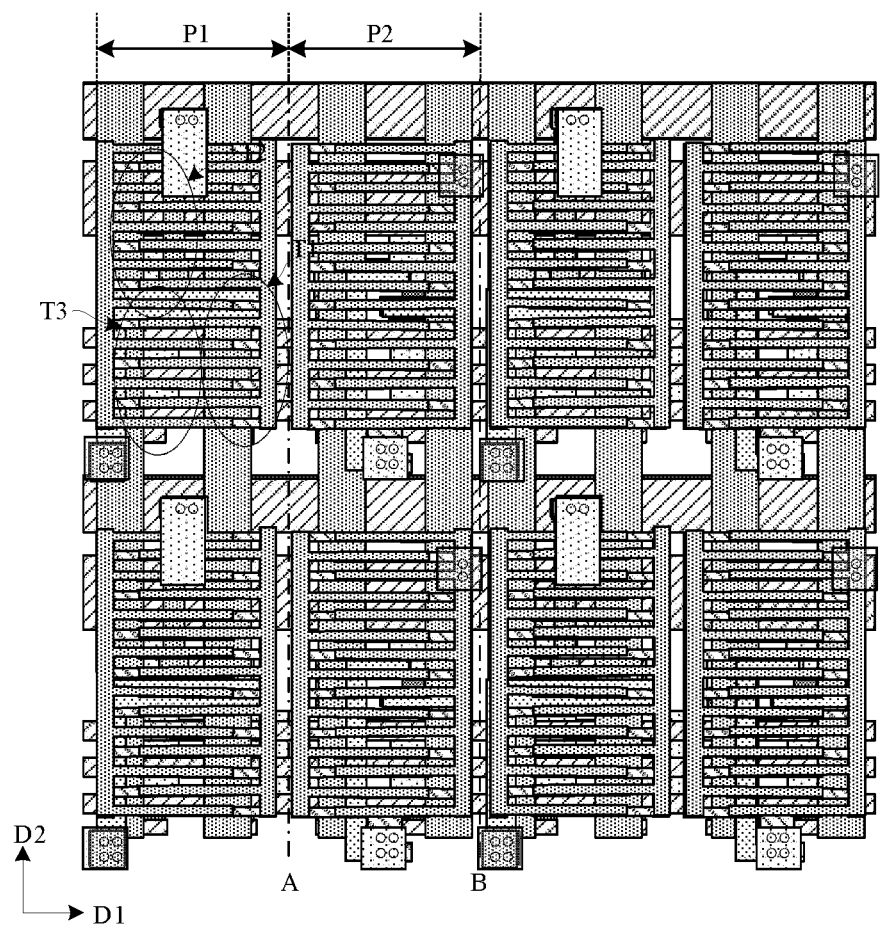
FIG. 22a and FIG. 22b are schematic diagrams obtained after a pattern of a seventh conductive layer is formed according to an exemplary embodiment of the present disclosure.
Figure 22B:
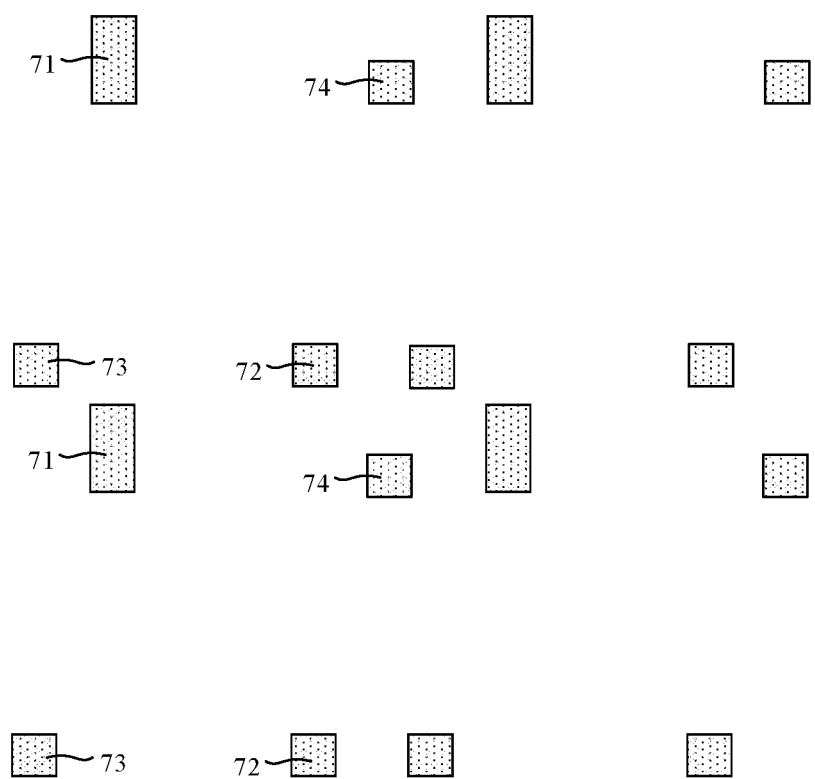

(14) A pattern of a seventh conductive layer is formed. In an exemplary implementation mode, forming a pattern of a seventh conductive layer may include: depositing a seventh conductive thin film on the silicon-based substrate on which the aforementioned patterns are formed, and patterning the seventh conductive thin film through a patterning process to form a pattern of a seventh conductive layer on the seventh insulation layer, as shown in FIG. 22a and FIG. 22b, and FIG. 22b is a schematic diagram of the seventh conductive layer in FIG. 22a. In an exemplary implementation mode, the seventh conductive layer may be referred to as a sixth metal (Metal6) layer.

In an exemplary implementation mode, the seventh conductive layer in one repeating unit may include at least: the seventy-first connection electrode 71, the seventy-second connection electrode 72, the seventy-third connection electrode 73, and the seventy-fourth connection electrode 74.

In an exemplary implementation mode, the seventy-first connection electrode 71 may be located in the first sub-pixel P1, the shape of the seventy-first connection electrode 71 may be rectangular, the seventy-first connection electrode 71 may be connected to the sixty-first connection electrode 61 through the fifty-first via V51, and the seventy-first connection electrode 71 is configured to be connected to an eighty-first connection electrode formed subsequently.

In an exemplary implementation mode, the seventy-second connection electrode 72 may be located in the second sub-pixel P2, the shape of the seventy-second connection electrode 72 may be rectangular, the seventy-second connection electrode 72 may be connected to the sixty-second connection electrode 62 through the fifty-second via V52, and the seventy-second connection electrode 72 is configured to be connected to an eighty-second connection electrode formed subsequently.

In an exemplary implementation mode, the seventy-third connection electrode 73 may be located in the first sub-pixel P1, the shape of the seventy-third connection electrode 73 may be rectangular, the seventy-third connection electrode 73 may be connected to the sixty-third connection electrode 63 through the fifty-third via V53, and the seventy-third connection electrode 73 is configured to be connected to an eighty-third connection electrode formed subsequently.

In an exemplary implementation mode, the seventy-fourth connection electrode 74 may be located in the second sub-pixel P2, the shape of the seventy-fourth connection electrode 74 may be rectangular, the seventy-fourth connection electrode 74 may be connected to the fourth electrode part 140 through the fifty-fourth via V54, and the seventy-fourth connection electrode 74 is configured to be connected to an eighty-fourth connection electrode formed subsequently.

Figure 23A:
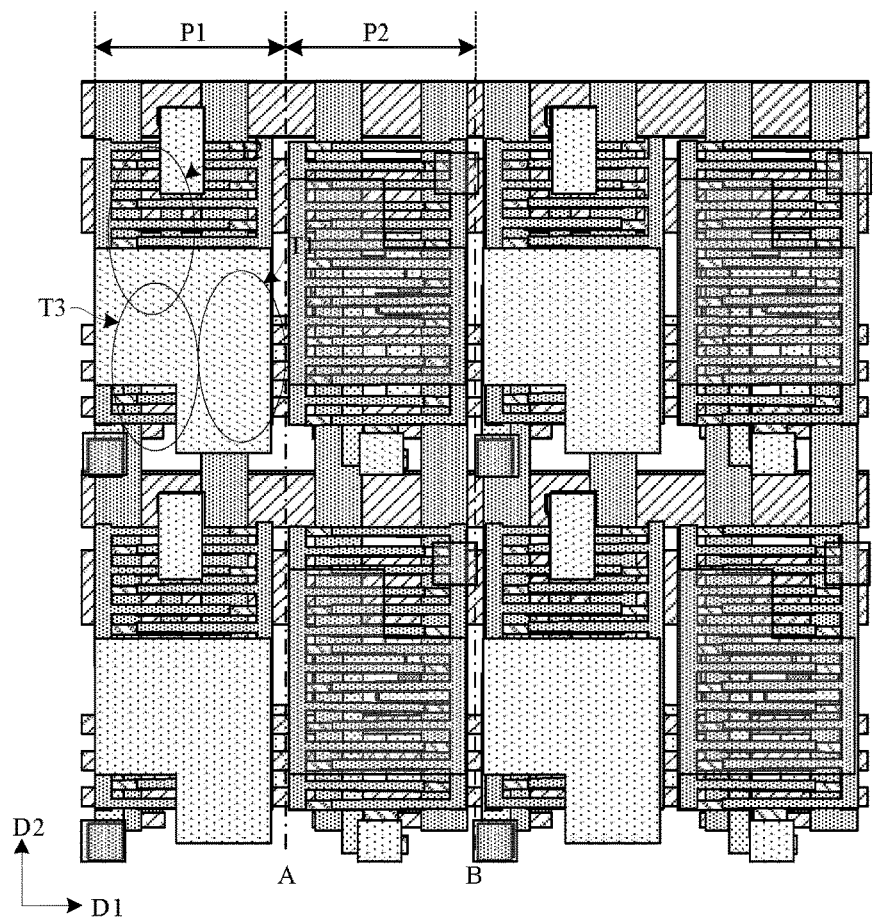
FIG. 23a and FIG. 23b are schematic diagrams obtained after a pattern of an eighth conductive layer is formed according to an exemplary embodiment of the present disclosure.
Figure 23B:
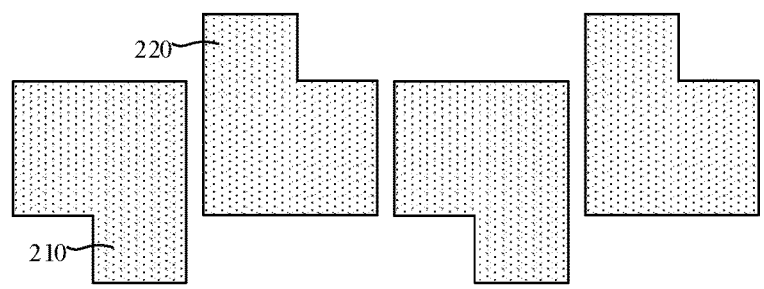
Figure 23B:
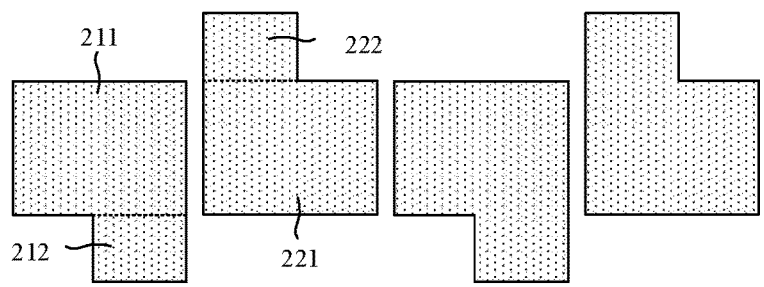

(15) A pattern of an eighth conductive layer is formed. In some exemplary implementation mode, forming a pattern of an eighth conductive layer may include: depositing sequentially an eighth insulation thin film and an eighth conductive thin film on the silicon-based substrate on which the aforementioned patterns are formed, and patterning the eighth conductive thin film through a patterning process to form an eighth insulation layer covering the pattern of the seventh conductive layer and a pattern of an eighth conductive layer disposed on the eighth insulation layer, as shown in FIG. 23a and FIG. 23b, and FIG. 23b is a schematic diagram of the eighth conductive layer in FIG. 23a. In an exemplary implementation mode, the eighth conductive layer may be referred to as a lower electrode plate of a Metal-Insulator-Metal (MIM) capacitor.

In an exemplary implementation mode, the eighth conductive layer in one repeating unit may include at least: a first lower electrode plate 210 and a second lower electrode plate 220.

In an exemplary implementation mode, the first lower electrode plate 210 may be located in the first sub-pixel P1, and the shape of the first lower electrode plate 210 may be an abnormal shape composed of at least two rectangles. In an exemplary implementation mode, the first lower electrode plate 210 may include a first plate body 211 and a second plate body 212 connected to each other, the second plate body 212 may be located on a side of the first plate body 211 in a direction opposite to the second direction D2, and an edge of the first plate body 211 on a side close to the second sub-pixel P2 and an edge of the second plate body 212 on a side close to the second sub-pixel P2 may be substantially flush.

In an exemplary implementation mode, the second lower electrode plate 220 may be located in the second sub-pixel P2, and the shape of the second lower electrode plate 220 may be an abnormal shape composed of at least two rectangles. In an exemplary implementation mode, the second lower electrode plate 220 may include a third plate body 221 and a fourth plate body 222 connected to each other, the fourth plate body 222 may be located on a side of the third plate body 221 in the second direction D2, and an edge of the third plate body 221 on a side close to the first sub-pixel P1 and an edge of the fourth plate body 222 on a side close to the first sub-pixel P1 may be substantially flush.

In an exemplary implementation mode, the shapes and dimensions of the first plate body 211 and the third plate body 221 may be substantially the same, the shapes and dimensions of the second plate body 212 and the fourth plate body 222 may be substantially the same, and the position of the first plate body 211 in the first sub-pixel P1 and the position of the third plate body 221 in the second sub-pixel P2 may be substantially the same.

Figure 24A:
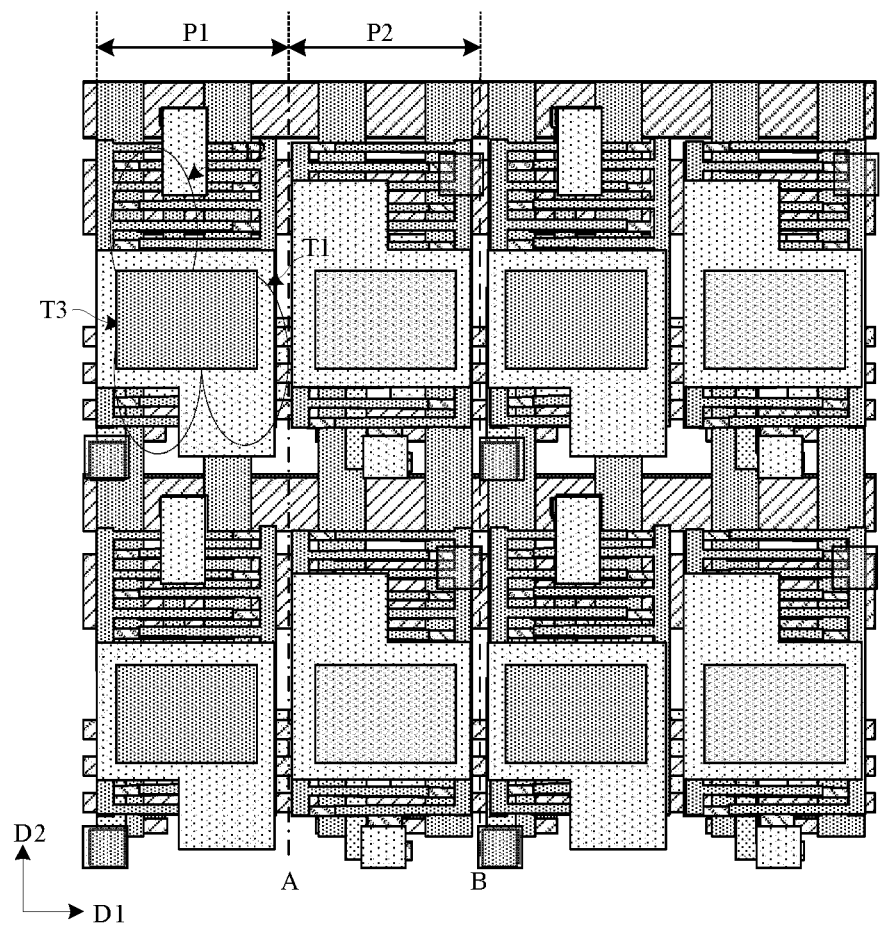
FIG. 24a and FIG. 24b are schematic diagrams obtained after a pattern of a ninth conductive layer is formed according to an embodiment of the present disclosure.
Figure 24B:
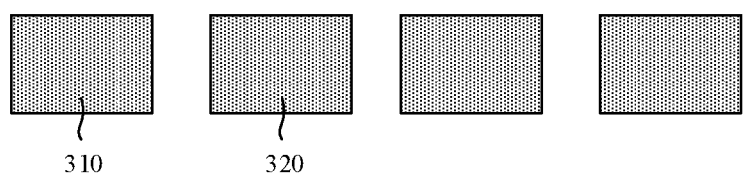
Figure 24B:
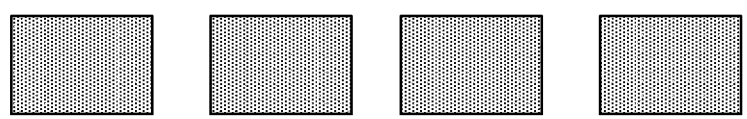

(16) A pattern of a ninth conductive layer is formed. In an exemplary implementation mode, forming a pattern of a ninth conductive layer may include: depositing a ninth insulation thin film and a ninth conductive thin film sequentially on the silicon-based substrate on which the aforementioned patterns are formed, and patterning the ninth conductive thin film through a patterning process to form a ninth insulation layer covering the pattern of the eighth conductive layer and a pattern of a ninth conductive layer disposed on the ninth insulation layer, as shown in FIG. 24a and FIG. 24b, and FIG. 24b is a schematic diagram of the ninth conductive layer in FIG. 24a. In an exemplary implementation mode, the ninth conductive layer may be referred to as an upper electrode plate of a Metal-Insulator-Metal (MIM) capacitor.

In an exemplary implementation mode, the ninth conductive layer in one repeating unit may include at least: a first upper electrode plate 310 and a second upper electrode plate 320.

In an exemplary implementation mode, the first upper electrode plate 310 may be located in the first sub-pixel P1, the shape of the first upper electrode plate 310 may be rectangular, and an orthographic projection of the first upper electrode plate 310 on the silicon-based substrate is at least partially overlapped with an orthographic projection of the first lower electrode plate 210 on the silicon-based substrate.

In an exemplary implementation mode, the area of the first upper electrode plate 310 may be smaller than the area of the first plate body 211, an orthographic projection of the first upper electrode plate 310 on the silicon-based substrate may be located within the range of an orthographic projection of the first plate body 211 on the silicon-based substrate, and an orthographic projection of the first upper electrode plate 310 on the silicon-based substrate is not overlapped with an orthographic projection of the second plate body 212 on the silicon-based substrate.

In an exemplary implementation mode, the second upper electrode plate 320 may be located in the second sub-pixel P2, the shape of the second upper electrode plate 320 may be rectangular, and an orthographic projection of the second upper electrode plate 320 on the silicon-based substrate is at least partially overlapped with an orthographic projection of the second lower electrode plate 220 on the silicon-based substrate.

In an exemplary implementation mode, the area of the second upper electrode plate 320 may be smaller than the area of the third plate body 221, an orthographic projection of the second upper electrode plate 320 on the silicon-based substrate may be located within the range of an orthographic projection of the third plate body 221 on the silicon-based substrate, and an orthographic projection of the second upper electrode plate 320 on the silicon-based substrate is not overlapped with an orthographic projection of the fourth plate body 222 on the silicon-based substrate.

Figure 25:
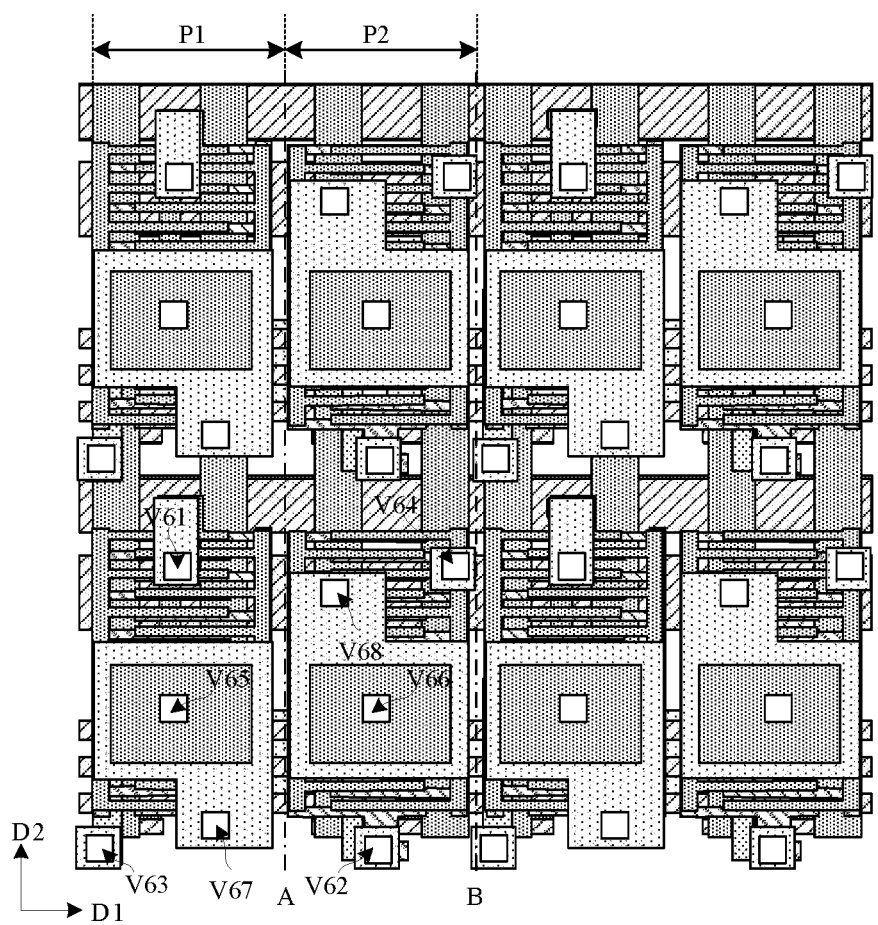
FIG. 25 is a schematic diagram obtained after a pattern of a tenth insulation layer is formed according to an exemplary embodiment of the present disclosure.

(17) A pattern of a tenth insulation layer is formed. In an exemplary implementation mode, forming a pattern of a tenth insulation layer may include: depositing a tenth insulation thin film on the silicon-based substrate on which the aforementioned patterns are formed, and patterning the tenth insulation thin film through a patterning process to form a tenth insulation layer covering the pattern of the ninth conductive layer, wherein a plurality of vias are provided on the tenth insulation layer, as shown in FIG. 25.

In an exemplary implementation mode, a plurality of vias in one repeating unit may include: a sixty-first via V61, a sixty-second via V62, a sixty-third via V63, a sixty-fourth via V64, a sixty-fifth via V65, a sixty-sixth via V66, a sixty-seventh via V67, and a sixty-eighth via V68.

In an exemplary implementation mode, the sixty-first via V61 may be located in the first sub-pixel P1. An orthographic projection of the sixty-first via V61 on the silicon-based substrate is located within the range of an orthographic projection of the seventy-first connection electrode 71 on the silicon-based substrate, the tenth insulation layer, the ninth insulation layer and the eighth insulation layer in the sixty-first via V61 is etched away to expose a surface of the seventy-first connection electrode 71, and the sixty-first via V61 is configured such that an eighty-first connection electrode formed subsequently is connected to the seventy-first connection electrode 71 through the sixty-first via V61.

In an exemplary implementation mode, the sixty-second via V62 may be located in the second sub-pixel P2. An orthographic projection of the sixty-second via 62 on the silicon-based substrate is located within the range of an orthographic projection of the seventy-second connection electrode 72 on the silicon-based substrate, the tenth insulation layer, the ninth insulation layer and the eighth insulation layer in the sixty-second via V62 are etched away to expose a surface of the seventy-second connection electrode 72, and the sixty-second via V62 is configured such that an eighty-second connection electrode formed subsequently is connected to the seventy-second connection electrode 72 through the sixty-second via V62.

In an exemplary implementation mode, the sixty-third via V63 may be located in the first sub-pixel P1. An orthographic projection of the sixty-third via V63 on the silicon-based substrate is located within the range of an orthographic projection of the seventy-third connection electrode 73 on the silicon-based substrate, the tenth insulation layer, the ninth insulation layer and the eighth insulation layer in the sixty-third via V63 are etched away to expose a surface of the seventy-third connection electrode 73, and the sixty-third via V63 is configured such that an eighty-third connection electrode formed subsequently is connected to the seventy-third connection electrode 73 through the sixty-third via V63.

In an exemplary implementation mode, the sixty-fourth via V64 may be located in the second sub-pixel P2. An orthographic projection of the sixty-fourth via 64 on the silicon-based substrate is located within the range of an orthographic projection of the seventy-fourth connection electrode 74 on the silicon-based substrate, the tenth insulation layer, the ninth insulation layer and the eighth insulation layer in the sixty-fourth via V64 are etched away to expose a surface of the seventy-fourth connection electrode 74, and the sixty-fourth via V64 is configured such that an eighty-fourth connection electrode formed subsequently is connected to the seventy-fourth connection electrode 74 through the sixty-fourth via V64.

In an exemplary implementation mode, the sixty-fifth via V65 may be located in the first sub-pixel P1. An orthographic projection of the sixty-fifth via V65 on the silicon-based substrate is located within the range of an orthographic projection of the first upper electrode plate 310 on the silicon-based substrate, the tenth insulation layer in the sixty-fifth via V65 is etched away to expose a surface of the first upper electrode plate 310, and the sixty-fifth via V65 is configured such that the eighty-first connection electrode formed subsequently is connected to the first upper electrode plate 310 through the sixty-fifth via V65.

In an exemplary implementation mode, the sixty-sixth via V66 may be located in the second sub-pixel P2. An orthographic projection of the sixty-sixth via V66 on the silicon-based substrate is located within the range of an orthographic projection of the second upper electrode plate 320 on the silicon-based substrate, the tenth insulation layer in the sixty-sixth via V66 is etched away to expose a surface of the second upper electrode plate 320, and the sixty-sixth via V66 is configured such that the eighty-second connection electrode formed subsequently is connected to the second upper electrode plate 320 through the sixty-sixth via V66.

In an exemplary implementation mode, the sixty-seventh via V67 may be located in the first sub-pixel P1. An orthographic projection of the sixty-seventh via V67 on the silicon-based substrate is located within the range of an orthographic projection of the second plate body 212 of the first lower electrode plate 210 on the silicon-based substrate, the tenth insulation layer in the sixty-seventh via V67 is etched away to expose a surface of the second plate body 212, and the sixty-seventh via V67 is configured such that the eighty-third connection electrode formed subsequently is connected to the first lower electrode plate 210 through the sixty-seventh via V67.

In an exemplary implementation mode, the sixty-eighth via V68 may be located in the second sub-pixel P2. An orthographic projection of the sixty-eighth via V68 on the silicon-based substrate is located within the range of an orthographic projection of the fourth plate body 212 of the second lower electrode plate 210 on the silicon-based substrate, the tenth insulation layer in the sixty-eighth via V68 is etched away to expose a surface of the fourth plate body 222, and the sixty-eighth via V68 is configured such that the eighty-fourth connection electrode formed subsequently is connected to the second lower electrode plate 220 through the sixty-eighth via V68.

Figure 26A:
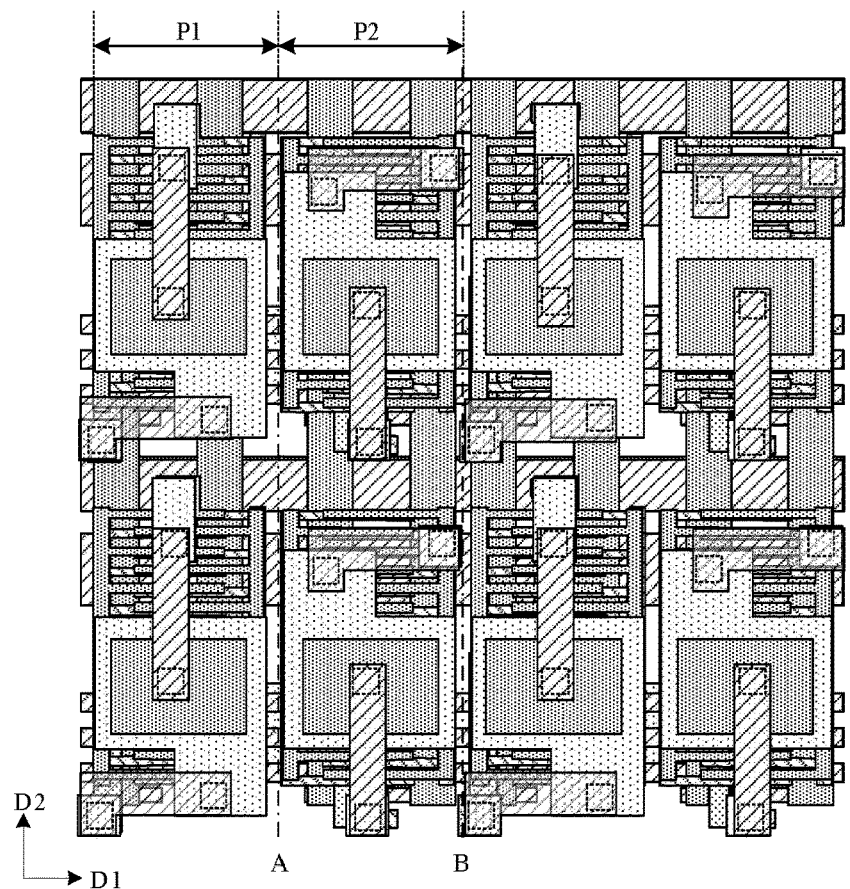
FIG. 26a and FIG. 26b are schematic diagrams obtained after a pattern of a tenth conductive layer is formed according to an exemplary embodiment of the present disclosure.
Figure 26B:
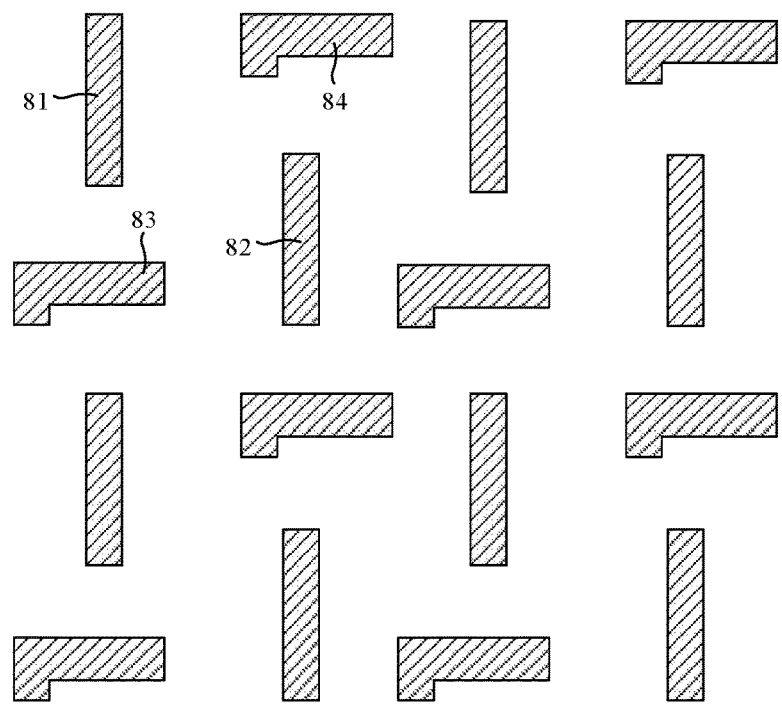

(18) A pattern of a tenth conductive layer is formed. In an exemplary implementation mode, forming a pattern of a tenth conductive layer may include: depositing a tenth conductive thin film on the silicon-based substrate on which the aforementioned patterns are formed, and patterning the tenth conductive thin film through a patterning process to form a pattern of a tenth conductive layer on the tenth insulation layer, as shown in FIG. 26a and FIG. 26b, and FIG. 26b is a schematic diagram of the tenth conductive layer in FIG. 26a. In an exemplary implementation mode, the tenth conductive layer may be referred to as a first metal connection (TM1) layer.

In an exemplary implementation mode, the tenth conductive layer in one repeating unit may include at least: an eighty-first connection electrode 81, an eighty-second connection electrode 82, an eighty-third connection electrode 83, and an eighty-fourth connection electrode 84.

In an exemplary implementation mode, the eighty-first connection electrode 81 may be located in the first sub-pixel P1, the shape of the eighty-first connection electrode 81 may be a strip shape extending along the second direction D2. The first end of the eighty-first connection electrode 81 is connected to the seventy-first connection electrode 71 through the sixty-first via V61, and the second end of the eighty-first connection electrode 81 is connected to the first upper electrode plate 310 through the sixty-fifth via V65. Since the first upper electrode plate 310 is connected to the seventy-first connection electrode 71 through the eighty-first connection electrode 81, the seventy-first connection electrode 71 is connected to the sixty-first connection electrode 61 through a via, the sixty-first connection electrode 61 is connected to the fifty-first connection electrode 51 through a via, the fifty-first connection electrode 51 is connected to the forty-first connection electrode 41 through a via, the forty-first connection electrode 41 is connected to the thirty-first connection electrode 31 through a via, the thirty-first connection electrode 31 is connected to the twenty-second connection electrode 22 through a via, and the twenty-second connection electrode 22 is connected to the second region of the first active layer and the second gate electrode 12 through a via, the first upper electrode plate 310 has the potential of the first node N1.

In an exemplary implementation mode, the eighty-second connection electrode 82 may be located in the second sub-pixel P2, the shape of the eighty-second connection electrode 82 may be a strip shape extending along the second direction D2. The first end of the eighty-second connection electrode 82 is connected to the seventy-second connection electrode 72 through the sixty-second via V62, and the second end of the eighty-second connection electrode 82 is connected to the second upper electrode plate 320 through the sixty-sixth via V66. Since the second upper electrode plate 320 is connected to the seventy-second connection electrode 72 through the eighty-second connection electrode 82, the seventy-second connection electrode 72 is connected to the sixty-second connection electrode 62 through a via, the sixty-second connection electrode 62 is connected to the fifty-second connection electrode 52 through a via, the fifty-second connection electrode 52 is connected to the forty-second connection electrode 42 through a via, the forty-second connection electrode 42 is connected to the thirty-second connection electrode 32 through a via, the thirty-second connection electrode 32 is connected to the twenty-second connection electrode 22 through a via, and the twenty-second connection electrode 22 is connected to the second gate electrode 12, the second upper electrode plate 320 has the potential of the first node N1.

In an exemplary implementation mode, the eighty-third connection electrode 83 may be located in the first sub-pixel P1. The shape of the eighty-third connection electrode 83 may be a strip shape extending along the first direction D1. The first end of the eighty-third connection electrode 83 is connected to the seventy-third connection electrode 73 through the sixty-third via V63, and the second end of the eighty-third connection electrode 83 is connected to the first lower electrode plate 210 through the sixty-seventh via V67. Since the first lower electrode plate 210 is connected to the seventy-third connection electrode 73 through the eighty-third connection electrode 83, the seventy-third connection electrode 73 is connected to the sixty-third connection electrode 63 through a via, the sixty-third connection electrode 63 is connected to the fifty-third connection electrode 53 through a via, the fifty-third connection electrode 53 is connected to the forty-third connection electrode 43 through a via, the forty-third connection electrode 43 is connected to the thirty-third connection electrode 33 through a via, the thirty-third connection electrode 33 is connected to the twenty-third connection electrode 23 through a via, and the twenty-third connection electrode 23 is connected to the second region of the second active layer (also the second region of the third active layer) through a via, the first lower electrode plate 210 has the potential of the second node N2.

In an exemplary implementation mode, the eighty-fourth connection electrode 84 may be located in the second sub-pixel P2. The shape of the eighty-fourth connection electrode 84 may be a strip shape extending along the first direction D1. The first end of the eighty-fourth connection electrode 84 is connected to the seventy-fourth connection electrode 74 through the sixty-fourth via V64, and the second end of the eighty-fourth connection electrode 84 is connected to the second lower electrode plate 220 through the sixty-eighth via V68. Since the second lower electrode plate 220 is connected to the seventy-fourth connection electrode 74 through the eighty-fourth connection electrode 84, the seventy-fourth connection electrode 74 is connected to the fourth sub-electrode plate 140 through a via, the fourth sub-electrode plate 140 is connected to the second sub-electrode plate 120 through a via, the second sub-electrode plate 120 is connected to the forty-fourth connection electrode 44 through a via, the forty-fourth connection electrode 44 is connected to the thirty-fourth connection electrode 34 through a via, the thirty-fourth connection electrode 34 is connected to the twenty-third connection electrode 23 through a via, and the twenty-third connection electrode 23 is connected to the second region of the second active layer (also the second region of the third active layer) through a via, the second lower electrode plate 220 has the potential of the second node N2.

In an exemplary implementation mode, in the first sub-pixel P1, the first upper electrode plate 310 having the potential of the first node N1 and the first lower electrode plate 210 having the potential of the second node N2 constitute a fifth storage capacitor of the MIM capacitance structure of the sub-pixel. In the second sub-pixel P2, the second upper electrode plate 320 having the potential of the first node N1 and the second lower electrode plate 220 having the potential of the second node N2 constitute a fifth storage capacitor of the MIM capacitance structure of the sub-pixel.

Figure 27:
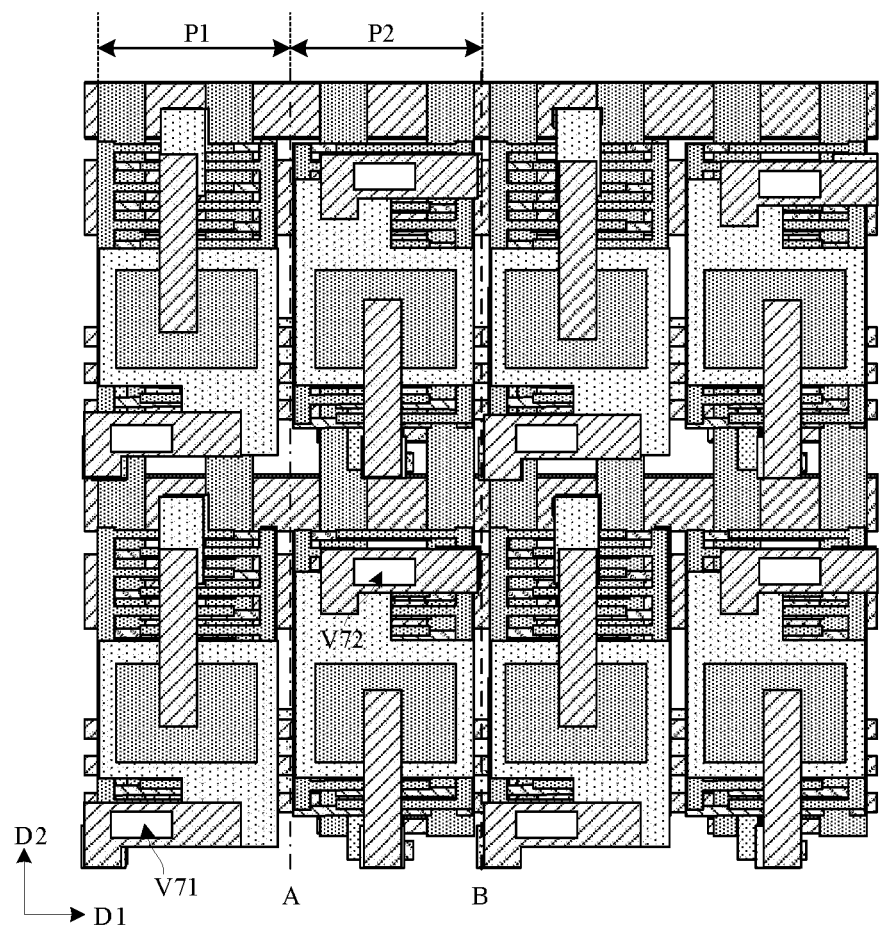
FIG. 27 is a schematic diagram obtained after a pattern of an eleventh insulation layer is formed according to an exemplary embodiment of the present disclosure.

(19) A pattern of an eleventh insulation layer is formed. In an exemplary implementation mode, forming a pattern of an eleventh insulation layer may include: depositing an eleventh insulation thin film on the silicon-based substrate on which the aforementioned patterns are formed, and patterning the eleventh insulation thin film through a patterning process to form an eleventh insulation layer covering the pattern of the tenth conductive layer, wherein a plurality of vias are provided on the eleventh insulation layer, as shown in FIG. 27.

In an exemplary implementation mode, a plurality of vias in one repeating unit may include: a seventy-first via V71 and a seventy-second via V72.

In an exemplary implementation mode, the seventy-first via V71 may be located in the first sub-pixel P1. An orthographic projection of the seventy-first via V71 on the silicon-based substrate is located within the range of an orthographic projection of the eighty-third connection electrode 83 on the silicon-based substrate, the eleventh insulation layer in the seventy-first via V71 is removed to expose a surface of the eighty-third connection electrode 83, and the seventh-first via V71 is configured such that a ninety-first connection electrode formed subsequently is connected to the eighty-third connection electrode 83 through the seventh-first via V71.

In an exemplary implementation mode, the seventy-second via V72 may be located in the second sub-pixel P2. An orthographic projection of the seventy-second via V72 on the silicon-based substrate is located within the range of an orthographic projection of the eighty-fourth connection electrode 84 on the silicon-based substrate, the eleventh insulation layer in the seventy-second via V72 is removed to expose a surface of the eighty-fourth connection electrode 84, and the seventh-second via V72 is configured such that a ninety-second connection electrode formed subsequently is connected to the eighty-fourth connection electrode 84 through the seventh-second via V72.

Figure 28A:
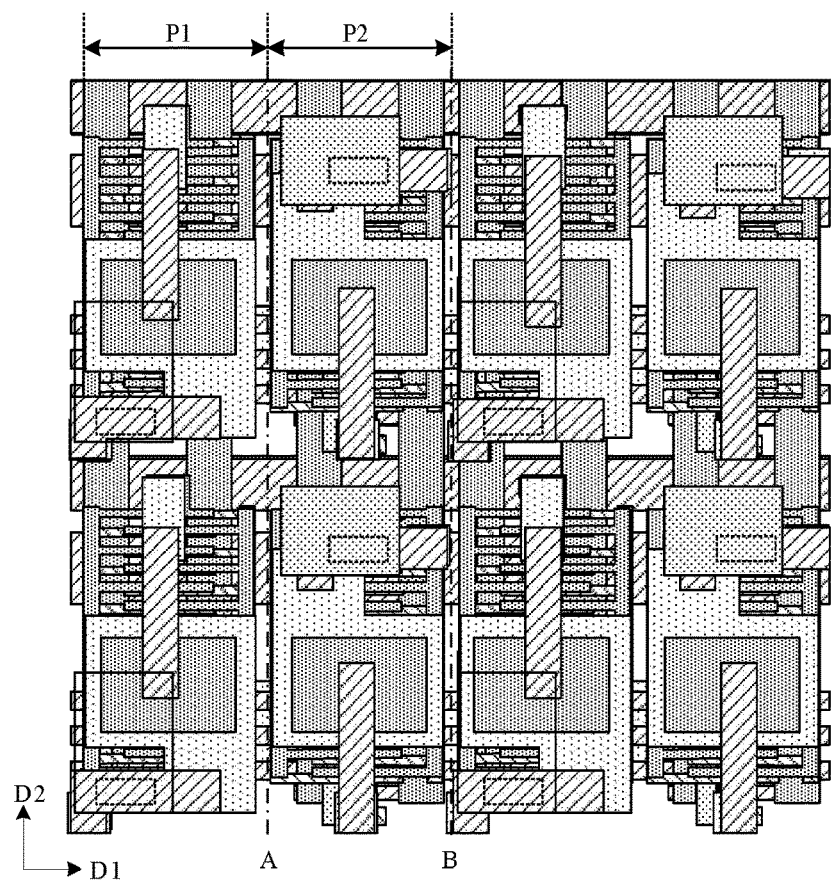
FIG. 28a and FIG. 28b are schematic diagrams obtained after a pattern of an eleventh conductive layer is formed according to an exemplary embodiment of the present disclosure.
Figure 28B:
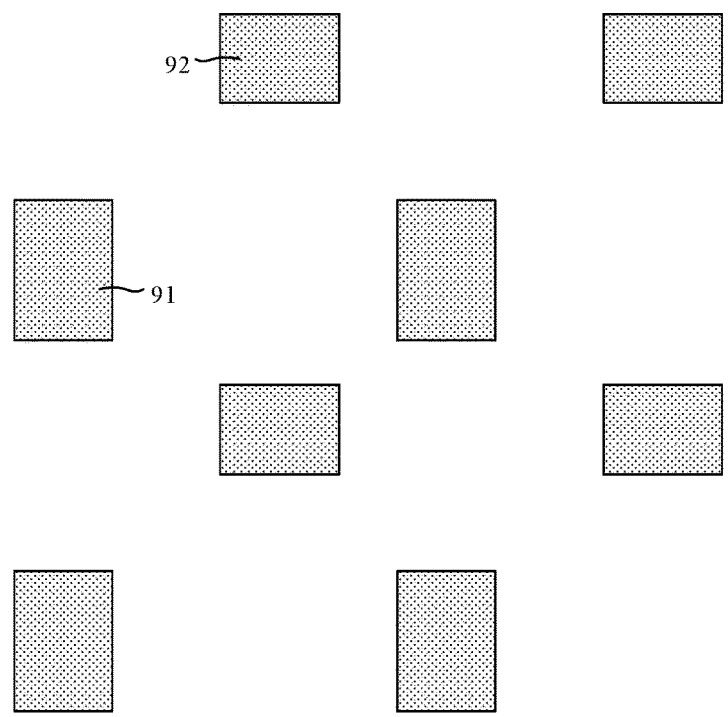

(20) A pattern of an eleventh conductive layer is formed. In an exemplary implementation mode, forming a pattern of an eleventh conductive layer may include: depositing an eleventh conductive film on the silicon-based substrate on which the aforementioned patterns are formed, and patterning the eleventh conductive thin film through a patterning process to form a pattern of an eleventh conductive layer on the eleventh insulation layer, as shown in FIG. 28*a* and FIG. 28*b*, and FIG. 28*b* is a schematic diagram of the eleventh conductive layer in FIG. 28*a*. In an exemplary implementation mode, the eleventh conductive layer may be referred to as a second metal connection (TM2) layer.

In an exemplary implementation mode, the eleventh conductive layer in one repeating unit may include at least: the ninety-first connection electrode 91 and the ninety-second connection electrode 92.

In an exemplary implementation mode, the ninety-first connection electrode 91 may be located in the first sub-pixel P1, the shape of the ninety-first connection electrode 91 may be rectangular, the ninety-first connection electrode 91 may be connected to the eighty-third connection electrode 83 through the seventy-first via V71, and the ninety-first connection electrode 91 serves as an anode connection electrode and is configured to be connected to the anode of the first sub-pixel P1 formed subsequently. Since the anode of the first sub-pixel P1 is connected to the eighty-third connection electrode 83 through the ninety-first connection electrode 91 and the eighty-third connection electrode 83 has the potential of the second node N2, the anode of the first sub-pixel P1 is connected correspondingly to the second electrode of the second transistor T2 of the first sub-pixel P1, and the current output by the second transistor T2 can be output to the anode.

In an exemplary implementation mode, the ninety-second connection electrode 92 may be located in the second sub-pixel P2, the shape of the ninety-second connection electrode 92 may be rectangular, the ninety-second connection electrode 92 may be connected to the eighty-fourth connection electrode 84 through the seventy-second via V72, and the ninety-second connection electrode 92 serves as an anode connection electrode and is configured to be connected to the anode of the second sub-pixel P2 formed subsequently. Since the anode of the second sub-pixel P2 is connected to the eighty-fourth connection electrode 84 through the ninety-second connection electrode 92 and the eighty-fourth connection electrode 84 has the potential of the second node N2, the anode of the second sub-pixel P2 is connected correspondingly to the second electrode of the second transistor T2 of the second sub-pixel P2, and the current output by the second transistor T2 can be output to the anode.

The subsequent preparation process may include processes such as forming an anode, a pixel definition layer, an organic light emitting layer, a cathode, a first encapsulation layer, a color film structure layer and a second encapsulation layer, and the like, which is not described here.

The structure of the display device in an exemplary embodiment of the present disclosure and the preparation process thereof are merely exemplary description, and corresponding structures may be changed and patterning processes may be added or reduced according to actual conditions. For example, the second sub-electrode plate, the fourth sub-electrode plate, and the second lower electrode plate may be provided in connection with the third power supply line so that the second sub-electrode plate, the fourth sub-electrode plate and the second lower electrode plate have a ground potential, and the present disclosure is not limited thereto.

In an exemplary implementation mode, the first insulation thin film to the eleventh insulation thin film may be made of silicon oxide SiOx, silicon nitride SiNx or silicon oxynitride SiON; and may have a single-layer structure or a multi-layer composite structure. The first metal layer to the sixth metal layer, the first metal connection layer and the second metal connection layer may be made of a metal material, such as silver (Ag), copper (Cu), aluminum (Al), or molybdenum (Mo), etc., or an alloy material consisting of metals, such as aluminum neodymium alloy (AlNd) or molybdenum niobium alloy (MoNb), etc. . . . The alloy material may have a single-layer structure, or a multi-layer composite structure, such as a composite structure constituted by Mo layer, Cu layer and Mo layer, etc. . . .

In an exemplary implementation mode, the planar shape of the via may be rectangular, circular, elliptical or the like, and the dimensions of a plurality of vias may be the same or may be different. The present disclosure is not limited thereto.

In a silicon-based OLED display device, the storage capacitance of a pixel driving circuit usually adopts a MIM capacitance structure, which has a problem of small capacitance value. Because the capacitance value of the storage capacitor is small and the storage capacitor cannot hold the data signal in one frame time, the working current output by the pixel driving circuit is unstable, and the brightness of OLED is unstable, resulting in flicker phenomenon. In addition, the small capacitance value of the storage capacitance restricts the improvement of the resolution of the display device, which is not conducive to the application of Virtual Reality (VR) and Augmented Reality (AR). Pixels Per Inch (PPI) refers to the number of pixels per unit area, which can be called pixel density. The higher the PPI value, the higher the density of the picture which can be displayed by the display substrate and the richer the details of the picture.

As can be seen from the structure of the display device and the preparation process thereof according to an exemplary embodiment of the present disclosure, in the present disclosure, not only the eighth conductive layer and the ninth conductive layer are used to form a storage capacitor of a MIM capacitance structure, but also the fifth conductive layer and the sixth conductive layer are used to form a storage capacitor of MOM capacitance structure+MIM capacitance structure. Not only the capacitance value of the storage capacitor is maximized, the stability of the output current of the pixel driving circuit is ensured, the stability of the brightness of OLED is ensured, and the flicker phenomenon is effectively avoided, but also the resolution is effectively improved, which can reach more than 6000. In the present disclosure, on one hand, a comb-shaped first sub-electrode plate and a comb-shaped second sub-electrode plate are formed in a fifth conductive layer to constitute a first storage capacitor of the MOM capacitor structure in the fifth conductive layer, a comb-shaped third sub-electrode plate and a comb-shaped fourth sub-electrode plate are formed in the sixth conductive layer to form a second storage capacitor of a MOM capacitance structure in the sixth conductive layer; on the other hand, the first sub-electrode plate in the fifth conductive layer and the fourth sub-electrode plate in the sixth conductive layer are used to form a third storage capacitor of the MIM capacitor structure, the second sub-electrode plate in the fifth conductive layer and the third sub-electrode plate in the sixth conductive layer are used to constitute a fourth storage capacitor of the MIM capacitor structure, the storage capacitance of MOM capacitor structure+MIM capacitor structure is realized by using two conductive layers. The structure is simple and the layout is reasonable. The capacitance value is maximized without increasing the number of conductive layers and the occupied area of the pixel driving circuit.

In the present disclosure, a second electrode of a second transistor and a second electrode of a third transistor in a pixel driving circuit are disposed as an integrated structure in which they are connected to each other, so that the second electrodes of the second transistor and the third transistor are used in common. A first gate electrode of a first transistor and a third gate electrode of a third transistor in a pixel driving circuit are disposed as an integrated structure in which they are connected to each other, so that the gate electrodes of the first transistor and the third transistor are used in common. The layout of the pixel driving circuit is optimized, the layout space is optimized, the occupied area of the pixel driving circuit is reduced, the occupied area of the pixel driving circuit can be further reduced, and higher PPI and better display quality can be realized.

In an exemplary implementation mode, the display device of the present disclosure may include, but is not limited to, an OLED display device or a QLED display device, may be used for a virtual reality device or an enhanced display device, etc. The display device may include, but is not limited to, a mobile phone, a tablet computer, a television, a display, a notebook computer, a digital photo frame, a navigator, or any product or component having a display function.

An exemplary embodiment of the present disclosure also provides a preparation method for a display substrate. In an exemplary implementation mode, the display substrate includes multiple sub-pixels, at least one sub-pixel includes a pixel driving circuit, and the pixel driving circuit includes a plurality of driving transistors and at least a storage capacitor. The preparation method may include the following operations.

A plurality of conductive layers are formed on the silicon-based substrate, one of the plurality of the conductive layers includes a comb-shaped first sub-electrode plate and a comb-shaped second sub-electrode plate, the first sub-electrode plate and the second sub-electrode plate constitute a first storage capacitor of a metal-oxide-metal capacitor structure. Another conductive layer of the plurality of the conductive layers includes a comb-shaped third sub-electrode plate and a comb-shaped fourth sub-electrode plate, the third sub-electrode plate and the fourth sub-electrode plate constitute a second storage capacitor of a metal-oxide-metal capacitor structure. An orthographic projection of the first sub-electrode plate on the silicon-based substrate is at least partially overlapped with an orthographic projection of the fourth sub-electrode plate on the silicon-based substrate to form a third storage capacitor of a metal-insulator-metal capacitor structure, and/or an orthographic projection of the second sub-electrode plate on the silicon-based substrate is at least partially overlapped with an orthographic projection of the third sub-electrode plate on the silicon-based substrate to form a fourth storage capacitor of a metal-insulator-metal capacitor structure.

Although the implementation modes of the present disclosure are disclosed above, the contents are only implementation modes for easily understanding the present disclosure but not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising a plurality of sub-pixels, wherein at least one sub-pixel comprises a pixel driving circuit, the pixel driving circuit comprises a plurality of transistors and a storage capacitor; on a plane perpendicular to the display substrate, the display substrate comprises a plurality of conductive layers disposed on a silicon-based substrate, one of the plurality of the conductive layers comprises a comb-shaped first sub-electrode plate and a comb-shaped second sub-electrode plate, the first sub-electrode plate and the second sub-electrode plate constitute a first storage capacitor of a metal-oxide-metal capacitor structure, and another conductive layer of the plurality of the conductive layers comprises a comb-shaped third sub-electrode plate and a comb-shaped fourth sub-electrode plate, the third sub-electrode plate and the fourth sub-electrode plate constitute a second storage capacitor of a metal-oxide-metal capacitor structure; an orthographic projection of the first sub-electrode plate on the silicon-based substrate is at least partially overlapped with an orthographic projection of the fourth sub-electrode plate on the silicon-based substrate to form a third storage capacitor of a metal-insulator-metal capacitor structure, and/or an orthographic projection of the second sub-electrode plate on the silicon-based substrate is at least partially overlapped with an orthographic projection of the third sub-electrode plate on the silicon-based substrate to form a fourth storage capacitor of a metal-insulator-metal capacitor structure.

2. The display substrate according to claim 1, wherein the first sub-electrode plate is connected to the third sub-electrode plate and the second sub-electrode plate is connected to the fourth sub-electrode plate.

3. The display substrate according to claim 1, wherein the first sub-electrode plate comprises a first base part and a plurality of first electrode parts, and the second sub-electrode plate comprises a second base part and a plurality of second electrode parts; the first base part and the second base part are both strip-shaped extending along a second direction and are disposed opposite to each other in a first direction, and the first direction intersects with the second direction; the plurality of the first electrode parts and the plurality of the second electrode parts are alternately disposed in the second direction, first ends of the first electrode parts are connected to the first base part, second ends of the first electrode parts extend toward a direction of the second base part, and at least one first electrode part is located between two adjacent second electrode parts in the second direction; first ends of the second electrode parts are connected to the second base part, second ends of the second electrode parts extend toward a direction of the first base part, and at least one second electrode part is located between two adjacent first electrode parts in the second direction.

4. The display substrate according to claim 1, wherein the third sub-electrode plate comprises a third base part and a plurality of third electrode parts, and the fourth sub-electrode plate comprises a fourth base part and a plurality of fourth electrode parts; the third base part and the fourth base part are both strip-shaped extending along a second direction and are disposed opposite to each other in a first direction, the first direction intersects with the second direction; the plurality of the third electrode parts and the plurality of the fourth electrode parts are alternately disposed in the second direction, first ends of the third electrode parts are connected to the third base part, second ends of the third electrode parts extend toward a direction of the fourth base part, and at least one third electrode part is located between two adjacent fourth electrode parts in the second direction; first ends of the fourth electrode parts are connected to the fourth base part, second ends of the fourth electrode parts extend toward a direction of the third base part, and at least one fourth electrode part is located between two adjacent third electrode parts in the second direction.

5. The display substrate according to claim 1, wherein an orthographic projection of a first base part of the first sub-electrode plate on the silicon-based substrate is at least partially overlapped with an orthographic projection of a third base part of the third sub-electrode plate on the silicon-based substrate, and the third base part is connected to the first base part through a via, wherein an orthographic projection of a first electrode part of the first sub-electrode plate on the silicon-based substrate is at least partially overlapped with an orthographic projection of a fourth electrode part of the fourth sub-electrode plate on the silicon-based substrate.

6. The display substrate according to claim 1, wherein an orthographic projection of a second base part of the second sub-electrode plate on the silicon substrate is at least partially overlapped with an orthographic projection of a fourth base part of the fourth sub-electrode plate on the silicon-based substrate, and the fourth base part is connected to the second base part through a via, wherein an orthographic projection of a second electrode part of the second sub-electrode plate on the silicon-based substrate is at least partially overlapped with an orthographic projection of a third electrode part of the third sub-electrode plate on the silicon-based substrate.

7. The display substrate according to claim 1, wherein among the plurality of the conductive layers, a conductive layer comprises a plate-shaped lower electrode plate, another conductive layer on a side of the lower electrode plate away from the silicon-based substrate comprises a plate-shaped upper electrode plate, an orthographic projection of the upper electrode plate on the silicon-based substrate is at least partially overlapped with an orthographic projection of the lower electrode plate on the silicon-based substrate, the lower electrode plate and the upper electrode plate constitute a fifth storage capacitor of a metal-insulator-metal capacitor structure, the upper electrode plate is connected to the first sub-electrode plate and the third sub-electrode plate, and the lower electrode plate is connected to the second sub-electrode plate and the fourth sub-electrode plate.

8. The display substrate according to claim 7, wherein the lower electrode plate comprises a first plate body and a second plate body connected to each other, the second plate body being disposed on a side of the first plate body in a second direction, or the second plate body being disposed on a side of the first plate body in a direction opposite to the second direction; an edge on a side of the first plate body in the first direction is flush with an edge on a side of the second plate body in the first direction, or an edge on a side of the first plate body in a direction opposite to the first direction is flush with an edge on a side of the second plate body in a direction opposite to the first direction, and the first direction intersects with the second direction.

9. The display substrate according to claim 8, wherein in two adjacent sub-pixels in the first direction, a second plate body in one sub-pixel is provided on a side of the first plate body in the second direction, and a second plate body in the other sub-pixel is provided on a side of the first plate body in a direction opposite to the second direction.

10. The display substrate according to claim 8, wherein in two adjacent sub-pixels in the first direction, edges of the first plate body and the second plate body in one sub-pixel in the first direction are flush, and edges of the first plate body and the second plate body in the other sub-pixel in a direction opposite to the first direction are flush.

11. The display substrate according to claim 8, wherein the first plate body and the second plate body are both rectangular, and an area of the first plate body is larger than an area of the second plate body.

12. The display substrate according to claim 8, wherein the upper electrode plate is rectangular, and an area of the upper electrode plate is smaller than an area of the first plate body,
wherein an orthographic projection of the upper electrode plate on the silicon-based substrate is located within a range of an orthographic projection of the first plate body on the silicon-based substrate.

13. The display substrate according to claim 1, wherein the plurality of the transistors comprise a first transistor, a second transistor, and a third transistor; a control electrode of the first transistor is connected to a scan signal line, a first electrode of the first transistor is connected to a data signal line, and a second electrode of the first transistor is connected to a first node; a control electrode of the second transistor is connected to the first node, a first electrode of the second transistor is connected to a first power supply line, and a second electrode of the second transistor is connected to a second node; a first electrode of the third transistor is connected to a first signal line, and a second electrode of the third transistor is connected to the second node; a first end of the storage capacitor is connected to the first node.

14. The display substrate according to claim 13, wherein active layers of the plurality of the transistors comprise at least a first active layer of the first transistor, a second active layer of the second transistor and a third active layer of the third transistor, in at least one sub-pixel, the second active layer and the third active layer are connected to each other in an integrated structure, and a second region of the second active layer and a second region of the third active layer are used in common,
wherein gate electrodes of the plurality of transistors comprise at least a first gate electrode of the first transistor, a second gate electrode of the second transistor, and a third gate electrode of the third transistor; in at least one sub-pixel, the first gate electrode and the third gate electrode are connected to each other in an integrated structure.

15. The display substrate according to claim 14, wherein the display substrate comprises a plurality of repeating units, at least one repeating unit comprising two sub-pixels; in at least one repeating unit, first gate electrodes of two sub-pixels are connected to each other in an integrated structure,
wherein in at least one repeating unit, second transistors of the two sub-pixels are located on two sides of the repeating unit, and a blank region is provided between the second transistors of the two sub-pixels.

16. The display substrate according to claim 15, wherein the second gate electrode is connected to a first end of a connection electrode through a first lapping via, a second end of the connection electrode is connected to a second region of the first active layer through a second lapping via, wherein the first lapping via is located on a side of the second gate electrode close to the blank region, and the second lapping via is located on a side of the first active layer close to the blank region,
wherein the first lapping via is located on a side of the second gate electrode close to a second region of the second active layer.

17. The display substrate according to claim 1, wherein the plurality of the conductive layers at least comprise a first conductive layer, a second conductive layer, a third conductive layer, a fourth conductive layer, a fifth conductive layer and a sixth conductive layer disposed sequentially on the silicon-based substrate, the silicon-based substrate comprises at least active layers of a plurality of transistors, the first conductive layer comprises at least gate electrodes of a plurality of transistors, the second conductive layer comprises at least a scan signal line and a first power supply line, the third conductive layer comprises at least a data signal line and a first signal line, the fifth conductive layer comprises at least the first sub-electrode plate and the second sub-electrode plate, and the sixth conductive layer comprises at least the third sub-electrode plate and the fourth sub-electrode plate.

18. The display substrate according to claim 17, wherein the plurality of the conductive layers further comprise a seventh conductive layer, an eighth conductive layer, and a ninth conductive layer, the eighth conductive layer comprises at least the lower electrode plate, and the ninth conductive layer comprises at least the upper electrode plate,
wherein the plurality of the conductive layers further comprise a tenth conductive layer, the tenth conductive layer at least comprises an upper electrode plate connection electrode and a lower electrode plate connection electrode, the upper electrode plate is connected to the third sub-electrode plate through the upper electrode plate connection electrode, and the lower electrode plate is connected to the fourth sub-electrode plate through the lower electrode plate connection electrode.

19. A display device, comprising the display substrate according to claim 1.

20. A method for preparing a display substrate, wherein the display substrate comprising a plurality of sub-pixels, at least one sub-pixel comprises a pixel driving circuit, and the pixel driving circuit comprises a plurality of transistors and at least one storage capacitor, and the preparing method comprises:
forming a plurality of conductive layers on the silicon-based substrate, wherein one of the plurality of the conductive layers comprises a comb-shaped first sub-electrode plate and a comb-shaped second sub-electrode plate, the first sub-electrode plate and the second sub-electrode plate constitute a first storage capacitor of a metal-oxide-metal capacitor structure, and another conductive layer of the plurality of the conductive layers comprises a comb-shaped third sub-electrode plate and a comb-shaped fourth sub-electrode plate, the third sub-electrode plate and the fourth sub-electrode plate constitute a second storage capacitor of a metal-oxide-metal capacitor structure; an orthographic projection of the first sub-electrode plate on the silicon-based substrate is at least partially overlapped with an orthographic projection of the fourth sub-electrode plate on the silicon-based substrate to form a third storage capacitor of a metal-insulator-metal capacitor structure, and/or an orthographic projection of the second sub-electrode plate on the silicon-based substrate is at least partially overlapped with an orthographic projection of the third sub-electrode plate on the silicon-based substrate to form a fourth storage capacitor of a metal-insulator-metal capacitor structure.

\* \* \* \* \*